US012772724B2

(12) United States Patent
Park et al.

(10) Patent No.: US 12,772,724 B2

(45) Date of Patent: Oct. 20, 2026

(54) DISPLAY PANEL AND DISPLAY DEVICE

(71) Applicant: SAMSUNG DISPLAY CO., LTD., Yongin-si (KR)

(72) Inventors: Junhyeong Park, Yongin-si (KR); Kyungmin Kim, Yongin-si (KR); Jiyeon Seo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 665 days.

(21) Appl. No.: 18/105,171

(22) Filed: Feb. 2, 2023

(65) Prior Publication Data

US 2023/0292583 A1 Sep. 14, 2023

(30) Foreign Application Priority Data

Mar. 8, 2022 (KR) ........................ 10-2022-0029466

(51) Int. Cl.

*H10K 77/10* (2023.01)
*H10K 59/131* (2023.01)
*H10K 59/80* (2023.01)

(52) U.S. Cl.

CPC ........... *H10K 77/10* (2023.02); *H10K 59/131* (2023.02); *H10K 59/873* (2023.02)

(58) Field of Classification Search

CPC .. H10K 59/873; H10K 59/131; H10K 77/111; H10K 77/10

See application file for complete search history.

(56) References Cited

U.S. PATENT DOCUMENTS

| | | | | |
|---|---|---|---|---|
| 10,840,478 | B2 | 11/2020 | Han et al. | |
| 2017/0237038 | A1 | 8/2017 | Kim et al. | |
| 2021/0126224 | A1 | 4/2021 | Lee et al. | |
| 2021/0384465 | A1* | 12/2021 | Park | H10K 59/12 |
| 2022/0069051 | A1* | 3/2022 | Lee | H10K 59/1213 |
| 2022/0077242 | A1* | 3/2022 | Yoon | B32B 3/02 |
| 2022/0158131 | A1 | 5/2022 | Sung et al. | |

FOREIGN PATENT DOCUMENTS

| | | | |
|---|---|---|---|
| KR | 1020170096646 | A | 8/2017 |
| KR | 1020190029830 | A | 3/2019 |
| KR | 1020200037025 | A | 4/2020 |
| KR | 1020210052636 | A | 6/2021 |
| KR | 1020210151634 | A | 12/2021 |

* cited by examiner

*Primary Examiner* — Vongsavanh Sengdara

(74) *Attorney, Agent, or Firm* — CANTOR COLBURN LLP

(57) ABSTRACT

A display panel includes a substrate including a central area, a corner area including an extension area extending in a direction away from the central area, and an intermediate area disposed between the central area and the corner area, a first groove defined in the corner area and having a closed curve shape, at least a portion of the first groove being defined along a circumference of the central area, and a second groove defined in the intermediate area along the circumference of the central area, and having a closed curve shape.

21 Claims, 25 Drawing Sheets

DISPLAY PANEL AND DISPLAY DEVICE

This application claims to Korean Patent Application No. 10-2022-0029466, filed on Mar. 8, 2022, and all the benefits accruing therefrom under 35 U.S.C. § 119, the content of which in its entirety is herein incorporated by reference.

BACKGROUND

1. Field

Embodiments relate to a display panel and a display device.

2. Description of the Related Art

Electronic devices based on mobility are widely used. In addition to small electronic devices, such as mobile phones, tablet personal computers are being widely used as mobile electronic devices.

Such a mobile electronic device includes a display device to provide a user with various functions, e.g., visual information, such as an image or a video. Recently, as other components for driving the display device have been miniaturized, a proportion of the display device in an electronic device is gradually increasing, and a structure that is bendable to have a predetermined angle from a flat state is being developed.

SUMMARY

A display device may include a display panel that displays an image. The display panel may include a corner area at a corner thereof and bent, and cracks generated in the corner area may cause external air to move toward a central area of the display panel, thereby deteriorating the reliability of the display panel and the display device.

In an embodiment of the disclosure, the reliability of the display panel and the display device may be improved by preventing or reducing the movement of external air from the corner area to the central area.

Additional features will be set forth in part in the description which follows and, in part, will be apparent from the description, or may be learned by practice of the presented embodiments of the disclosure.

In an embodiment of the disclosure, a display panel includes a substrate including a central area, a corner area including an extension area extending in a direction away from the central area, and an intermediate area disposed between the central area and the corner area. A first groove is defined in the corner area and having a closed curve shape, at least a portion of the first groove is defined along a circumference of the central area, and a second groove is defined in the intermediate area along the circumference of the central area, and has a closed curve shape.

In an embodiment, the first groove may be defined along a circumference of the extension area.

In an embodiment, the display panel may further include a first organic insulating layer disposed on the substrate, and a second organic insulating layer disposed on the first organic insulating layer.

In an embodiment, the first groove may be defined in the first organic insulating layer.

In an embodiment, the display panel may further include a first connection line disposed between the substrate and the first organic insulating layer, and a second connection line disposed between the first organic insulating layer and the second organic insulating layer.

In an embodiment, the first connection line and the second connection line may be electrically connected to each other in the first groove.

In an embodiment, the display panel may further include a first inorganic pattern layer disposed in the first groove and covering the second connection line, and a second inorganic pattern layer disposed on the second organic insulating layer.

In an embodiment, the second inorganic pattern layer may include a first protruding tip protruding toward a center of the first groove.

In an embodiment, the first inorganic pattern layer may include a second protruding tip protruding in a direction opposite to a central direction of the first groove, the second inorganic pattern layer may include a third protruding tip protruding in the direction opposite to the central direction of the first groove, and the second protruding tip and the third protruding tip may at least partially overlap each other in a thickness direction of the substrate.

In an embodiment, the display panel may further include a third inorganic pattern layer disposed on the first connection line, and a third organic insulating layer disposed on the third inorganic pattern layer.

In an embodiment, the first connection line and the second connection line may not be electrically connected to each other.

In an embodiment, the display panel may further include a pixel disposed in the intermediate area.

In an embodiment, the second groove may be defined between the pixel and the corner area.

In an embodiment, the second groove may be defined between the pixel and the central area.

In an embodiment, the display panel may further include a first dam portion and a second dam portion disposed in the corner area. The first groove may be defined between the first dam portion and the second dam portion.

In an embodiment, at least a portion of the first dam portion may be disposed along a circumference of the central area, and the first dam portion may have a closed curve shape.

In an embodiment, at least a portion of the second dam portion may be disposed along a circumference of the central area, and the second dam portion may have a closed curve shape.

In an embodiment, the display panel may further include an auxiliary dam portion disposed in the corner area. A height of the auxiliary dam portion may be greater than a height of the first dam portion or the second dam portion.

In an embodiment, the display panel may further include an encapsulation layer and a protective layer disposed in the corner area, the intermediate area, and the central area. The encapsulation layer may include a first inorganic encapsulation layer, an organic encapsulation layer, and a second inorganic encapsulation layer, and the protective layer may include a first inorganic protective layer, an organic protective layer, and a second inorganic protective layer.

In an embodiment, the organic protective layer may be separated from an upper surface of the second dam portion.

In an embodiment of the disclosure, a display device includes a display panel, and a cover window disposed on the display panel. The display panel includes a substrate including a central area, a corner area including an extension area extending in a direction away from the central area, and an intermediate area disposed between the central area and the corner area. A first groove is defined in the corner area and has a closed curve shape, at least a portion of the first groove is defined along a circumference of the central area, and a second groove is defined in the intermediate area along the circumference of the central area, and has a closed curve shape. The display panel bends in the corner area.

These and/or other features will become apparent and more readily appreciated from the following description of the embodiments, taken in conjunction with the accompanying drawings.

BRIEF DESCRIPTION OF THE DRAWINGS

The above and other features and advantages of predetermined embodiments of the disclosure will be more apparent from the following description taken in conjunction with the accompanying drawings, in which.

DETAILED DESCRIPTION

Figure 1:
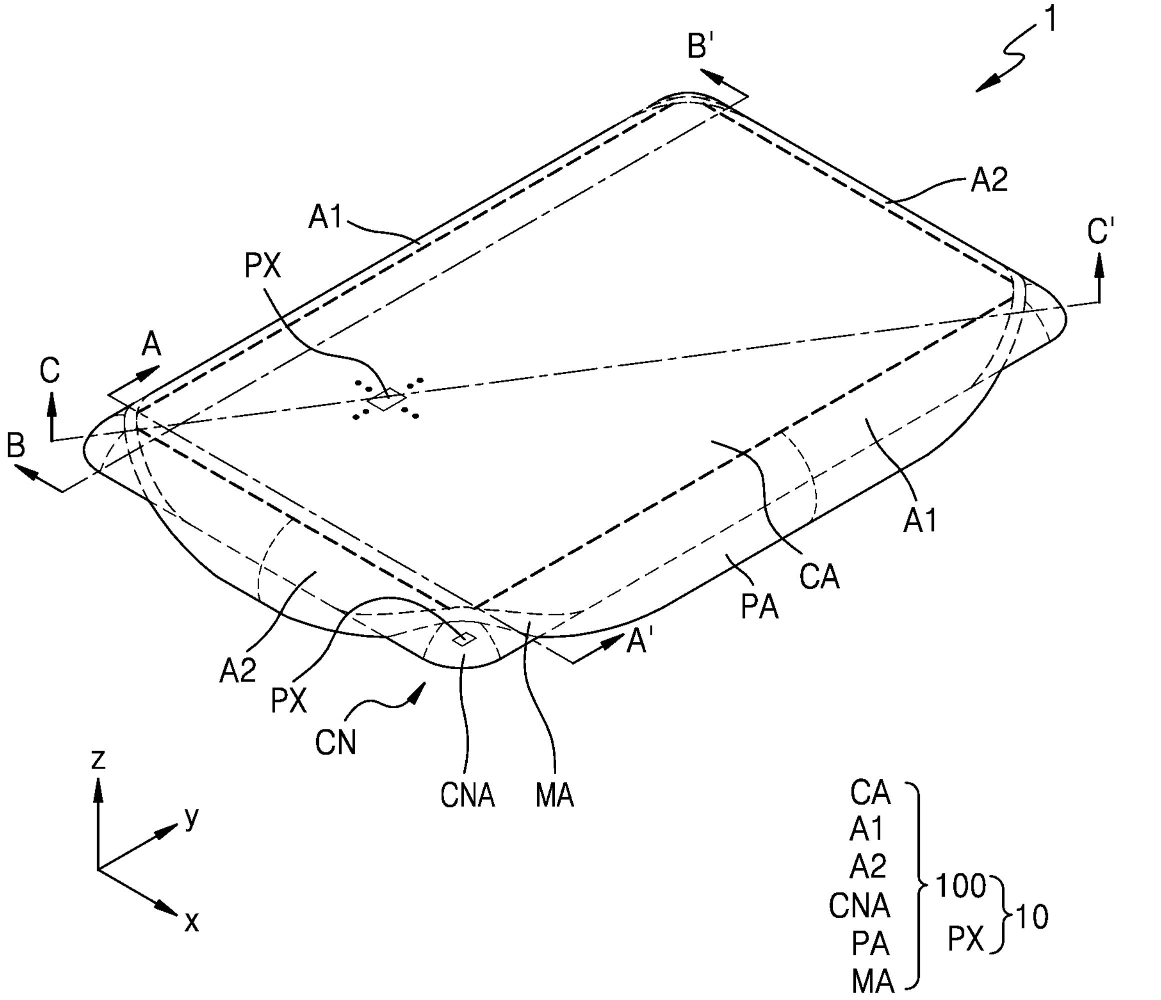
FIG. 1 is a schematic perspective view of an embodiment of a display device.

Reference will now be made in detail to embodiments, illustrative embodiments of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "including" and/or "having" used herein specify the presence of stated features or elements, but do not preclude the presence or addition of one or more other features or elements.

It will be understood that when a layer, region, or component is referred to as being "formed/disposed on," another layer, region, or component, it can be directly or indirectly formed/disposed on the other layer, region, or component. That is, for example, intervening layers, regions, or components may be present.

Sizes of elements in the drawings may be exaggerated for convenience of explanation. Since sizes and thicknesses of components in the drawings are arbitrarily illustrated for convenience of explanation, for example, the following embodiments are not limited thereto.

In the specification, an expression such as "A and/or B" indicates A, B, or A and B. Also, an expression such as "at least one of A and B" indicates A, B, or A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, when an element is referred to as being "in a plan view," it is understood that an element is viewed from the top, and when an element is referred to as being "in a cross-section," it is understood that the element is vertically cut and viewed from the side. In the following embodiments, when elements "overlap" each other, the elements overlap "in a plan view" and "in a cross-section."

Hereinafter, the embodiments of the disclosure will be described in detail with reference to the accompanying drawings, and like reference numerals in the drawings denote like reference elements.

A display device in an embodiment may be a device that displays a moving image or still image, and may be a portable electronic device, such as a mobile phone, a smart phone, a tablet personal computer, a mobile communication terminal, an electronic notebook, an e-book, a portable multimedia player ("PMP"), a navigation device, or an ultra-mobile personal computer ("UMPC"). In an alternative embodiment, the display device may be a wearable device, such as a smart watch, a watch phone, a glasses display, or a head mounted display ("HMD"). In an alternative embodiment, the display device may be a gauge of a vehicle or a center information display ("CID") disposed on a center fascia or dashboard of a vehicle, or a dashboard, may be a room mirror display replacing a side mirror of a vehicle, and may be a display unit disposed on a rear surface of a front seat as entertainment for a rear seat of a vehicle.

Figure 2A:
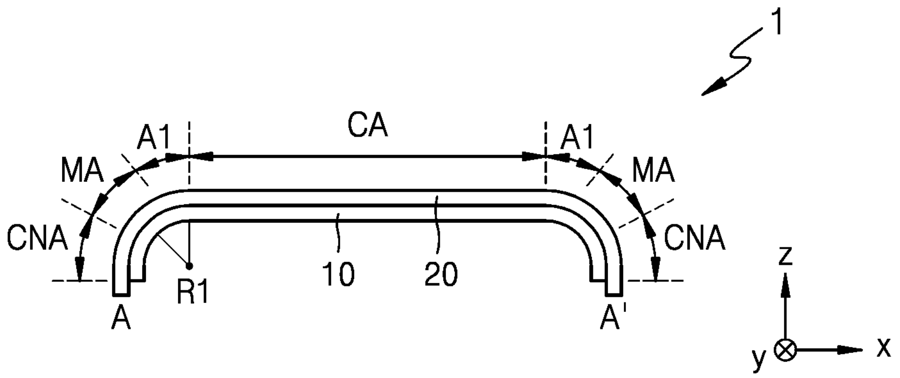
FIG. 2A is a schematic cross-sectional view of an embodiment of the display device taken along line A-A' in FIG. 1.
Figure 2B:
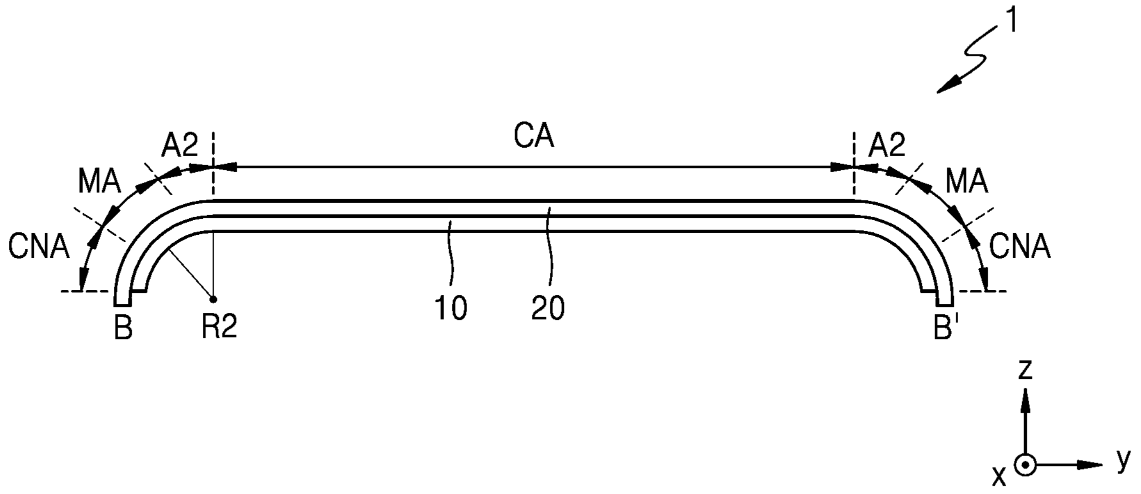
FIG. 2B is a schematic cross-sectional view of an embodiment of the display device taken along line B-B' in FIG. 1.
Figure 2C:
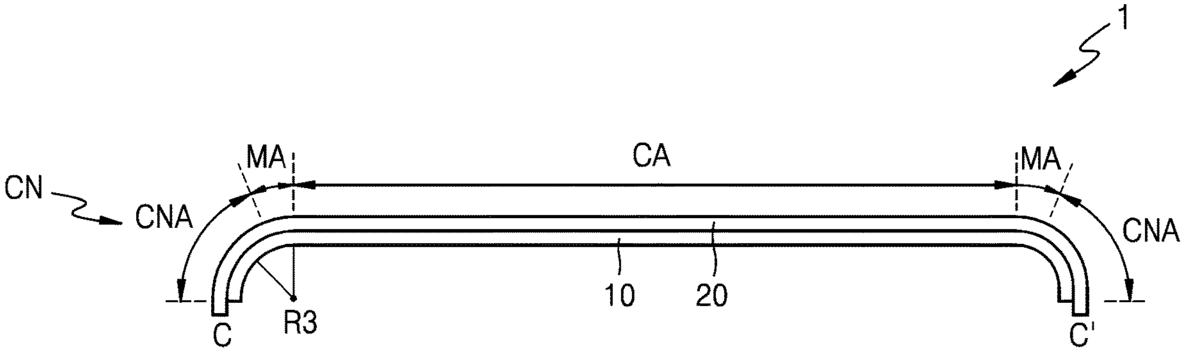
FIG. 2C is a schematic cross-sectional view of an embodiment of the display device taken along line C-C' in FIG. 1.

FIG. 1 is a schematic perspective view of an embodiment of a display device 1. FIG. 2A is a schematic cross-sectional view of the display device 1 taken along line A-A' in FIG. 1. FIG. 2B is a schematic cross-sectional view of the display device 1 taken along line B-B' in FIG. 1. FIG. 2C is a schematic cross-sectional view of the display device 1 taken along line C-C' in FIG. 1.

Referring to FIGS. 1 and 2A to 2C, the display device 1 may display an image. The display device 1 may include an edge in a first direction and an edge in a second direction. In this case, the first direction and the second direction may be directions crossing each other. In an embodiment, an angle formed by the first direction and the second direction may be an acute angle. In an alternative embodiment, the first direction and the second direction may define an obtuse angle or be perpendicular to each other. Hereinafter, a case in which the first direction and the second direction are perpendicular to each other will be mainly described in detail. In an embodiment, the first direction may be an x direction or a −x direction, and the second direction may be a y direction or a −y direction.

In an embodiment, a corner CN where the edge in the first direction (e.g., the x direction or the −x direction) meets the edge in the second direction (e.g., the y direction or the −y direction) may have a predetermined curvature.

The display device 1 may include a cover window 20 and a display panel 10. The cover window 20 may protect the display panel 10. In an embodiment, the cover window 20 may be disposed on the display panel 10. In an embodiment, the cover window 20 may be a flexible window. The cover window 20 may be easily bent according to an external force without cracks occurring or the like to protect the display panel 10. The cover window 20 may include glass, sapphire, or plastic. The cover window 20 may include, e.g., ultra-thin glass or colorless polyimide.

The display panel 10 may be disposed under the cover window 20. Although not shown in the drawings, the display panel 10 and the cover window 20 may be attached to a transparent adhesive member, such as an optically clear adhesive ("OCA") film.

The display panel 10 may display an image. The display panel 10 may include a substrate 100 and a pixel PX. The display panel 10 may include a central area CA, a first area A1, a second area A2, a corner area CNA, an intermediate area MA, and a peripheral area PA. The central area CA, the first area A1, the second area A2, the corner area CNA, the intermediate area MA, and the peripheral area PA may be defined in the display panel 10. In an alternative embodiment, the central area CA, the first area A1, the second area A2, the corner area CNA, the intermediate area MA, and the peripheral area PA may be defined in the substrate 100 of the display panel 10. In other words, the substrate 100 may include the central area CA, the first area A1, the second area A2, the corner area CNA, the intermediate area MA, and the peripheral area PA. Hereinafter, a case in which the central area CA, the first area A1, the second area A2, the corner area CNA, the intermediate area MA, and the peripheral area PA are defined in the substrate 100 will be described in detail.

The central area CA may be a flat area. In an embodiment, the central area CA of the display device 1 may provide most of the images.

The first area A1 of the display panel 10 may be bendable. The first area A1 may be adjacent to the central area CA in the first direction (e.g., the x direction or the −x direction) and may be bendable. The first area A1 may be defined as an area where a cross-section (e.g., an xz cross-section) of the first area A1 bends from the central area CA in the first direction (e.g., the x direction or the −x direction). The first area A1 may extend in the second direction (e.g., the y direction or the −y direction) In other words, a cross-section (e.g., a yz cross-section) of the first area A1 may not bend in the second direction (e.g., the y direction or the −y direction). The first area A1 may be an area that bends about an axis extending in the second direction (e.g., the y direction or the −y direction). In FIG. 2A, it is shown that the curvature of the first area A1 extending in the x direction from the central area CA and bent may be the same as that of the first area A1 extending in the −x direction from the central area CA and bent. However, the disclosure is not limited thereto. In an embodiment, the curvature of the first area A1 extending in the x direction from the central area CA and bent may be different from that of the first area A1 extending in the −x direction from the central area CA and bent.

The second area A2 of the display panel 10 may be bendable. The second area A2 may be adjacent to the central area CA in the second direction (e.g., the y direction or the −y direction) and may be bendable. The second area A2 may be defined as an area where the cross-section (e.g., the yz cross-section) of the second area A2 bends from the central area CA in the second direction (e.g., the y direction or the −y direction). The second area A2 may extend in the first direction (e.g., the x direction or the −x direction). The cross-section (e.g., the xz cross-section) of the second area A2 may not bend (in the first direction (e.g., the x direction or the −x direction). The second area A2 may be an area that bends about an axis extending in the first direction (e.g., the x direction or the −x direction). In FIG. 2B, it is shown that the curvature of the second area A2 extending in the y direction from the central area CA and bent is the same as that of the second area A2 extending in the −y direction from the central area CA and bent. However, the disclosure is not limited thereto. In an embodiment, the curvature of the second area A2 extending in the y direction from the central area CA and bent may be different from that of the second area A2 extending in the −y direction from the central area CA and bent.

The corner area CNA of the display panel 10 may be bendable. The corner area CNA may be an area at the corner CN. In an embodiment, the corner area CNA may be an area where an edge of the display device 1 in the first direction (e.g., the x direction or the −x direction) meets an edge of the display device 1 in the second direction (e.g., the y direction or the −y direction). In an embodiment, the corner area CNA may at least partially surround the central area CA, the first area A1, and the second area A2. The corner area CNA may at least partially surround the central area CA, the first area A1, the second area A2, and the intermediate area MA. When the first area A1 extends in the first direction (e.g., the x direction or the −x direction) and bends and the second area A2 extends in the second direction (e.g., the y direction or the −y direction) and bends, at least a portion of the corner area CNA may extend in the first direction (e.g., the x direction or the −x direction) and bend and may extend in the second direction (e.g., the y direction or the −y direction)

and bend. In other words, at least a portion of the corner area CNA may be a double-curve area having a plurality of curvatures in a plurality of directions. In an embodiment, a plurality of corner areas CNA may be provided.

The intermediate area MA may be between the central area CA and the corner area CNA. In an embodiment, the intermediate area MA may extend between the first area A1 and the corner area CNA. In an embodiment, the intermediate area MA may extend between the second area A2 and the corner area CNA. In an embodiment, the intermediate area MA may be bendable. A driving circuit for providing an electrical signal to the pixel PX and/or a power supply line for providing power to the pixel PX may be disposed in the intermediate area MA. In this case, a pixel PX disposed in the intermediate area MA may overlap the driving circuit and/or the power supply line.

The peripheral area PA may be disposed outside the central area CA. In an embodiment, the peripheral area PA may be disposed outside the first area A1. The peripheral area PA may extend from the first area A1. In an embodiment, the peripheral area PA may be disposed outside the second area A2. The peripheral area PA may extend from the second area A2. A pixel PX may not be disposed in the peripheral area PA. Accordingly, the peripheral area PA may be a non-display area that does not display an image. A driving circuit for providing an electrical signal to the pixel PX and/or a power supply line for providing power to the pixel PX may be disposed in the peripheral area PA.

Referring to FIG. 2A, the first area A1, the intermediate area MA, and a portion of the corner area CNA may bend with a first radius of curvature R1. Referring to FIG. 2B, the second area A2, the intermediate area MA, and another portion of the corner area CNA may bend with a second radius of curvature R2. Referring to FIG. 2C, the intermediate area MA and another portion of the corner area CNA may bend with a third radius of curvature R3.

The pixel PX may be disposed on the substrate 100. In an embodiment, the pixel PX may be implemented as a display element. In an embodiment, a plurality of pixels PX may be provided, and the plurality of pixels PX may emit light to display an image. In an embodiment, each of the plurality of pixels PX may include a red sub-pixel, a green sub-pixel, and a blue sub-pixel. In an alternative embodiment, each of the plurality of pixels PX may include a red sub-pixel, a green sub-pixel, a blue sub-pixel, and a white sub-pixel. However, the disclosure is not limited thereto, and the plurality of pixels PX may include various other color pixels.

The pixel PX may be disposed in at least one of the central area CA, the first area A1, the second area A2, and the corner area CNA. In an embodiment, the plurality of pixels PX may be arranged in the central area CA, the first area A1, the second area A2, the corner area CNA, and the intermediate area MA. In this case, the display device 1 may display an image in the central area CA, the first area A1, the second area A2, the corner area CNA, and the intermediate area MA. In an embodiment, the display device 1 may provide an independent image in each of the central area CA, the first area A1, the second area A2, the corner area CNA, and the intermediate area MA. In an alternative embodiment, the display device 1 may provide a portion of any one image in each of the central area CA, the first area A1, the second area A2, the corner area CNA, and the intermediate area MA.

In the display device 1, a plurality of pixels PX may be arranged not only in the central area CA, but also in the first area A1, the second area A2, the intermediate area MA, and the corner area CNA to display an image. Accordingly, an area occupied by a display area, which is an area for displaying an image in the display device 1, may increase. In addition, because the display device 1 may display an image even at the bent corner CN, an aesthetic sense may be improved.

Figure 3:
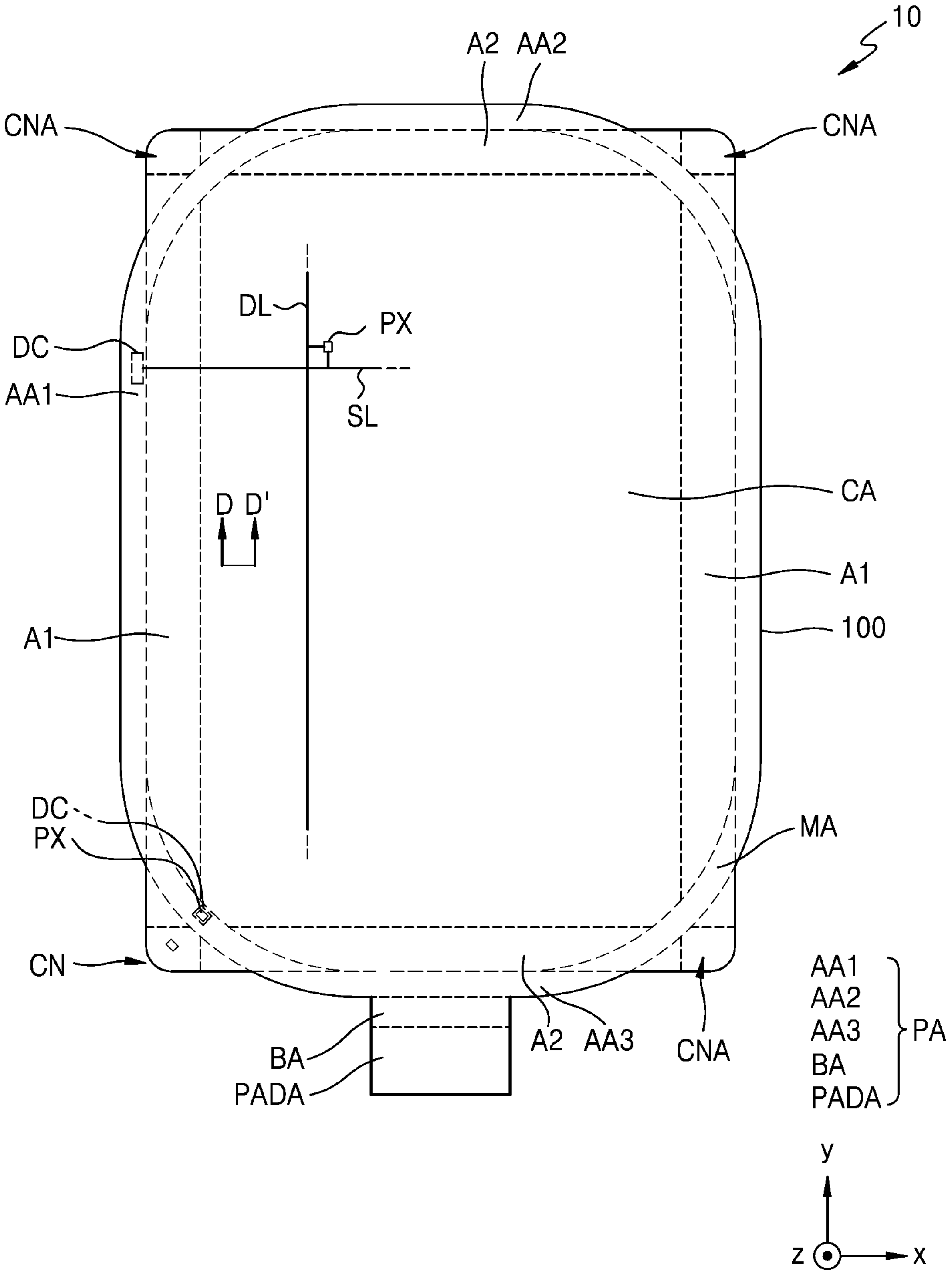
FIG. 3 is a schematic plan view of an embodiment of a display panel.

FIG. 3 is a schematic plan view of an embodiment of a display panel 10. FIG. 3 is a schematic plan view illustrating a state in which the display panel 10 is unfolded.

Referring to FIG. 3, the display panel 10 may display an image. The display panel 10 may include a substrate 100, a pixel PX, and a driving circuit DC. The substrate 100 may include a central area CA, a first area A1, a second area A2, a corner area CNA, an intermediate area MA, and a peripheral area PA. The central area CA may be a flat area. In an embodiment, the display panel 10 may provide most of the image in the central area CA.

The first area A1 may be adjacent to the central area CA in a first direction (e.g., an x direction or a −x direction). In an embodiment, the first area A1 may be disposed between the central area CA and the peripheral area PA. The first area A1 may extend in the first direction (e.g., the x direction or the −x direction) from the central area CA.

The second area A2 may be adjacent to the central area CA in a second direction (e.g., a y direction or a −y direction). In an embodiment, the second area A2 may be disposed between the central area CA and the peripheral area PA. The second area A2 may extend in the second direction (e.g., the y direction or the −y direction) from the central area CA.

The corner area CNA may be an area at a corner CN of the display panel 10. In an embodiment, the corner area CNA may be an area where an edge of the display panel 10 in the first direction (e.g., the x direction or the −x direction) meets an edge of the display panel 10 in the second direction (e.g., the y direction or the −y direction). In an embodiment, the corner area CNA and the intermediate area MA may at least partially surround the central area CA, the first area A1, and the second area A2. The corner area CNA may at least partially surround the central area CA, the first area A1, the second area A2, and the intermediate area MA.

The intermediate area MA may be between the central area CA and the corner area CNA. In an embodiment, the intermediate area MA may extend between the first area A1 and the corner area CNA. In an embodiment, the intermediate area MA may extend between the second area A2 and the corner area CNA. A driving circuit DC for providing an electrical signal to the pixel PX and/or a power supply line for providing power to the pixel PX may be disposed in the intermediate area MA. A pixel PX disposed in the intermediate area MA may overlap the driving circuit DC and/or the power supply line.

The peripheral area PA may be disposed outside the central area CA. A pixel PX may not be disposed in the peripheral area PA. Accordingly, the peripheral area PA may be a non-display area that does not display an image. A driving circuit DC for providing an electrical signal to the pixel PX and/or a power supply line for providing power to the pixel PX may be disposed in the peripheral area PA. The peripheral area PA may include a first adjacent area AA1, a second adjacent area AA2, a third adjacent area AA3, a bending area BA, and a pad area PADA.

The first adjacent area AA1 may be disposed outside the first area A1. In other words, the first area A1 may be disposed between the first adjacent area AA1 and the central area CA. In an embodiment, the first adjacent area AA1 may extend from the first area A1 in the first direction (e.g., the x direction or the −x direction). In an embodiment, a driving circuit DC and/or a power supply line may be disposed in the first adjacent area AA1.

The second adjacent area AA2 and the third adjacent area AA3 may be disposed outside the second area A2. In other words, the second area A2 may be disposed between the second adjacent area AA2 and the central area CA. Also, the second area A2 may be disposed between the third adjacent area AA3 and the central area CA. In an embodiment, the second adjacent area AA2 and the third adjacent area AA3 may extend in the second direction (e.g., they direction or the −y direction). The central area CA may be disposed between the second adjacent area AA2 and the third adjacent area AA3.

The bending area BA may be disposed outside the third adjacent area AA3. In other words, the third adjacent area AA3 may be disposed between the bending area BA and the second area A2. The bending area BA of the display panel 10 may be bendable. In this case, the pad area PADA may face the rear surface of the display panel 10, which is opposite to the upper surface of the display panel 10 on which an image is displayed. Accordingly, the area of the peripheral area PA visible to a user may be reduced.

The pad area PADA may be disposed outside the bending area BA. In other words, the bending area BA may be disposed between the third adjacent area AA3 and the pad area PADA. A pad (not shown) may be disposed in the pad area PADA. The display panel 10 may receive an electrical signal and/or a power voltage through the pad.

At least one of the first area A1, the second area A2, the corner area CNA, and the intermediate area MA may be bendable. In an embodiment, a cross-section (e.g., an xz cross-section) of the first area A1 and a portion of the corner area CNA may bend in the first direction (e.g., the x direction or the −x direction). A cross-section (e.g., a yz cross-section) of the second area A2 and another portion of the corner area CNA may bend in the second direction (e.g., the y direction or the −y direction). Cross-sections (e.g., an xz-section and a yz cross-section) of other portions of the corner area CNA may bend in the first direction (e.g., the x direction or the −x direction) and in the second direction (e.g., the y direction or the −y direction).

When the corner area CNA bends, a compressive strain occurring in the corner area CNA may be greater than a tensile strain occurring in the corner area CNA. In this case, it is desired to apply a contractible substrate 100 and a multilayer structure on the contractible substrate 100 to at least a portion of the corner area CNA. In an embodiment, the structure of the display panel 10 in the corner area CNA may be different from the structure of the display panel 10 in the central area CA.

The pixel PX and the driving circuit DC may be disposed on the contractible substrate 100. The pixel PX may be disposed in at least one of the central area CA, the first area A1, the second area A2, the corner area CNA, and the intermediate area MA. In an embodiment, the pixel PX may include a display element. In an embodiment, the display element may be an organic light-emitting diode including an organic emission layer. In an alternative embodiment, the display element may be a light-emitting diode including an inorganic emission layer. The light-emitting diode may have a micro scale size or a nano scale size. In an embodiment, the light-emitting diode may be a micro light-emitting diode. In an alternative embodiment, the light-emitting diode may be a nanorod light-emitting diode. The nanorod light-emitting diode may include gallium nitride (GaN). In an embodiment, a color conversion layer may be disposed on the nanorod light-emitting diode. The color conversion layer may include quantum dots. In an alternative embodiment, the display element may be a quantum dot light-emitting diode including a quantum dot light-emitting layer.

The pixel PX may include a plurality of sub-pixels, and each of the plurality of sub-pixels may emit light of a predetermined color by a display element. In the specification, the sub-pixel is the smallest unit for realizing an image and refers to an emission area. When an organic light-emitting diode is employed as the display element, the emission area may be defined by an opening of a pixel-defining layer. This feature will be described below.

The driving circuit DC may provide a signal to each pixel PX. In an embodiment, the driving circuit DC may be a scan driving circuit that provides a scan signal to each pixel PX through a scan line SL. In an alternative embodiment, the driving circuit DC may be an emission control driving circuit that provides an emission control signal to each pixel PX through an emission control line (not shown). In an alternative embodiment, the driving circuit DC may be a data driving circuit that provides a data signal to each pixel PX through a data line DL. Although not shown in the drawings, the data driving circuit may be disposed in the third adjacent area AA3 or the pad area PADA. In an alternative embodiment, the data driving circuit may be disposed on a display circuit board connected through a pad.

Figure 4A:
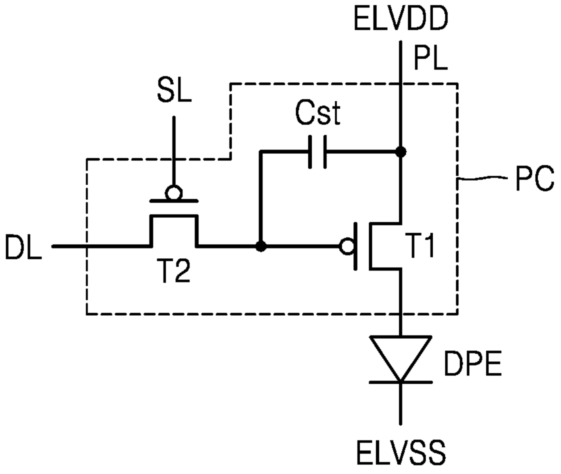
FIGS. 4A and 4B are schematic equivalent circuit diagrams of an embodiment of a pixel circuit applicable to a display panel.
Figure 4B:
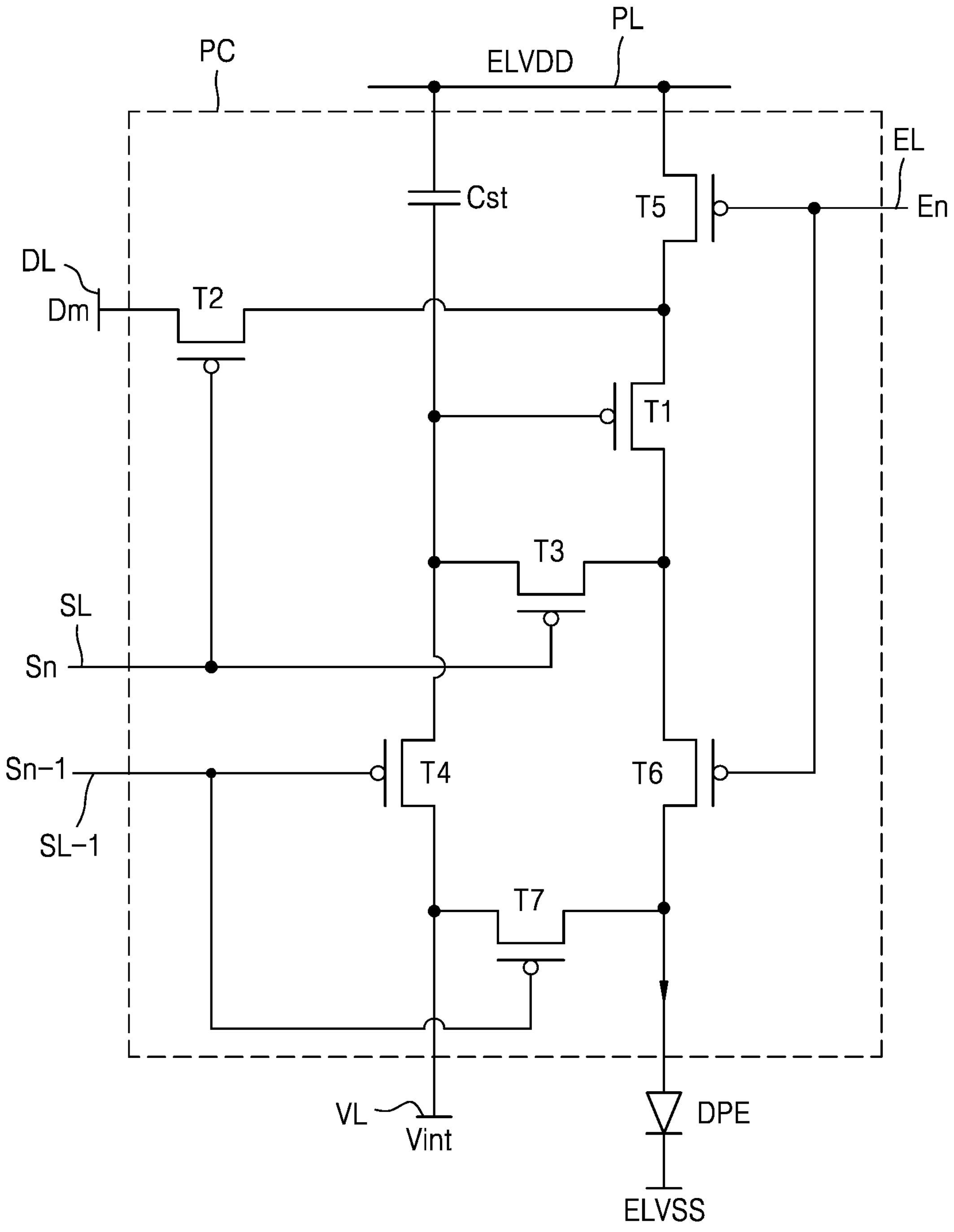

FIGS. 4A and 4B are schematic equivalent circuit diagrams of a pixel circuit PC applicable to a display panel.

Referring to FIG. 4A, the pixel circuit PC may be electrically connected to a display element DPE. The pixel circuit PC may include a driving thin-film transistor T1, a switching thin-film transistor T2, and a storage capacitor Cst. In an embodiment, the display element DPE may emit red, green, or blue light, or may emit red, green, blue, or white light. However, the disclosure is not limited thereto, and the display element DPE may emit various other color light.

The switching thin-film transistor T2 may be connected to a scan line SL and a data line DL, and may transfer a data signal input from the data line DL to the driving thin-film transistor T1, based on a scan signal input from the scan line SL.

The storage capacitor Cst may be connected to the switching thin-film transistor T2 and a driving voltage line PL, and may store a voltage corresponding to the difference between a voltage received from the switching thin-film transistor T2 and a first power voltage ELVDD supplied to the driving voltage line PL.

The driving thin-film transistor T1 may be connected to the driving voltage line PL and the storage capacitor Cst, and may control a driving current, which flows from the driving voltage line PL through the display element DPE, in response to a voltage value stored in the storage capacitor Cst. The display element DPE may emit light having a predetermined luminance according to the driving current. An opposite electrode of the display element DPE may receive a second power voltage ELVSS.

Although FIG. 4A illustrates a case in which the pixel circuit PC includes two thin-film transistors and one storage capacitor, the pixel circuit PC may include three or more thin-film transistors.

Referring to FIG. 4B, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Although FIG. 4B illustrates a case in which a scan line SL, a previous scan line SL-1, an emission control line EL, a data line DL, an initialization voltage line VL, and a driving voltage line PL are provided for each pixel circuit PC, the disclosure is not limited thereto. In an embodiment, at least one of the scan line SL, the previous scan line SL-1, the emission control line EL, the data line DL, and the initialization voltage line VL, and the initialization voltage line VL may be shared by neighboring pixel circuits, for example.

A driving drain electrode of the driving thin-film transistor T1 may be electrically connected to a display element DPE via the emission control thin-film transistor T6. The driving thin-film transistor T1 may receive the data signal Dm according to a switching operation of the switching thin-film transistor T2 and supply a driving current to the display element DPE.

A switching gate electrode of the switching thin-film transistor T2 may be connected to the scan line SL, and a switching source electrode of the switching thin-film transistor T2 may be connected to the data line DL. A switching drain electrode of the switching thin-film transistor T2 may be connected to a driving source electrode of the driving thin-film transistor T1 and may be connected to the driving voltage line PL via the operation control thin-film transistor T5.

The switching thin-film transistor T2 may be turned on according to the scan signal Sn received through the scan line SL and perform a switching operation for transmitting the data signal Dm, transmitted to the data line DL, to the driving source electrode of the driving thin-film transistor T1.

A compensation gate electrode of the compensation thin-film transistor T3 may be connected to the scan line SL. A compensation source electrode of the compensation thin-film transistor T3 may be connected to the driving drain electrode of the driving thin-film transistor T1 and may be connected to a pixel electrode of the display element DPE via the emission control thin-film transistor T6. A compensation drain electrode of the compensation thin-film transistor T3 may be connected to one electrode of the storage capacitor Cst, a first initialization source electrode of the first initialization thin-film transistor T4, and the driving gate electrode of the driving thin-film transistor T1. The compensation thin-film transistor T3 may be turned on according to the scan signal Sn received through the scan line SL and connect the driving gate electrode and the driving drain electrode of the driving thin-film transistor T1 to each other, and thus, the driving thin-film transistor T1 may be diode-connected.

A first initialization gate electrode of the first initialization thin-film transistor T4 may be connected to the previous scan line SL-1. A first initialization drain electrode of the first initialization thin-film transistor T4 may be connected to the initialization voltage line VL. The first initialization source electrode of the first initialization thin-film transistor T4 may be connected to the one electrode of the storage capacitor Cst, the compensation drain electrode of the compensation thin-film transistor T3, and the driving gate electrode of the driving thin-film transistor T1. The first initialization thin-film transistor T4 may be turned on according to the previous scan signal Sn-1 received through the previous scan line SL-1 and transmit an initialization voltage Vint to the driving gate electrode of the driving thin-film transistor T1 to perform an initialization operation for initializing the voltage of the driving gate electrode of the driving thin-film transistor T1.

An operation control gate electrode of the operation control thin-film transistor T5 may be connected to the emission control line EL. An operation control source electrode of the operation control thin-film transistor T5 may be connected to the driving voltage line PL. An operation control drain electrode of the operation control thin-film transistor T5 may be connected to the driving source electrode of the driving thin-film transistor T1 and the switching drain electrode of the switching thin-film transistor T2.

An emission control gate electrode of the emission control thin-film transistor T6 may be connected to the emission control line EL. An emission control source electrode of the emission control thin-film transistor T6 may be connected to the driving drain electrode of the driving thin-film transistor T1 and the compensation source electrode of the compensation thin-film transistor T3. An emission control drain electrode of the emission control thin-film transistor T6 may be electrically connected to the pixel electrode of the display element DPE. The operation control thin-film transistor T5 and the emission control thin-film transistor T6 may be simultaneously turned on according to the emission control signal En received through the emission control line EL, and thus, the first power voltage ELVDD may be transmitted to the display element DPE and a driving current may flow through the display element DPE.

A second initialization gate electrode of the second initialization thin-film transistor T7 may be connected to the previous scan line SL-1. A second initialization source electrode of the second initialization thin-film transistor T7 may be connected to the pixel electrode of the display element DPE. A second initialization drain electrode of the second initialization thin-film transistor T7 may be connected to the initialization voltage line VL. The second initialization thin-film transistor T7 may be turned on according to the previous scan signal Sn-1 received through the previous scan line SL-1 to initialize the pixel electrode of the display element DPE.

In FIG. 4B, a case in which both the first initialization thin-film transistor T4 and the second initialization thin-film transistor T7 are connected to the previous scan line SL-1 is illustrated. However, the disclosure is not limited thereto. In an embodiment, the first initialization thin-film transistor T4 and the second initialization thin-film transistor T7 may be connected to the previous scan line SL-1 and a subsequent scan line (not shown), respectively, and may be driven according to the previous scan signal Sn-1 and a subsequent scan signal, respectively, for example.

The one electrode of the storage capacitor Cst may be connected to the driving gate electrode of the driving thin-film transistor T1, the compensation drain electrode of the compensation thin-film transistor T3, and the first initialization source electrode of the first initialization thin-film transistor T4. The other electrode of the storage capacitor Cst may be connected to the driving voltage line PL.

An opposite electrode (e.g., a cathode) of the display element DPE may receive the second power voltage ELVSS. The display element DPE may receive a driving current from the driving thin-film transistor T1 and emit light.

Figure 5:
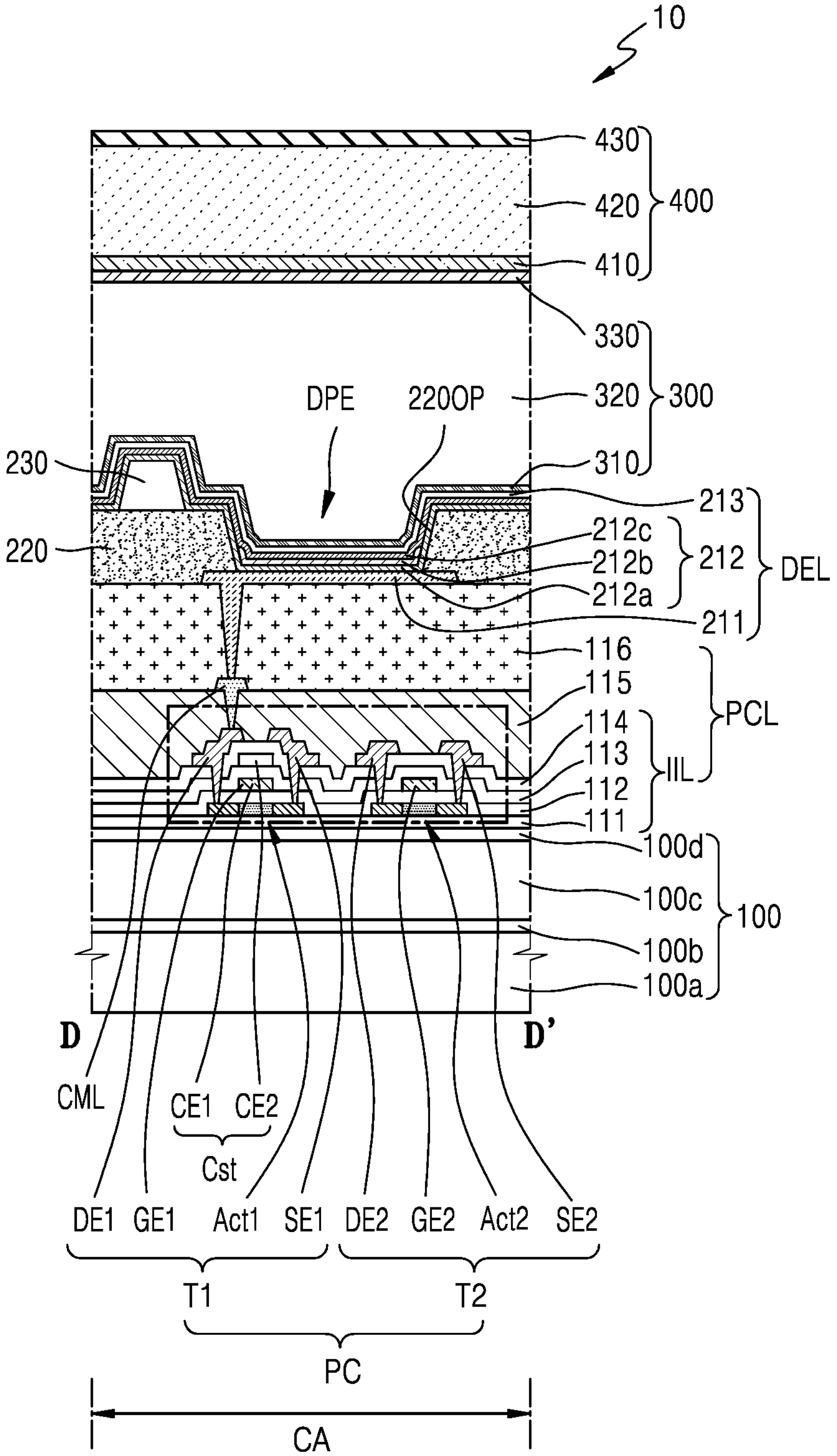
FIG. 5 is a schematic cross-sectional view of the display panel taken along line D-D' in FIG. 3.

FIG. 5 is a schematic cross-sectional view of the display panel 10 taken along line D-D' in FIG. 3.

Referring to FIG. 5, the display panel 10 may include a substrate 100, a pixel circuit layer PCL, a display element layer DEL, an encapsulation layer 300, and a protective layer 400. The substrate 100 may include a central area CA. In an embodiment, the substrate 100 may include a first base layer 100*a*, a first barrier layer 100*b*, a second base layer 100*c*, and a second barrier layer 100*d*. In an embodiment, the first base layer 100*a*, the first barrier layer 100*b*, the second base layer 100*c*, and the second barrier layer 100*d* may be sequentially stacked. In an alternative embodiment, the substrate 100 may include glass.

At least one of the first base layer 100*a* and the second base layer 100*c* may include polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100*b* and the second barrier layer 100*d* may be barrier layers that prevent penetration of external foreign materials, and may include a single layer or multi-layer including an inorganic material, such as silicon nitride ($SiN_x$), silicon oxide ($SiO_2$), and/or silicon oxynitride (SiON).

The pixel circuit layer PCL may be disposed on the substrate 100. The pixel circuit layer PCL may include a pixel circuit PC. The pixel circuit PC may be disposed in the central area CA. The pixel circuit PC may include a driving thin-film transistor T1, a switching thin-film transistor T2, and a storage capacitor Cst. In an embodiment, the driving thin-film transistor T1 may include a first semiconductor layer Act1, a first gate electrode GE1, a first source electrode SE1, and a first drain electrode DE1. In an embodiment, the switching thin-film transistor T2 may include a second semiconductor layer Act2, a second gate electrode GE2, a second source electrode SE2, and a second drain electrode DE2. The second semiconductor layer Act2, the second gate electrode GE2, the second source electrode SE2, and the second drain electrode DE2 are respectively similar to the first semiconductor layer Act1, the first gate electrode GE1, the first source electrode SE1 and the first drain electrode DE1, and thus, detailed descriptions thereof are omitted.

The pixel circuit layer PCL may further include an inorganic insulating layer IIL, a first organic insulating layer 115, and a second organic insulating layer 116, disposed below and/or above components of the pixel circuit PC. The inorganic insulating layer IL may include a buffer layer 111, a first gate insulating layer 112, a second gate insulating layer 113, and an inter-insulating layer 114.

The buffer layer 111 may be disposed on the substrate 100. The buffer layer 111 may include an inorganic insulating material, such as $SiN_x$, SiON, and/or $SiO_2$, and may include a single layer or multi-layer including the inorganic insulating material described above.

The first semiconductor layer Act1 may be disposed on the buffer layer 111. The first semiconductor layer Act1 may include polysilicon. In an alternative embodiment, the first semiconductor layer Act1 may include amorphous silicon, an oxide semiconductor, an organic semiconductor, or the like. The first semiconductor layer Act1 may include a channel region and a drain region and a source region respectively disposed on opposite sides of the channel region.

The first gate electrode GE1 may overlap the channel region. The first gate electrode GE1 may include a low-resistance metal material. The first gate electrode GE1 may include a conductive material including molybdenum (Mo), aluminum (Al), copper (Cu), titanium (Ti), or the like, and may be provided as a multi-layer or single layer including the conductive material.

The first gate insulating layer 112 between the first semiconductor layer Act1 and the first gate electrode GE1 may include an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), and/or zinc oxide ($ZnO_x$). In an embodiment, ZnO may include zinc oxide (ZnO) and/or zinc peroxide ($ZnO_2$).

The second gate insulating layer 113 may cover the first gate electrode GE1. The second gate insulating layer 113 may include an inorganic insulating material, such as $SiO_2$, $SiN_x$, SiON, $Al_2O_3$, $TiO_2$, $Ta_2O_5$, $HfO_2$, and/or $ZnO_x$. The second gate insulating layer 113 may include the same material as that of the first gate insulating layer 112. However, the disclosure is not limited thereto.

An upper electrode CE2 of the storage capacitor Cst may be disposed on the second gate insulating layer 113. The upper electrode CE2 may overlap the first gate electrode GE1 under the upper electrode CE2. In this case, the first gate electrode GE1 of the driving thin-film transistor T1 and the upper electrode CE2, which overlap each other with the second gate insulating layer 113 therebetween, may constitute the storage capacitor Cst. That is, the first gate electrode GE1 of the driving thin-film transistor T1 may function as a lower electrode CE1 of the storage capacitor Cst. In other words, the storage capacitor Cst and the driving thin-film transistor T1 may overlap each other. However, the disclosure is not limited thereto. In an embodiment, the storage capacitor Cst may not overlap the driving thin-film transistor T1, for example. The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multi-layer including the aforementioned material.

The inter-insulating layer 114 may cover the upper electrode CE2. The inter-insulating layer 114 may include an inorganic insulating material, such as $SiO_2$, $SiN_x$, SiON, $Al_2O_3$, $TiO_2$, $Ta_2O_5$, $HfO_2$, or $ZnO_x$. The inter-insulating layer 114 may be a single layer or multi-layer including the aforementioned inorganic insulating material.

Each of the first drain electrode DE1 and the first source electrode SE1 may be disposed on the inter-insulating layer 114. The first drain electrode DE1 and the first source electrode SE1 may each include a material having high conductivity. The first drain electrode DE1 and the first source electrode SE1 may each include a conductive material including Mo, Al, Cu, Ti, or the like, and may be provided as a multi-layer or single layer including the aforementioned conductive material. In an embodiment, the first drain electrode DE1 and the first source electrode SE1 may each have a multilayer structure of Ti/Al/Ti.

The first organic insulating layer 115 may be disposed on the first drain electrode DE1, the first source electrode SE1, the second drain electrode DE2, the second source electrode SE2, and the inter-insulating layer 114. In an embodiment, the first organic insulating layer 115 may include an organic material. In an embodiment, the first organic insulating layer 115 may include an organic insulating material, such as a general purpose polymer such as polymethylmethacrylate ("PMMA") or polystyrene ("PS"), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any combinations thereof, for example.

A connection electrode CML may be disposed on the first organic insulating layer 115. The connection electrode CML may be electrically connected to the pixel circuit PC through a hole defined in the first organic insulating layer 115. In an embodiment, the connection electrode CML may be electrically connected to the first drain electrode DE1 or the first source electrode SE1. The connection electrode CML may include a material having high conductivity. The connection electrode CML may include a conductive material including Mo, Al, Cu, Ti, or the like, and may be provided as a multi-layer or single layer including the aforementioned conductive material. In an embodiment, the connection electrode CML may have a multilayer structure of Ti/Al/Ti.

The second organic insulating layer 116 may be disposed on the first organic insulating layer 115 and the connection electrode CML. In an embodiment, the second organic insulating layer 116 may include an organic material. The second organic insulating layer 116 may include an organic insulating material, such as a general purpose polymer such as PMMA or PS, a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any combinations thereof. The second organic insulating layer 116 may include the same material as that of the first organic insulating layer 115. However, the disclosure is not limited thereto.

The display element layer DEL may be disposed on the pixel circuit layer PCL. The display element layer DEL may include a display element DPE, a pixel-defining layer 220, and a spacer 230. In an embodiment, the display element DPE may be an organic light-emitting diode. The display element DPE may be electrically connected to the connection electrode CML through a hole defined in the second organic insulating layer 116. The display element DPE may include a pixel electrode 211, an intermediate layer 212, and an opposite electrode 213. In an embodiment, the display element DPE disposed in the central area CA may overlap the pixel circuit PC disposed in the central area CA.

The pixel electrode 211 may be disposed on the second organic insulating layer 116. The pixel electrode 211 may be electrically connected to the connection electrode CML through a hole defined in the second organic insulating layer 116. The pixel electrode 211 may include a conductive oxide, such as indium tin oxide (“ITO”), indium zinc oxide (“IZO”), zinc oxide (ZnO), indium oxide ($In_2O_3$), indium gallium oxide (“IGO”), or aluminum zinc oxide (“AZO”). In an alternative embodiment, the pixel electrode 211 may include a reflective layer including Ag, Mg, Al, Pt, Pd, Au, Ni, Nd, Ir, Cr, or any combinations thereof. The pixel electrode 211 may further include a layer including ITO, IZO, ZnO, or $In_2O_3$ above/below the aforementioned reflective layer.

An opening 2200P exposing at least a portion of the pixel electrode 211 may be defined in the pixel-defining layer 220 disposed on the pixel electrode 211. In this case, the opening 2200P defined in the pixel-defining layer 220 may expose at least a portion of the pixel electrode 211. In an embodiment, the opening 2200P defined in the pixel-defining layer 220 may expose a central portion of the pixel electrode 211, for example. The opening 2200P may define an emission area of light emitted from the display element DPE. In an embodiment, the width of the opening 2200P may correspond to the width of the emission area, for example. Also, the width of the opening 2200P may correspond to the width of a sub-pixel.

In an embodiment, the pixel-defining layer 220 may include an organic material. In an alternative embodiment, the pixel-defining layer 220 may include an inorganic insulating material, such as $SiN_x$, SiON, or $SiO_2$. The pixel-defining layer 220 may include an organic material and an inorganic material. In an alternative embodiment, the pixel-defining layer 220 may include a light-blocking material and be provided in black. The light-blocking material may include carbon black, carbon nanotubes, a resin or paste including black dye, metal particles (e.g., nickel, aluminum, molybdenum, or an alloy thereof), metal oxide particles (e.g., chromium oxide), metal nitride particles (e.g., chromium nitride), or the like. When the pixel-defining layer 220 includes a light-blocking material, reflection of external light that is caused by metal structures disposed under the pixel-defining layer 220 may be reduced.

The spacer 230 may be disposed on the pixel-defining layer 220. The spacer 230 may be used to prevent damage to the substrate 100 and/or a multilayer film on the substrate 100 in a process of manufacturing the display device 1. In a method of manufacturing the display panel 10, a mask may be used. In this case, the mask may enter the opening 2200P of the pixel-defining layer 220 or may be in close contact with the pixel-defining layer 220. The spacer 230 may prevent or reduce defects from occurring due to damage or breakage of the substrate 100 and a portion of the multilayer film by the mask when a deposition material is deposited on the substrate 100.

The spacer 230 may include an organic material such as polyimide. In an alternative embodiment, the spacer 230 may include an inorganic material, such as $SiN_x$ or $SiO_2$, or include an organic material and an inorganic material. In an embodiment, the spacer 230 may include a material that is different from that of the pixel-defining layer 220. In an alternative embodiment, the spacer 230 may include the same material as that of the pixel-defining layer 220. In this case, the pixel-defining layer 220 and the spacer 230 may be formed together in a mask process using a halftone mask or the like.

The intermediate layer 212 may be disposed on the pixel-defining layer 220. The intermediate layer 212 may include an emission layer 212*b* disposed in the opening 2200P of the pixel-defining layer 220. The emission layer 212*b* may include a high molecular weight organic material or a low molecular weight organic material, which emits light of a predetermined color.

The intermediate layer 212 may further include at least one of a first functional layer 212*a* between the pixel electrode 211 and the emission layer 212*b* and a second functional layer 212*c* between the emission layer 212*b* and the opposite electrode 213. In an embodiment, the first functional layer 212*a* and the second functional layer 212*c* may be disposed below and above the emission layer 212*b*, respectively. In an embodiment, the first functional layer 212*a* may include a hole transport layer (“HTL”) or include an HTL and a hole injection layer (“HIL”), for example. The second functional layer 212*c* may include an electron transport layer (“ETL”) and/or an electron injection layer (“EIL”). The first functional layer 212*a* and/or the second functional layer 212*c* may be a common layer formed to cover an entirety of the substrate 100 like the opposite electrode 213 to be described below.

The opposite electrode 213 may be disposed on the intermediate layer 212. The opposite electrode 213 may include a conductive material having a low work function. In an embodiment, the opposite electrode 213 may include a (semi) transparent layer including Ag, Mg, Al, Pt, Pd, Au, Ni, Nd, Ir, Cr, Li, Ca, or an alloy thereof, for example. In an alternative embodiment, the opposite electrode 213 may further include a layer including ITO, IZO, ZnO, or $In_2O_3$ on the (semi) transparent layer including the aforementioned material. Although not shown, a capping layer (not shown)

may be further disposed on the opposite electrode 213. The capping layer may include LiF, an inorganic material, and/or an organic material.

The encapsulation layer 300 may be disposed on the opposite electrode 213. In an embodiment, the encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330. The first inorganic encapsulation layer 310, the organic encapsulation layer 320, and the second inorganic encapsulation layer 330 may be sequentially stacked.

The first inorganic encapsulation layer 310 and the second inorganic encapsulation layer 330 may each include at least one inorganic material selected from among $Al_2O_3$, $TiO_2$, $Ta_2O_5$, $HfO_2$, $ZnO_x$, $SiO_2$, $SiN_x$, and SiON. The organic encapsulation layer 320 may include a polymer-based material. In an embodiment, the polymer-based material may include at least one of acrylic resin, epoxy-based resin, polyimide, and polyethylene. In an embodiment, the organic encapsulation layer 320 may include an acrylate.

In an embodiment, the protective layer 400 may be disposed on the encapsulation layer 300. The protective layer 400 may include a first inorganic protective layer 410, an organic protective layer 420, and a second inorganic protective layer 430. The first inorganic protective layer 410, the organic protective layer 420, and the second inorganic protective layer 430 may be sequentially stacked.

The first inorganic protective layer 410 and the second inorganic protective layer 430 may each include at least one inorganic material selected from among $Al_2O_3$, $TiO_2$, $Ta_2O_5$, $HfO_2$, $ZnO_x$, $SiO_2$, $SiN_x$, and SiON. The organic protective layer 420 may include a polymer-based material. In an embodiment, the polymer-based material may include at least one of acrylic resin, epoxy-based resin, polyimide, and polyethylene.

Although not shown in the drawings, an input sensing layer may be disposed on the protective layer 400. The input sensing layer may acquire coordinate information according to an external input, e.g., a touch event. The input sensing layer may include a sensing electrode (or a touch electrode) and trace lines connected to the sensing electrode. The input sensing layer may sense an external input by a mutual capacitance method and/or a self-capacitance method.

Although not shown in the drawings, an anti-reflection layer may be disposed on the input sensing layer. The anti-reflection layer may reduce reflectance of light incident toward the display panel 10. In an embodiment, the anti-reflection layer may include a phase retarder and/or a polarizer. The phase retarder may be of a film type or a liquid crystal coating type, and may include a λ/2 phase retarder and/or a λ/4 phase retarder. However, the disclosure is not limited thereto, and the phase retarder may include various other waveplates. The polarizer may also be of a film type or a liquid crystal coating type. The film type may include a stretched synthetic resin film, and the liquid crystal coating type may include liquid crystals arranged in a predetermined arrangement. The phase retarder and the polarizer may each further include a protective film.

In an alternative embodiment, the anti-reflection layer may include a black matrix and color filters. The color filters may be arranged by considering the color of light emitted from each of the plurality of display elements DPE of the display panel 10. Each of the color filters may include a red, green, or blue pigment or dye. In an alternative embodiment, each of the color filters may further include quantum dots in addition to the aforementioned pigment or dye. In an alternative embodiment, some of the color filters may not include the aforementioned pigment or dye, and may include scattering particles, such as titanium oxide.

In an alternative embodiment, the anti-reflection layer may include a destructive interference structure. The destructive interference structure may include a first reflective layer and a second reflective layer, disposed on different layers. First reflected light and second reflected light respectively reflected from the first reflective layer and the second reflective layer may destructively interfere, and thus external light reflectance may be reduced.

Figure 6A:
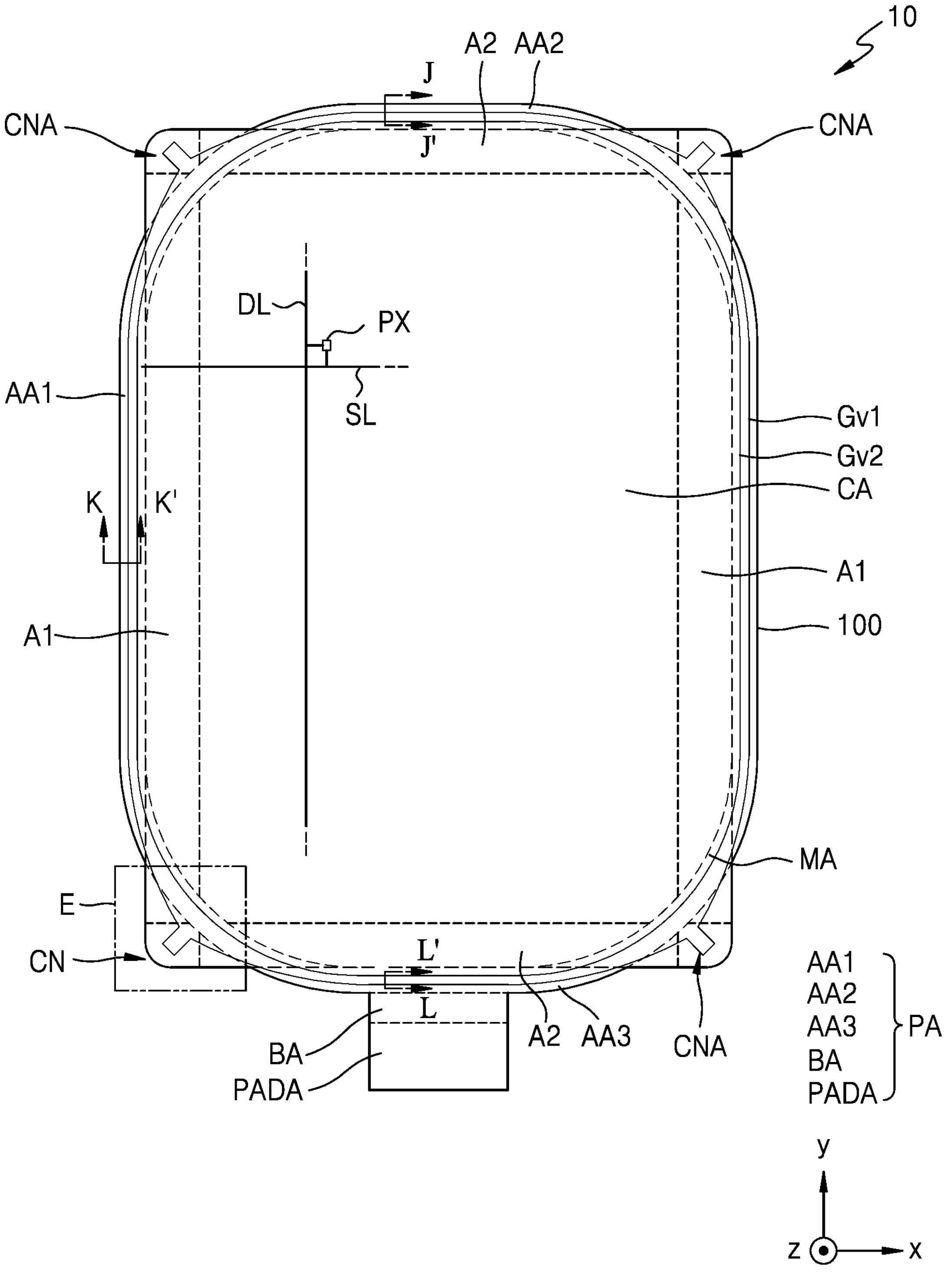
FIGS. 6A and 6B are schematic plan views of an embodiment of a display panel.
Figure 6B:
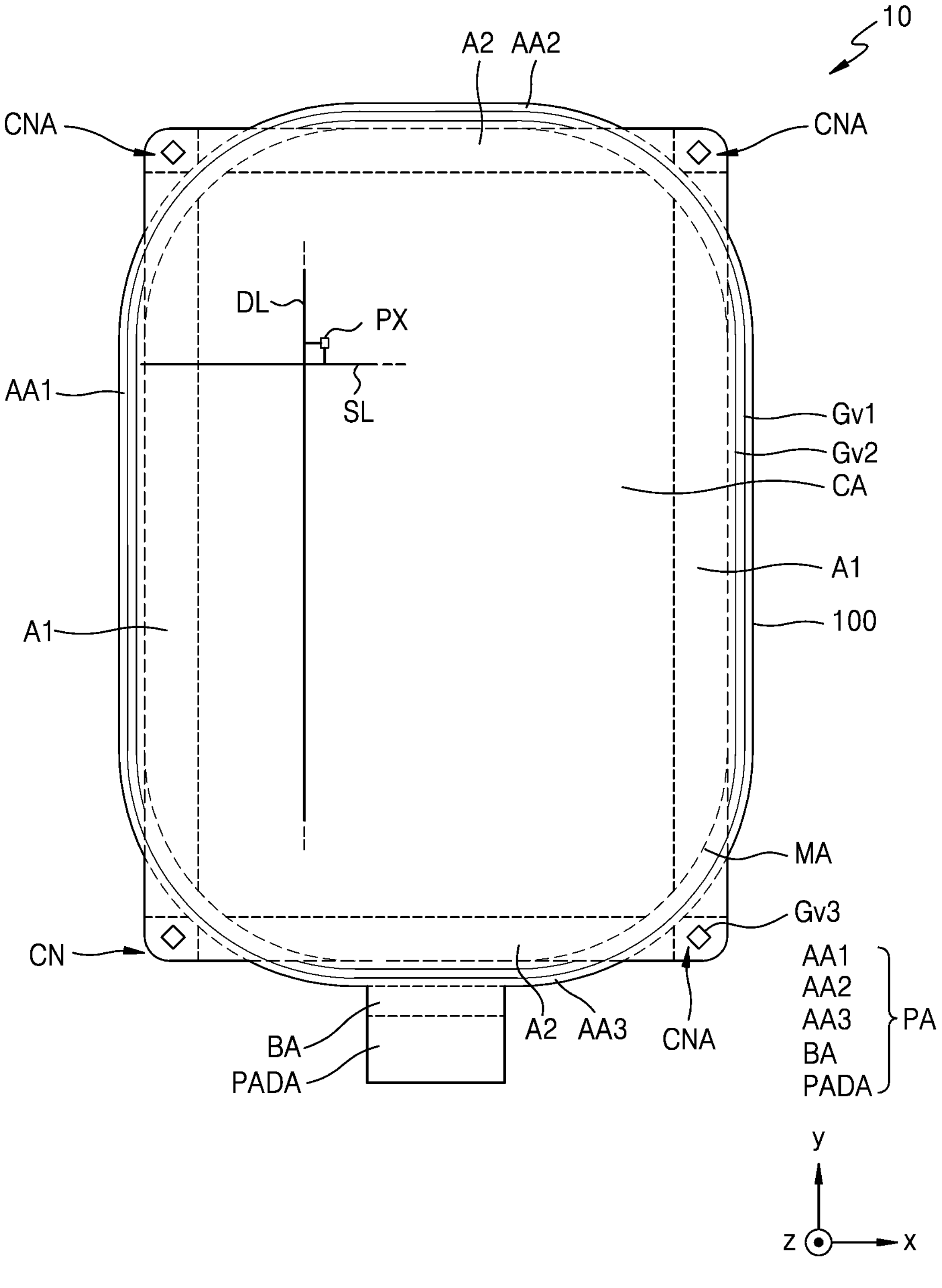

FIGS. 6A and 6B are schematic plan views of an embodiment of a display panel 10. In FIGS. 6A and 6B, the same reference numerals as those in FIG. 3 denote the same members as those in FIG. 3, and repeated descriptions thereof are omitted.

Referring to FIG. 6A, the display panel 10 may display an image. The display panel 10 may include a substrate 100, a pixel PX, and a driving circuit DC (refer to FIG. 3). The substrate 100 may include a central area CA, a first area A1, a second area A2, a corner area CNA, an intermediate area MA, and a peripheral area PA. The central area CA may be a flat area.

In an embodiment, a first groove Gv1 and a second groove Gv2, which are concave in a thickness direction of the substrate 100 may be defined in the display panel 10, on the substrate 100.

In an embodiment, at least a portion of the first groove Gv1 may surround the central area CA. In an embodiment, the first groove Gv1 may be unitary to surround an entirety of the central area CA, for example. That is, at least a portion of the first groove Gv1 may be defined along the circumference of the central area CA and may have a closed curve shape. The first groove Gv1 may surround the second groove Gv2 to be described below. In an alternative embodiment, the first groove Gv1 may be defined along the circumference of an extension area EA and may have a closed curve shape.

The first groove Gv1 may be defined along an edge of the display panel 10. In an embodiment, the first groove Gv1 may be defined along the circumference of the edge of the display panel 10, for example. The first groove Gv1 may be defined in the substrate 100 along an edge of the substrate 100. In an embodiment, the first groove Gv1 may be defined in the substrate 100 along the circumference of the edge of the substrate 100, for example.

The first groove Gv1 may be defined in the corner area CNA and the peripheral area PA. Specifically, the first groove Gv1 may be defined in the corner area CNA, a first adjacent area AA1, a second adjacent area AA2, and a third adjacent area AA3. However, the disclosure is not limited thereto.

Also, although not shown in the drawings, a first dam portion DP1 (refer to FIG. 8A) and a second dam portion DP2 (refer to FIG. 8A) may be disposed around the first groove Gv1. This will be described in more detail with reference to FIG. 8A.

In an embodiment, the second groove Gv2 may surround the central area CA. In an embodiment, the second groove Gv2 may be unitary to surround an entirety of the central area CA, for example. That is, the second groove Gv2 may be defined along the circumference of the central area CA and may have a closed curve shape. The second groove Gv2 may be defined in the intermediate area MA and the peripheral area PA. Specifically, the second groove Gv2 may be defined in the intermediate area MA, the first adjacent area AA1, the second adjacent area AA2, and the third adjacent area AA3. However, the disclosure is not limited thereto. In an embodiment, the second groove Gv2 may be defined in the intermediate area MA, the first area A1, and the second area A2, for example.

Referring to FIG. 6B, a first groove Gv1, a second groove Gv2, and a third groove Gv3 may be defined in the display panel 10, on a substrate 100.

In an embodiment, the first groove Gv1 may surround a central area CA. In an embodiment, the first groove Gv1 may be unitary to surround an entirety of the central area CA. That is, the first groove Gv1 may be defined along the circumference of the central area CA and may have a closed curve shape, for example. The first groove Gv1 may be defined in an intermediate area MA and a peripheral area PA. Specifically, the first groove Gv1 may be defined in the intermediate area MA, a first adjacent area AA1, a second adjacent area AA2, and a third adjacent area AA3. However, the disclosure is not limited thereto. In an embodiment, at least a portion of the first groove Gv1 may be defined in a corner area CNA, for example.

In an embodiment, the second groove Gv2 may be defined only in the peripheral area PA. Specifically, the second groove Gv2 may be defined in the first adjacent area AA1 and the second adjacent area AA2, but may not be disposed in the intermediate area MA.

In an embodiment, the third groove Gv3 may be defined only in the corner area CNA. Specifically, the third groove Gv3 may be defined in an extension area EA of the corner area CNA, but may not be disposed in the peripheral area PA.

Figure 7:
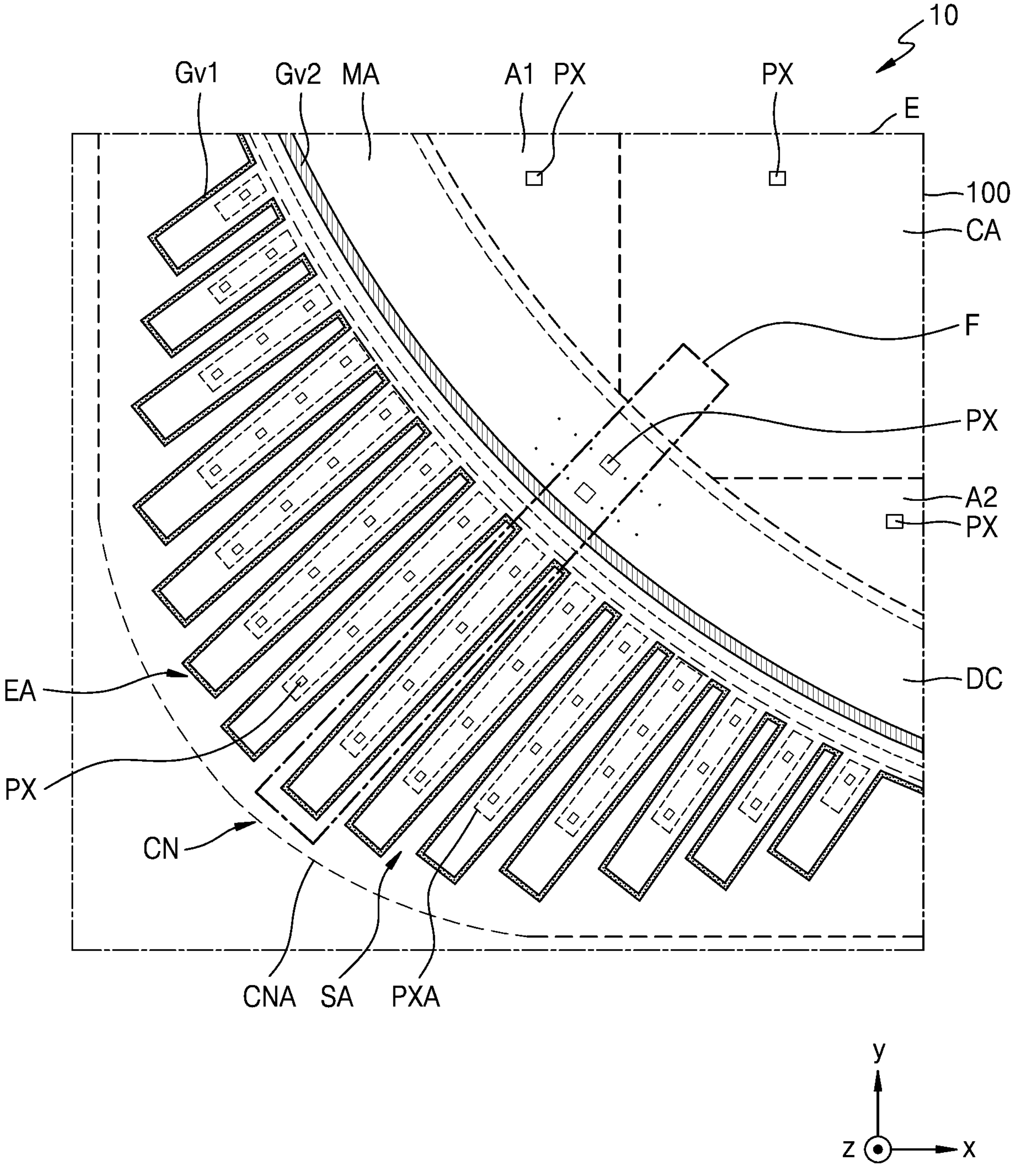
FIG. 7 is an enlarged view of a region E of the display panel of FIG. 6A.

FIG. 7 is an enlarged view of a region E of the display panel 10 of FIG. 6A.

Referring to FIG. 7, the display panel 10 may include a substrate 100, a pixel PX, a first groove Gv1, a second groove Gv2, and a driving circuit DC. The substrate 100 may include a central area CA, a first area A1, a second area A2, a corner area CNA, and an intermediate area MA.

The corner area CNA may include an extension area EA. The extension area EA may extend in a direction away from the central area CA. In an embodiment, a plurality of extension areas EA may be provided. The plurality of extension areas EA may each extend in a direction away from the central area CA. In an embodiment, the plurality of extension areas EA may extend in a direction crossing a first direction (e.g., an x direction or a −x direction) and a second direction (e.g., a y direction or a −y direction).

A separation area SA may be defined between extension areas EA adjacent to each other. The separation area SA may be an area in which components of the display panel 10 are not disposed. When the corner area CNA is bent at a corner CN, a compressive strain occurring in the corner area CNA may be greater than a tensile strain occurring in the corner area CNA. Because the separation area SA is defined between extension areas EA adjacent to each other, the corner area CNA may be contracted. Accordingly, the display panel 10 may be bent without being damaged in the corner area CNA.

In an embodiment, the intermediate area MA may be between the central area CA and the corner area CNA. The intermediate area MA may at least partially surround the central area CA, the first area A1, and the second area A2.

A plurality of pixels PX may be disposed in the central area CA, the first area A1, the second area A2, the corner area CNA, and the intermediate area MA. In an embodiment, each of the plurality of extension areas EA may include a pixel area PXA, and pixels PX may be disposed in the pixel area PXA. The plurality of pixels PX may be arranged in an extension direction of the plurality of extension areas EA. Each of the plurality of pixels PX may include a display element.

The first groove Gv1 may be defined in the corner area CNA. The first groove Gv1 may be defined in the extension area EA of the corner area CNA. The first groove Gv1 may be defined in the extension area EA along an edge of the extension area EA. The first groove Gv1 may be defined along the circumference of the edge of the extension area EA.

The second groove Gv2 may be defined in the intermediate area MA. The second groove Gv2 may be defined in the intermediate area MA adjacent to the corner area CNA. The second groove Gv2 may extend in an extension direction of the intermediate area MA. The second groove Gv2 may be defined between a pixel PX disposed in the intermediate area MA and a pixel PX disposed in the corner area CNA.

The driving circuit DC may be disposed in the intermediate area MA. A plurality of driving circuits DC may be provided. The plurality of driving circuits DC may be arranged along the extension direction of the intermediate area MA. The plurality of driving circuits DC may be arranged to at least partially surround the central area CA, the first area A1, and the second area A2. In an embodiment, the driving circuit DC may supply a scan signal to a scan line. In an alternative embodiment, the driving circuit DC may supply a previous scan signal to a previous scan line. The driving circuit DC may supply an emission control signal to an emission control line.

A plurality of pixels PX may be disposed in the intermediate area MA. In an embodiment, the driving circuit DC may overlap the pixels PX. Accordingly, even when the driving circuit DC is disposed in the intermediate area MA, the display panel 10 may display an image in the intermediate area MA.

Figure 8A:
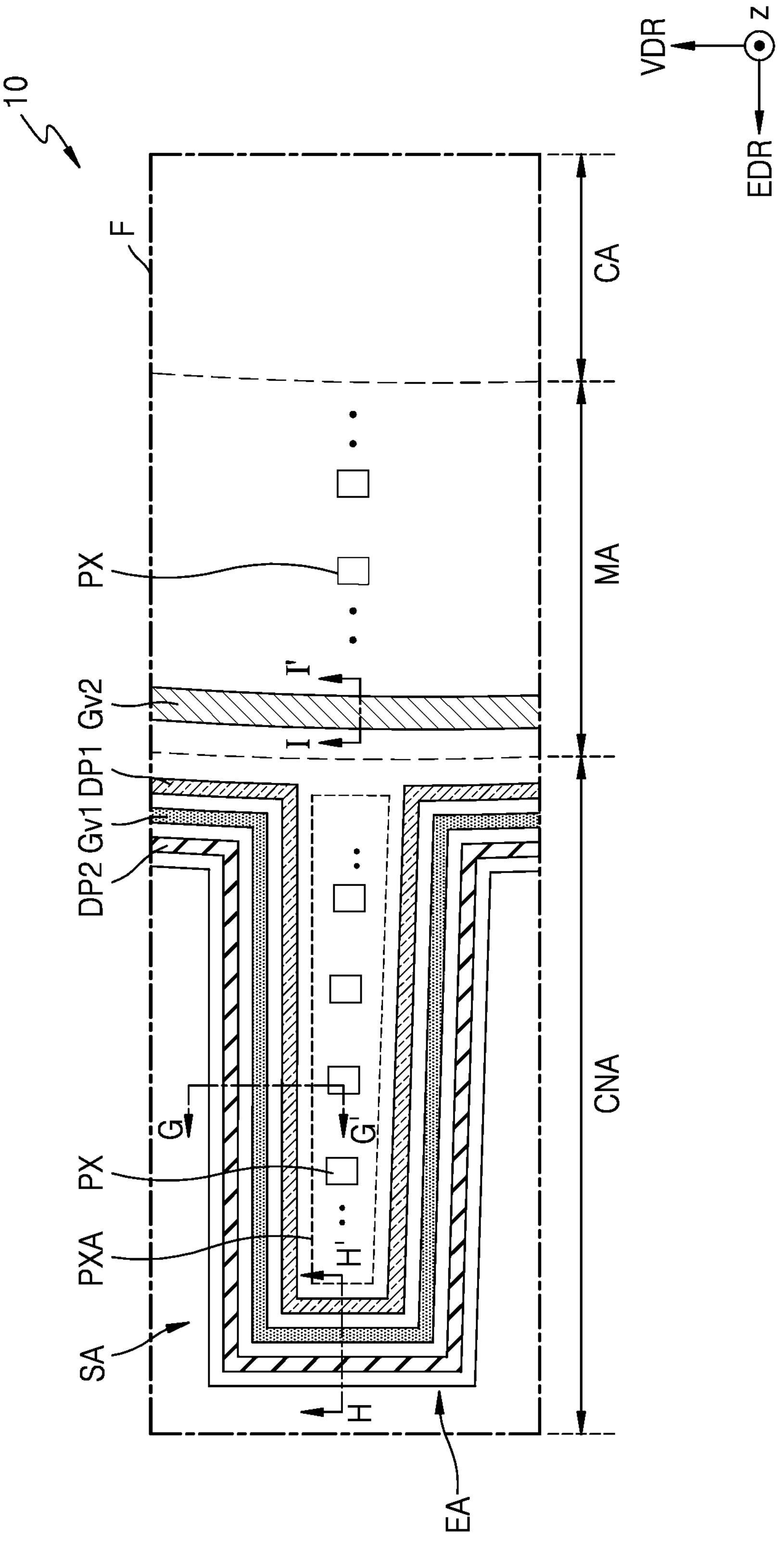
FIGS. 8A and 8B are enlarged views of an embodiment of a region F of the display panel of FIG. 7.
Figure 8B:
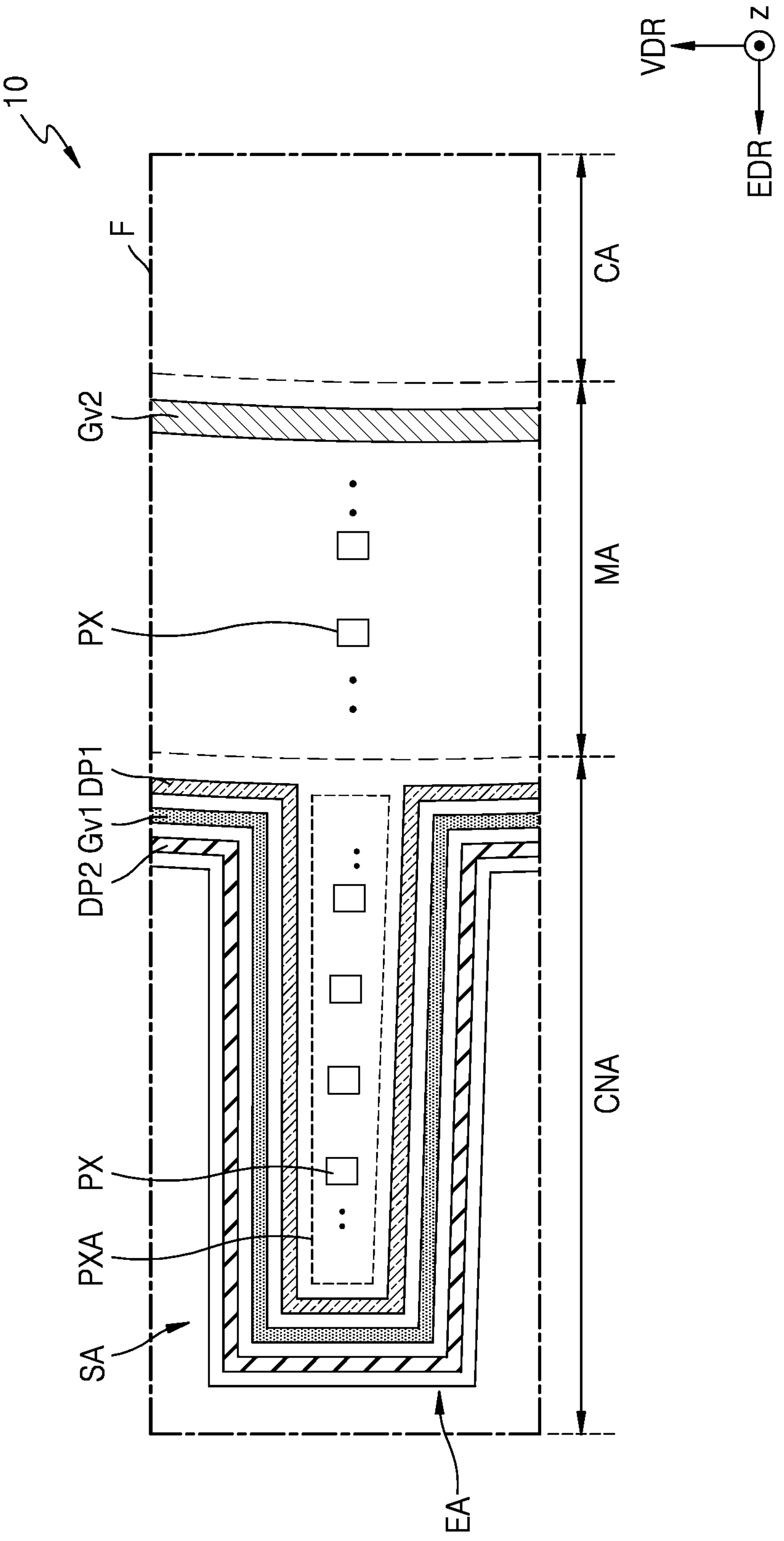

FIGS. 8A and 8B are enlarged views of a region F of the display panel 10 of FIG. 7.

Referring to FIG. 8A, the display panel 10 may include a substrate 100, a first groove Gv1, and a second groove Gv2. Also, the display panel 10 may further include a first dam portion DP1 and a second dam portion DP2. In this case, the first groove Gv1 and the second groove Gv2 may be concave in a thickness direction of the substrate 100, and the first dam portion DP1 and the second dam portion DP2 may protrude in the thickness direction of the substrate 100.

The substrate 100 may include a central area CA, a corner area CNA, and an intermediate area MA. The corner area CNA may include an extension area EA. In an embodiment, a plurality of corner areas CNA may be provided, and a separation area SA may be defined between extension areas EA adjacent to each other. The extension area EA may extend in an extension direction EDR. In an embodiment, the extension direction EDR may be a direction crossing a first direction and/or a second direction. The extension area EA may include a pixel area PXA. The intermediate area MA may be between the central area CA and the corner area CNA.

As described above with reference to FIG. 6A, the first groove Gv1 may surround the second groove Gv2. In an embodiment, the first groove Gv1 may be unitary to surround an entirety of the second groove Gv2, for example. Because the second groove Gv2 surrounds the central area CA, it may be understood that the first groove Gv1 also surrounds the central area CA.

The first groove Gv1 may be defined along an edge of the display panel 10. In an embodiment, the first groove Gv1 may be defined along the circumference of the edge of the display panel 10, for example. The first groove Gv1 may be defined in the substrate 100 along an edge of the substrate 100. In an embodiment, the first groove Gv1 may be defined in the substrate 100 along the circumference of the edge of the substrate 100, for example.

The first groove Gv1 may be defined in the corner area CNA and the peripheral area PA (refer to FIG. 6A). Specifically, the first groove Gv1 may be defined in the corner area CNA, a first adjacent area AA1 (refer to FIG. 6A), a second adjacent area AA2 (refer to FIG. 6A), and a third adjacent area AA3 (refer to FIG. 6A). The second groove Gv2 may be defined in the extension area EA of the corner area CNA. The second groove Gv2 may be defined in the corner area CNA along an edge of the corner area CNA. In an embodiment, the second groove Gv2 may extend along an edge of the extension area EA, for example.

In an embodiment, the first dam portion DP1 and the second dam portion DP2 may be disposed around the first groove Gv1. Although not shown in the drawings, each of the first dam portion DP1 and the second dam portion DP2 may surround the central area CA. In an embodiment, each of the first dam portion DP1 and the second dam portion DP2 may be unitary to surround an entirety of the central area CA, for example. That is, each of the first dam portion DP1 and the second dam portion DP2 may be disposed along the circumference of the central area CA and may have a closed curve shape.

Each of the first dam portion DP1 and the second dam portion DP2 may be disposed along an edge of the display panel 10. In an embodiment, each of the first dam portion DP1 and the second dam portion DP2 may be disposed along the circumference of the edge of the display panel 10, for example. Each of the first dam portion DP1 and the second dam portion DP2 may be disposed on the substrate 100 along an edge of the substrate 100. In an embodiment, each of the first dam portion DP1 and the second dam portion DP2 may be disposed on the substrate 100 along the circumference of the edge of the substrate 100, for example.

The first dam portion DP1 and the second dam portion DP2 may be disposed in the corner area CNA. That is, the first dam portion DP1 and the second dam portion DP2 may be disposed in the corner area CNA and the peripheral area PA. Specifically, the first dam portion DP1 and the second dam portion DP2 may be disposed in the corner area CNA, the first adjacent area AA1, the second adjacent area AA2, and the third adjacent area AA3. However, the disclosure is not limited thereto.

As described above with reference to FIG. 6A, the second groove Gv2 may surround the central area CA. In an embodiment, the second groove Gv2 may be unitary to surround an entirety of the central area CA, for example. That is, the second groove Gv2 may be defined along the circumference of the central area CA and may have a closed curve shape. The second groove Gv2 may be defined in the intermediate area MA and the peripheral area PA (refer to FIG. 6A). Specifically, the first groove Gv1 may be defined in the intermediate area MA, the first adjacent area AA1, the second adjacent area AA2, and the third adjacent area AA3. However, the disclosure is not limited thereto.

In an embodiment, the second groove Gv2 may extend in an extension direction of the intermediate area MA. The second groove Gv2 may be defined adjacent to the corner area CNA and may extend along an edge of the intermediate area MA. The second groove Gv2 may be in the intermediate area MA and between the corner area CNA and a pixel PX closest to the corner area CNA. That is, the second groove Gv2 may be in the intermediate area MA adjacent to the corner area CNA. However, the disclosure is not limited thereto. Referring to FIG. 8B, the second groove Gv2 may be in the intermediate area MA and between the central area CA and a pixel PX closest to the central area CA. That is, the second groove Gv2 may in the intermediate area MA adjacent to the central area CA.

Figure 9A:
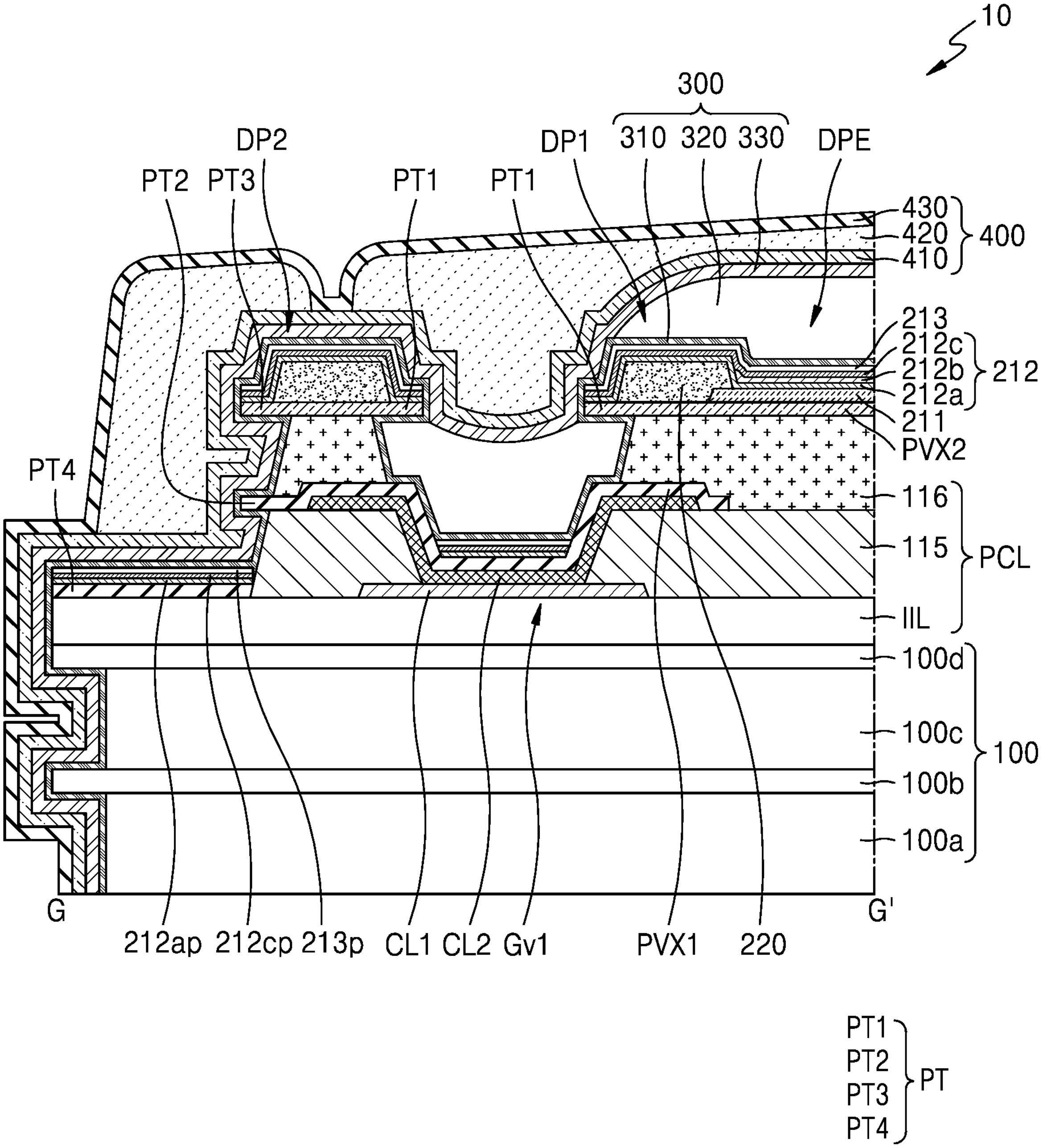
FIGS. 9A to 9C are schematic cross-sectional views of an embodiment of a display panel.
Figure 9B:
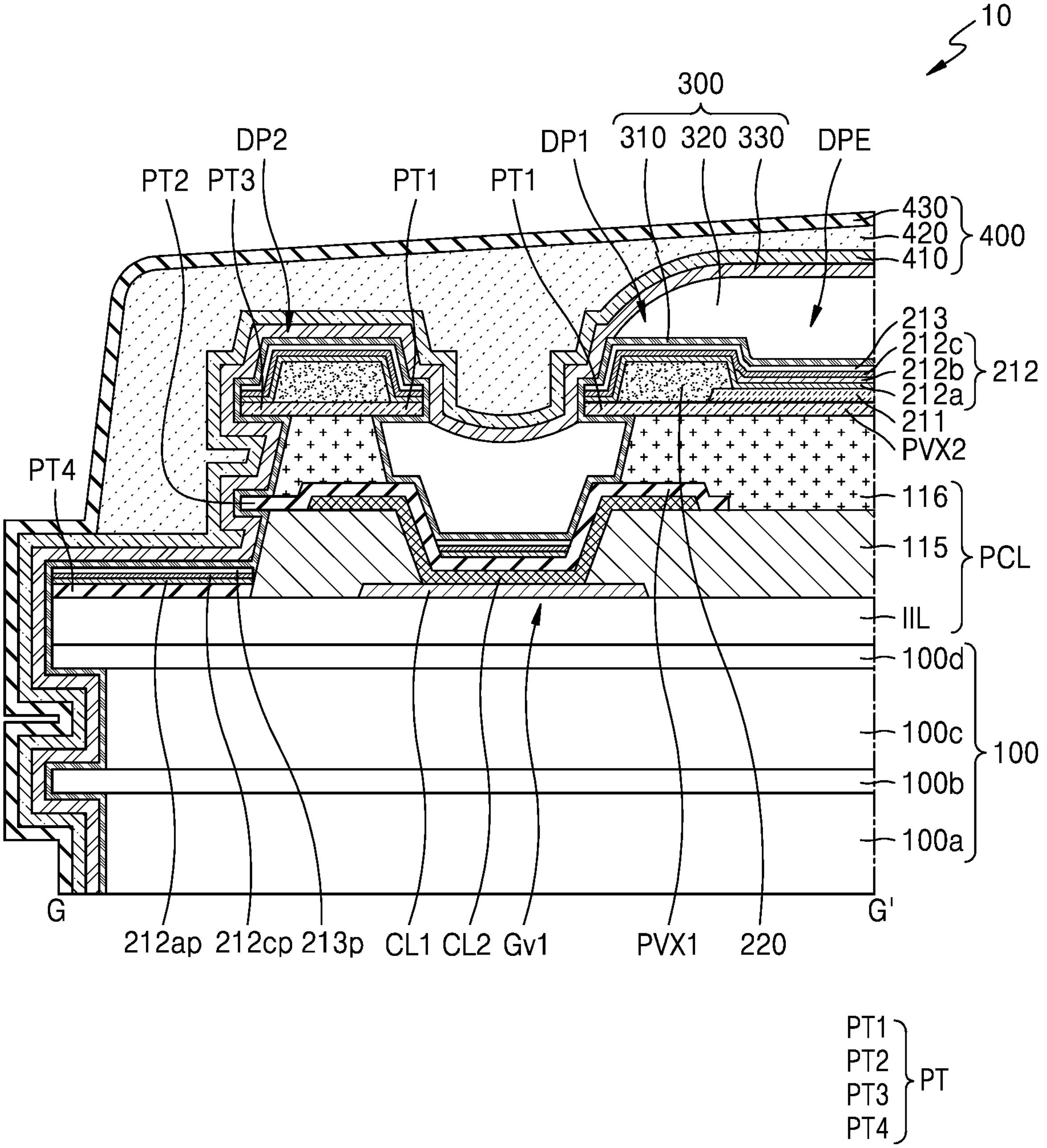
Figure 9C:
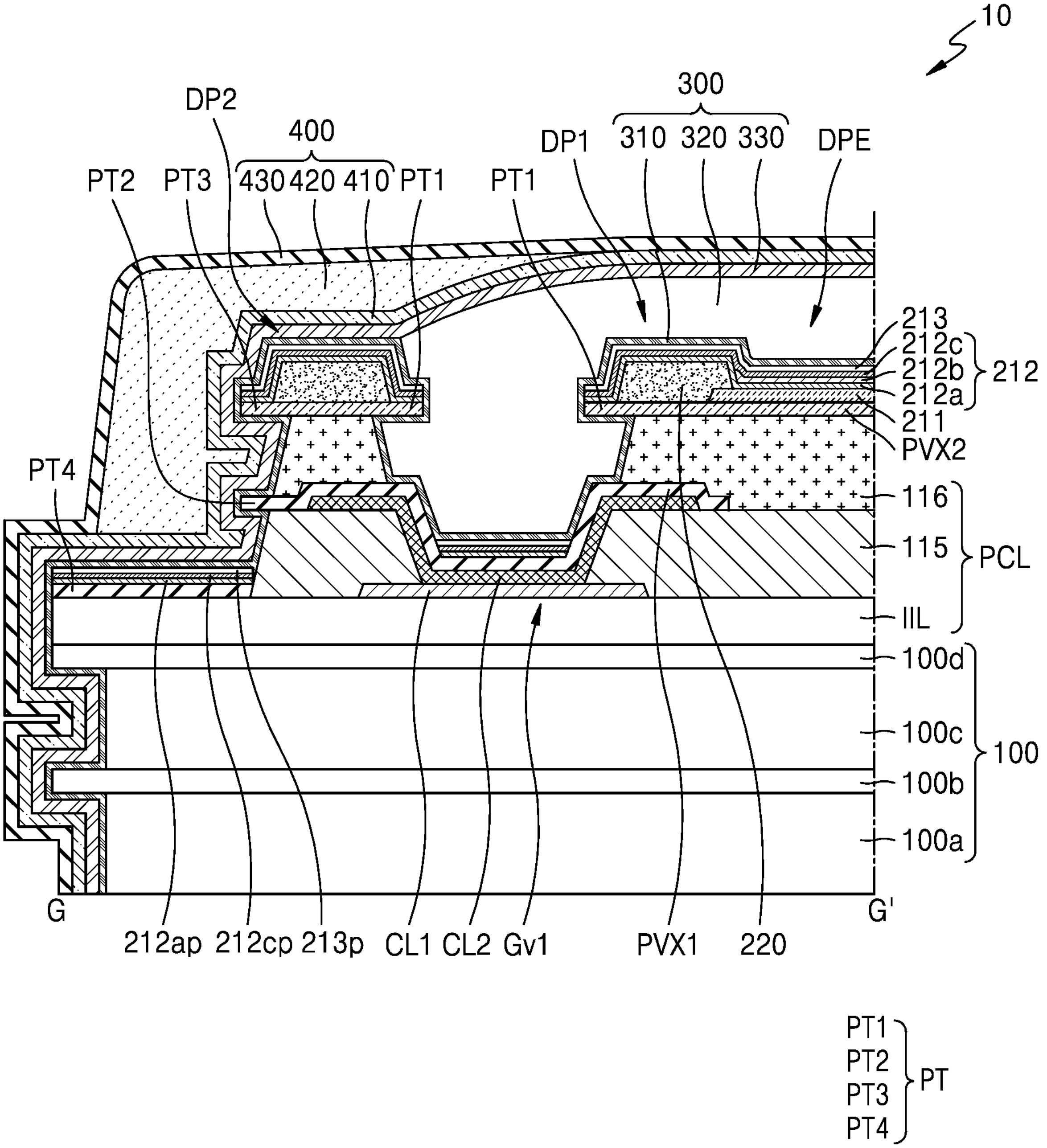

FIGS. 9A to 9C are schematic cross-sectional views of an embodiment of a display panel 10. Specifically, FIGS. 9A to 9C are cross-sectional views of the display panel 10 taken along line G-G' in FIG. 8A. In FIGS. 9A to 9B, the same reference numerals as those in FIG. 5 denote the same members as those in FIG. 5, and repeated descriptions thereof are omitted.

Referring to FIG. 9A, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

The substrate 100 may include a first base layer **100*a*, a first barrier layer 100*b*, a second base layer 100*c*, and a second barrier layer 100*d*. The inorganic insulating layer IIL may be disposed on the substrate 100. As described above with reference to FIG. 5, the inorganic insulating layer IIL may include a buffer layer 111 (refer to FIG. 5), a first gate insulating layer 112 (refer to FIG. 5), a second gate insulating layer 113 (refer to FIG. 5), and an inter-insulating layer 114 (refer to FIG. 5**). However, the aforementioned layers included in the inorganic insulating layer IIL are omitted for convenience of description and illustration.

The first organic insulating layer 115 and the second organic insulating layer 116 may be disposed on the inorganic insulating layer K. A display element DPE may be disposed on the second organic insulating layer 116. The display element DPE may include a pixel electrode 211, an intermediate layer 212, and an opposite electrode 213.

The pixel electrode 211 may be disposed on the second organic insulating layer 116. The pixel-defining layer 220 in which an opening exposing at least a portion of the pixel electrode 211 is defined may be disposed on the pixel electrode 211.

The intermediate layer 212 may be disposed on the pixel-defining layer 220. The intermediate layer 212 may include an emission layer **212*b* disposed in an opening defined in the pixel-defining layer 220, a first functional layer 212*a* disposed between the pixel electrode 211 and the emission layer 212*b*, and a second functional layer 212*c* disposed between the emission layer 212*b* and the opposite electrode 213. The first functional layer 212*a* and the second functional layer 212*c* may also be disposed on the pixel-defining layer 220. The opposite electrode 213 may be disposed on the intermediate layer 212**.

In an embodiment, a first groove Gv1, which is concave in a thickness direction of the substrate 100, may be defined in the display panel 10, on the substrate 100. Also, the display panel 10 may include a first dam portion DP1 and a second dam portion DP2, which protrude in the thickness direction of the substrate 100, on the substrate 100. The first groove Gv1 may be defined between the first dam portion DP1 and the second dam portion DP2.

The first groove Gv1, the first dam portion DP1, and the second dam portion DP2 may each be disposed on the corner area CNA (refer to FIG. 8A). In addition, as described above with reference to FIG. 6A, the first groove Gv1, the first dam portion DP1, and the second dam portion DP2 may each be disposed in the corner area CNA and the peripheral area PA (refer to FIG. 6A). Specifically, the first groove Gv1, the first dam portion DP1, and the second dam portion DP2 may each be defined or disposed in the corner area CNA, the first adjacent area AA1 (refer to FIG. 6A), the second adjacent area AA2 (refer to FIG. 6A), and the third adjacent area AA3 (refer to FIG. 6A). However, the disclosure is not limited thereto.

Also, as described above, the first groove Gv1, the first dam portion DP1, and the second dam portion DP2 may each be defined or disposed along the edge of the display panel 10. In an embodiment, the first groove Gv1, the first dam portion DP1, and the second dam portion DP2 may each be defined or disposed along the circumference of the edge of the display panel 10. The first groove Gv1, the first dam portion DP1, and the second dam portion DP2 may each be disposed on the substrate 100 along an edge of the substrate 100. In an embodiment, the first groove Gv1, the first dam portion DP1, and the second dam portion DP2 may each be disposed on the substrate 100 along the circumference of the edge of the substrate 100.

In an embodiment, the first groove Gv1 may be defined in the first organic insulating layer 115. In an embodiment, the first groove Gv1 may be a recess defined by separating the first organic insulating layer 115, for example. In an alternative embodiment, the first groove Gv1 may be a recess defined by removing a portion of the first organic insulating layer 115, for example. That is, the first groove Gv1 may be defined by removing a portion of the first organic insulating layer 115. However, the disclosure is not limited thereto. The first groove Gv1 may be defined in the first organic insulating layer 115 and the second organic insulating layer 116. The first groove Gv1 may be defined in the first organic insulating layer 115, the second organic insulating layer 116, and the pixel-defining layer 220. A lower layer of the first groove Gv1 may include the first organic insulating layer 115, may include the first organic insulating layer 115 and the second organic insulating layer 116, or may include the first organic insulating layer 115, the second organic insulating layer 116, and the pixel-defining layer 220.

In an embodiment, the first dam portion DP1 may include the first organic insulating layer 115, the second organic insulating layer 116, and the pixel-defining layer 220. In other words, the first dam portion DP1 may be defined (or formed) by the first organic insulating layer 115, the second organic insulating layer 116, and the pixel-defining layer 220.

In an embodiment, the second dam portion DP2 may include the first organic insulating layer 115, the second organic insulating layer 116, and the pixel-defining layer 220. In other words, the second dam portion DP2 may be defined (or formed) by the first organic insulating layer 115, the second organic insulating layer 116, and the pixel-defining layer 220.

In an embodiment, the display panel 10 may include a first connection line CL1 and a second connection line CL2. Each of the first connection line CL1 and the second connection line CL2 may be a signal line for providing an electrical signal to a pixel PX (refer to FIG. 8A) disposed in the corner area CNA, or a power supply line for providing power to the pixel PX.

In an embodiment, the first connection line CL1 may be disposed on the inorganic insulating layer IL. The first connection line CL1 may include the same material as that of the first source electrode SE1 (refer to FIG. 5) and the first drain electrode DE1 (refer to FIG. 5) and be disposed in the same layer as the first source electrode SE1 (refer to FIG. 5) and the first drain electrode DE1 (refer to FIG. 5), described above with reference to FIG. 5.

In an embodiment, the first organic insulating layer 115 may be disposed on the first connection line CL1. The first organic insulating layer 115 may expose at least a portion of the first connection line CL1. Because the first groove Gv1 is defined by the first organic insulating layer 115, at least a portion of the first connection line CL1 may be exposed through the first groove Gv1.

In an embodiment, the second connection line CL2 may be disposed on the first organic insulating layer 115. The second connection line CL2 may overlap the first groove Gv1. In an embodiment, the second connection line CL2 may be disposed in the first groove Gv1, for example. The second connection line CL2 may be directly disposed on the first connection line CL1. In this case, the same signal may be applied to the first connection line CL1 and the second connection line CL2. The second connection line CL2 may include the same material as that of the connection electrode CML (refer to FIG. 5) and be disposed in the same layer as the connection electrode CML (refer to FIG. 5) described above with reference to FIG. 5.

In an embodiment, at least a portion of the first connection line CL1 may be disposed under the first dam portion DP1 and the second dam portion DP2. At least a portion of the second connection line CL2 may be disposed between the first organic insulating layer 115 and the second organic insulating layer 116 of the first dam portion DP1. Also, at least a portion of the second connection line CL2 may be disposed between the first organic insulating layer 115 and the second organic insulating layer 116 of the second dam portion DP2.

In an embodiment, a first inorganic pattern layer PVX1 may be disposed on the second connection line CL2. The first inorganic pattern layer PVX1 may cover the second connection line CL2. A plurality of first inorganic pattern layers PVX1 may be provided to be respectively disposed on the second connection line CL2 and the inorganic insulating layer K. At least a portion of the first inorganic pattern layer PVX1 may be disposed between the first organic insulating layer 115 and the second organic insulating layer 116 of the first dam portion DP1. Also, at least a portion of the first inorganic pattern layer PVX1 may be disposed between the first organic insulating layer 115 and the second organic insulating layer 116 of the second dam portion DP2. The first inorganic pattern layer PVX1 may include $SiO_2$, $SiN_x$, SiON, $Al_2O_3$, $TiO_2$, $Ta_2O_5$, $HfO_2$, $ZnO_x$, or the like.

In an embodiment, the first inorganic pattern layer PVX1 may overlap the first groove Gv1. In an embodiment, the first inorganic pattern layer PVX1 may be disposed in the first groove Gv1, for example. The first groove Gv1 may be at least partially clad with the first inorganic pattern layer PVX1. In an embodiment, the first inorganic pattern layer PVX1 may cover the first groove Gv1 so that the first groove Gv1 is not exposed, for example.

In an embodiment, a second inorganic pattern layer PVX2 may be disposed on the second organic insulating layer 116. At least a portion of the second inorganic pattern layer PVX2 may be disposed between the first organic insulating layer 115 and the second organic insulating layer 116 of the first dam portion DP1. Also, at least a portion of the second inorganic pattern layer PVX2 may be disposed between the first organic insulating layer 115 and the second organic insulating layer 116 of the second dam portion DP2. The second inorganic pattern layer PVX2 may include $SiO_2$, $SiN_x$, SiON, $Al_2O_3$, $TiO_2$, $Ta_2O_5$, $HfO_2$, $ZnO_x$, or the like.

In an embodiment, the display panel 10 may include a protruding tip PT. The first inorganic pattern layer PVX1 and/or the second inorganic pattern layer PVX2 may include a protruding tip PT in which at least a portion thereof protrudes. The protruding tip PT may include a first protruding tip PT1, a second protruding tip PT2, a third protruding tip PT3, and a fourth protruding tip PT4.

In an embodiment, the second inorganic pattern layer PVX2 may include the first protruding tip PT1 protruding toward the center of the first groove Gv1. Specifically, the second inorganic pattern layer PVX2 may include a pair of first protruding tips PT1 protruding toward the center of the first groove Gv1. The first functional layer 212*a*, the second functional layer 212*c*, and the opposite electrode 213 may be disconnected (or separated) by the first groove Gv1 and the pair of first protruding tips PT1. In addition, a first functional layer pattern 212*ap*, a second functional layer pattern 212*cp*, and an opposite electrode pattern 213*p* may be disposed in the first groove Gv1.

In an embodiment, the first inorganic pattern layer PVX1 may include the second protruding tip PT2 and the fourth protruding tip PT4, which protrude toward an edge of the substrate 100. In other words, the first inorganic pattern layer PVX1 may include the second protruding tip PT2 and the fourth protruding tip PT4, which protrude in a direction opposite to a center direction of the first groove Gv1. The first functional layer 212*a*, the second functional layer 212*c*, and the opposite electrode 213 may be disconnected (or separated) by the second protruding tip PT2 and/or the fourth protruding tip PT4.

In an embodiment, the second inorganic pattern layer PVX2 may include the third protruding tip PT3 protruding toward the edge of the substrate 100. In other words, the second inorganic pattern layer PVX2 may include the third protruding tip PT3 protruding in a direction opposite to the center direction of the first groove Gv1. The first functional layer 212*a*, the second functional layer 212*c*, and the opposite electrode 213 may be disconnected (or separated) by the third protruding tip PT3.

In an embodiment, the second protruding tip PT2 provided in the first inorganic pattern layer PVX1 and the third protruding tip PT3 defined in the second inorganic pattern layer PVX2 may at least partially overlap each other in a thickness direction of the substrate 100. That is, in a direction perpendicular to a direction in which the second protruding tip PT2 and/or the third protruding tip PT3 protrude, the second protruding tip PT2 and the third protruding tip PT3 may at least partially overlap each other.

The encapsulation layer 300 may be disposed on the opposite electrode 213. The encapsulation layer 300 may cover an entirety of components disposed on the substrate 100. The encapsulation layer 300 may include a first inorganic encapsulation layer 310, an organic encapsulation layer 320, and a second inorganic encapsulation layer 330.

In an embodiment, the first inorganic encapsulation layer 310 may continuously cover an entirety of the components disposed on the substrate 100. In an embodiment, the first inorganic encapsulation layer 310 may be continuously disposed on an entirety of the central area CA (refer to FIG. 6A), the intermediate area MA (refer to FIG. 6A), and the corner area CNA (refer to FIG. 6A), for example. The first inorganic encapsulation layer 310 may be continuously disposed in an entirety of the first groove Gv1, the first dam portion DP1, and the second dam portion DP2. Also, the first inorganic encapsulation layer 310 may cover the first functional layer pattern 212*ap*, the second functional layer pattern 212*cp*, and the opposite electrode pattern 213*p*, disposed in the first groove Gv1. Also, the first inorganic encapsulation layer 310 may contact the first inorganic pattern layer PVX1 and/or the second inorganic pattern layer PVX2. Specifically, the first inorganic encapsulation layer 310 may contact the protruding tip PT of the first inorganic pattern layer PVX1 and/or the second inorganic pattern layer PVX2.

In an embodiment, the organic encapsulation layer 320 may be disposed on the first inorganic encapsulation layer 310. The organic encapsulation layer 320 may continuously cover an entirety of the components disposed on the substrate 100. In an embodiment, the organic encapsulation layer 320 may be continuously disposed on an entirety of the central area CA, the intermediate area MA, and the corner area CNA. However, the organic encapsulation layer 320 may be separated by the first dam portion DP1. In an embodiment, the organic encapsulation layer 320 may be disposed in the central area CA, the intermediate area MA, and the corner area CNA, and may be separated by the first dam portion DP1. Accordingly, the organic encapsulation layer 320 may not overlap the second dam portion DP2. Also, the organic encapsulation layer 320 may fill the first groove Gv1. A monomer (e.g., an organic material) forming the organic encapsulation layer 320 may be controlled by the first dam portion DP1 and the second dam portion DP2.

In an embodiment, the second inorganic encapsulation layer 330 may continuously cover an entirety of the components disposed on the substrate 100. In an embodiment, the second inorganic encapsulation layer 330 may be continuously disposed on an entirety of the central area CA, the intermediate area MA, and the corner area CNA. The second inorganic encapsulation layer 330 may be continuously disposed on an entirety of the organic encapsulation layer 320.

The protective layer 400 may be disposed on the encapsulation layer 300. The protective layer 400 may cover an entirety of the components disposed on the substrate 100. The protective layer 400 may include a first inorganic protective layer 410, an organic protective layer 420, and a second inorganic protective layer 430.

In an embodiment, the first inorganic protective layer 410 may continuously cover an entirety of the components disposed on the substrate 100. In an embodiment, the first inorganic protective layer 410 may be continuously disposed on an entirety of the central area CA, the intermediate area MA, and the corner area CNA, for example.

In an embodiment, the organic protective layer 420 may be disposed on the first inorganic protective layer 410. The organic protective layer 420 may continuously cover an entirety of the components disposed on the substrate 100. In an embodiment, the organic protective layer 420 may be continuously disposed on an entirety of the central area CA, the intermediate area MA, and the corner area CNA, for example. However, the organic protective layer 420 may be separated on the upper surface of the second dam portion DP2. In an embodiment, the organic protective layer 420 may not be unitary, but may be provided separately as two organic protective layers 420 on the upper surface of the second dam portion DP2, for example. When the organic protective layer 420 is unitary, even when a portion of the organic protective layer 420 is contaminated, the remaining portion of the organic protective layer 420 may also be contaminated. Accordingly, because the organic protective layer 420 is provided separately, contamination of the entire organic protective layer 420 may be prevented or reduced.

In an embodiment, the organic protective layer 420 may overlap the first groove Gv1. In an alternative embodiment, it may be understood that the organic protective layer 420 fills the first groove Gv1, for example.

In an embodiment, the second inorganic protective layer 430 may continuously cover an entirety of the components disposed on the substrate 100. In an embodiment, the second inorganic protective layer 430 may be continuously disposed on an entirety of the central area CA, the intermediate area MA, and the corner area CNA, for example. The second inorganic protective layer 430 may be continuously disposed on an entirety of the organic protective layer 420.

Referring to FIG. 9B, the organic protective layer 420 may be disposed on the first inorganic protective layer 410. The organic protective layer 420 may continuously cover an entirety of the components disposed on the substrate 100. The organic protective layer 420 may be unitary on the upper surface of the second dam portion DP2 without being separated.

Referring to FIG. 9C, in an embodiment, the organic encapsulation layer 320 may be disposed on the first inorganic encapsulation layer 310. The organic encapsulation layer 320 may continuously cover an entirety of the components disposed on the substrate 100. The organic encapsulation layer 320 may be unitary without being separated by the first dam portion DP1. The organic encapsulation layer 320 may be continuously disposed in an entirety of the first groove Gv1, the first dam portion DP1, and the second dam portion DP2. That is, a monomer (e.g., an organic material) forming the organic encapsulation layer 320 may be controlled by the first dam portion DP1 and the second dam portion DP2. The organic encapsulation layer 320 may fill the first groove Gv1. The organic encapsulation layer 320 may not overlap the upper surface of the second dam portion DP2. However, the disclosure is not limited thereto.

In an embodiment, the organic protective layer 420 may be disposed on the first inorganic protective layer 410. The organic protective layer 420 may continuously cover an entirety of the first groove Gv1, the first dam portion DP1, and the second dam portion DP2. The organic protective layer 420 may be disposed only in the corner area CNA. However, the disclosure is not limited thereto.

Although not shown in the drawings, at least a portion of the organic protective layer 420 may be separated on the upper surface of the second dam portion DP2. In an embodiment, the organic protective layer 420 may not be unitary, but may be provided separately as two organic protective layers on the upper surface of the second dam portion DP2.

Figure 10:
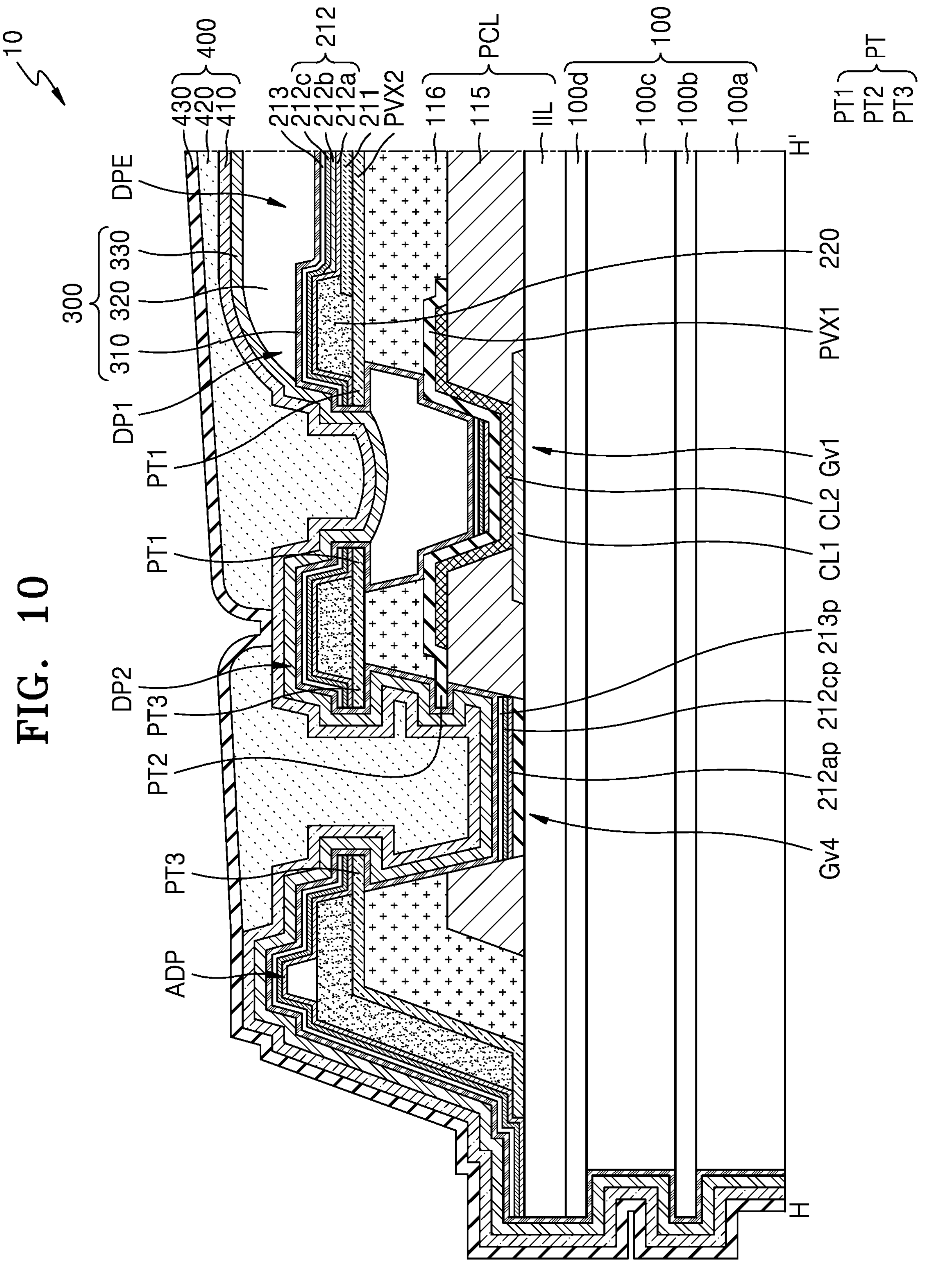
FIG. 10 is a schematic cross-sectional view of an embodiment of a display panel.

FIG. 10 is a schematic cross-sectional view of an embodiment of a display panel 10. FIG. 10 is a cross-sectional view of the display panel 10 taken along line H-H' in FIG. 8A. In FIG. 10, the same reference numerals as those of FIG. 9A denote the same members as those in FIG. 9A, and repeated descriptions thereof are omitted.

Referring to FIG. 10, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

The inorganic insulating layer IIL may be disposed on the substrate 100. The first organic insulating layer 115 and the second organic insulating layer 116 may be disposed on the inorganic insulating layer IIL. The pixel-defining layer 220 may be disposed on the second organic insulating layer 116. An intermediate layer 212 and an opposite electrode 213 may be disposed on the pixel-defining layer 220. Specifically, a first functional layer 212*a*, a second functional layer 212*c*, and the opposite electrode 213 may be disposed on the pixel-defining layer 220.

A pixel electrode 211 may be disposed on the second organic insulating layer 116. The pixel-defining layer 220 in which an opening exposing at least a portion of the pixel electrode 211 is defined may be disposed on the pixel electrode 211.

In an embodiment, a first groove Gv1 and a fourth groove Gv4, which are concave in a thickness direction of the substrate 100 may be defined in the display panel 10, on the substrate 100. In addition, the display panel 10 may further include a first dam portion DP1, a second dam portion DP2, and an auxiliary dam portion ADP, which protrude in the thickness direction of the substrate 100, on the substrate 100. The first groove Gv1 may be defined between the first dam portion DP1 and the second dam portion DP2. The fourth groove Gv4 may be defined between the second dam portion DP2 and the auxiliary dam portion ADP.

In an embodiment, the fourth groove Gv4 and the auxiliary dam portion ADP may be defined or disposed on a corner area CNA (refer to FIG. 8A). Specifically, the fourth groove Gv4 and the auxiliary dam portion ADP may be defined or disposed on an extension area EA (refer to FIG. 8A) of the corner area CNA (refer to FIG. 8A). The fourth groove Gv4 and the auxiliary dam portion ADP may be disposed in a vertical direction VDR (refer to FIG. 8A) crossing an extension direction EDR (refer to FIG. 8A) in which the extension area EA extends. The fourth groove Gv4 and the auxiliary dam portion ADP may be defined or disposed along an edge of the extension area EA, which extends in the vertical direction VDR, from among the edges of the extension area EA. However, the disclosure is not limited thereto. The fourth groove Gv4 and the auxiliary dam portion ADP may be defined or disposed along the edge of the extension area EA.

In an embodiment, the fourth groove Gv4 may be defined in the first organic insulating layer 115. In an embodiment, the fourth groove Gv4 may be a recess defined by separating the first organic insulating layer 115, for example. In an alternative embodiment, the fourth groove Gv4 may be a recess defined by removing a portion of the first organic insulating layer 115. That is, the fourth groove Gv4 may be defined by removing a portion of the first organic insulating layer 115. However, the disclosure is not limited thereto. The fourth groove Gv4 may be defined in the first organic insulating layer 115 and the second organic insulating layer 116. The fourth groove Gv4 may be defined in the first organic insulating layer 115, the second organic insulating layer 116, and the pixel-defining layer 220. A lower layer of the fourth groove Gv4 may include the first organic insulating layer 115, may include the first organic insulating layer 115 and the second organic insulating layer 116, or may include the first organic insulating layer 115, the second organic insulating layer 116, and the pixel-defining layer 220.

In an embodiment, the auxiliary dam portion ADP may include the first organic insulating layer 115, the second organic insulating layer 116, the pixel-defining layer 220, and a spacer 230. In other words, the auxiliary dam portion ADP may be defined (or formed) by the first organic insulating layer 115, the second organic insulating layer 116, the pixel-defining layer 220, and the spacer 230. However, the disclosure is not limited thereto. In an embodiment, the auxiliary dam portion ADP may be omitted, for example.

In an embodiment, the height of the auxiliary dam portion ADP may be greater than the height of the first dam portion DP1 and/or the second dam portion DP2. In this case, the height of the auxiliary dam portion ADP may denote a vertical distance from the lower surface of the first organic insulating layer 115 to the upper surface of the spacer 230 in the thickness direction of the substrate 100, and the height of the first dam portion DP1 and/or the second dam portion DP2 may denote a vertical distance from the lower surface of the first organic insulating layer 115 to the upper surface of the pixel-defining layer 220 in the thickness direction of the substrate 100.

When only the first dam portion DP1 and the second dam portion DP2 are disposed on the corner area CNA of the display panel 10, an imprint defect due to a mask may occur in an upper end of the first dam portion DP1 and/or an upper end of the second dam portion DP2, and as a result, the reliability of inorganic layers stacked on the second dam portion DP2 may be deteriorated.

In an embodiment, because the height of the auxiliary dam portion ADP is greater than the height of the first dam portion DP1 and/or the second dam portion DP2, damage to the first dam portion DP1 and/or the second dam portion DP2 due to the mask may be prevented or reduced, and deterioration of the reliability of an inorganic layer disposed on the first dam portion DP1 and/or the second dam portion DP2 may be prevented or reduced.

In an embodiment, the display panel 10 may include a first connection line CL1 and a second connection line CL2. Each of the first connection line CL1 and the second connection line CL2 may be a signal line for providing an electrical signal to a pixel PX (refer to FIG. 8A) disposed in the corner area CNA, or a power supply line for providing power to the pixel PX.

In an embodiment, the first connection line CL1 may be disposed on the inorganic insulating layer IIL. The first connection line CL1 may at least partially overlap the first groove Gv1. At least a portion of the first connection line CL1 may be exposed by the first groove Gv1.

In an embodiment, the second connection line CL2 may be disposed on the first organic insulating layer 115. The second connection line CL2 may overlap the first groove Gv1. In an embodiment, the second connection line CL2 may be disposed in the first groove Gv1, for example. The second connection line CL2 may be disposed directly on the first connection line CL1. In this case, the same signal may be applied to the first connection line CL1 and the second connection line CL2.

In an embodiment, a first inorganic pattern layer PVX1 may be disposed on the second connection line CL2. The first inorganic pattern layer PVX1 may cover the second connection line CL2. In an embodiment, the first inorganic pattern layer PVX1 may overlap the first groove Gv1. In an embodiment, the first inorganic pattern layer PVX1 may be disposed in the first groove Gv1, for example. The first groove Gv1 may be at least partially clad with the first inorganic pattern layer PVX1. In an embodiment, the first inorganic pattern layer PVX1 may cover the first groove Gv1 so that the first groove Gv1 is not exposed, for example.

In an embodiment, a second inorganic pattern layer PVX2 may be disposed on the second organic insulating layer 116. In an embodiment, the second inorganic pattern layer PVX2 may include a pair of first protruding tips PT1 protruding toward the center of the first groove Gv1 The first functional layer 212*a*, the second functional layer 212*c*, and the opposite electrode 213 may be disconnected by the first groove Gv1 and the pair of first protruding tips PT1. In addition, a first functional layer pattern 212*ap*, a second functional layer pattern 212*cp*, and an opposite electrode pattern 213*p* may be disposed in the first groove Gv1.

In an embodiment, the second inorganic pattern layer PVX2 may include a pair of third protruding tips PT3 protruding toward the center of the fourth groove Gv4. The first functional layer 212*a*, the second functional layer 212*c*, and the opposite electrode 213 may be disconnected by the fourth groove Gv4 and the pair of third protruding tips PT3. Therefore, the first functional layer pattern 212*ap*, the second functional layer pattern 212*cp*, and the opposite electrode pattern 213*p* may be disposed in the fourth groove Gv4.

In an embodiment, the first inorganic pattern layer PVX1 may include a second protruding tip PT2 protruding toward an edge of the substrate 100. In other words, the first inorganic pattern layer PVX1 may include the second protruding tip PT2 protruding in a direction opposite to a center direction of the first groove Gv1. In an alternative embodiment, the second protruding tip PT2 may protrude toward the center of the fourth groove Gv4. The first functional layer 212*a*, the second functional layer 212*c*, and the opposite electrode 213 may be disconnected (or separated) by the second protruding tip PT2.

In an embodiment, an organic encapsulation layer 320 may be disposed on a first inorganic encapsulation layer 310. The organic encapsulation layer 320 may continuously cover an entirety of components disposed on the substrate 100. However, the organic encapsulation layer 320 may be separated by the first dam portion DP1. In an embodiment, the organic encapsulation layer 320 may be disposed on a central area CA (refer to FIG. 8A), an intermediate area MA (refer to FIG. 8A), and the corner area CNA, and may be separated by the first dam portion DP1, for example. Accordingly, the organic encapsulation layer 320 may not overlap the second dam portion DP2 and the auxiliary dam portion ADP. Also, the organic encapsulation layer 320 may fill the first groove Gv1. A monomer (e.g., an organic material) forming the organic encapsulation layer 320 may be controlled by the first dam portion DP1 and the second dam portion DP2.

In an embodiment, an organic protective layer 420 may be disposed on a first inorganic protective layer 410. The organic protective layer 420 may continuously cover an entirety of the components disposed on the substrate 100. However, the organic protective layer 420 may be separated on the upper surface of the second dam portion DP2. In an embodiment, the organic protective layer 420 may not be unitary, but may be provided separately as two organic protective layers on the upper surface of the second dam portion DP2, for example. However, the disclosure is not limited thereto.

In an embodiment, the organic protective layer 420 may overlap the first groove Gv1. In an alternative embodiment, it may be understood that the organic protective layer 420 fills the first groove Gv1. In an embodiment, the organic protective layer 420 may fill the fourth groove Gv4.

Figure 11:
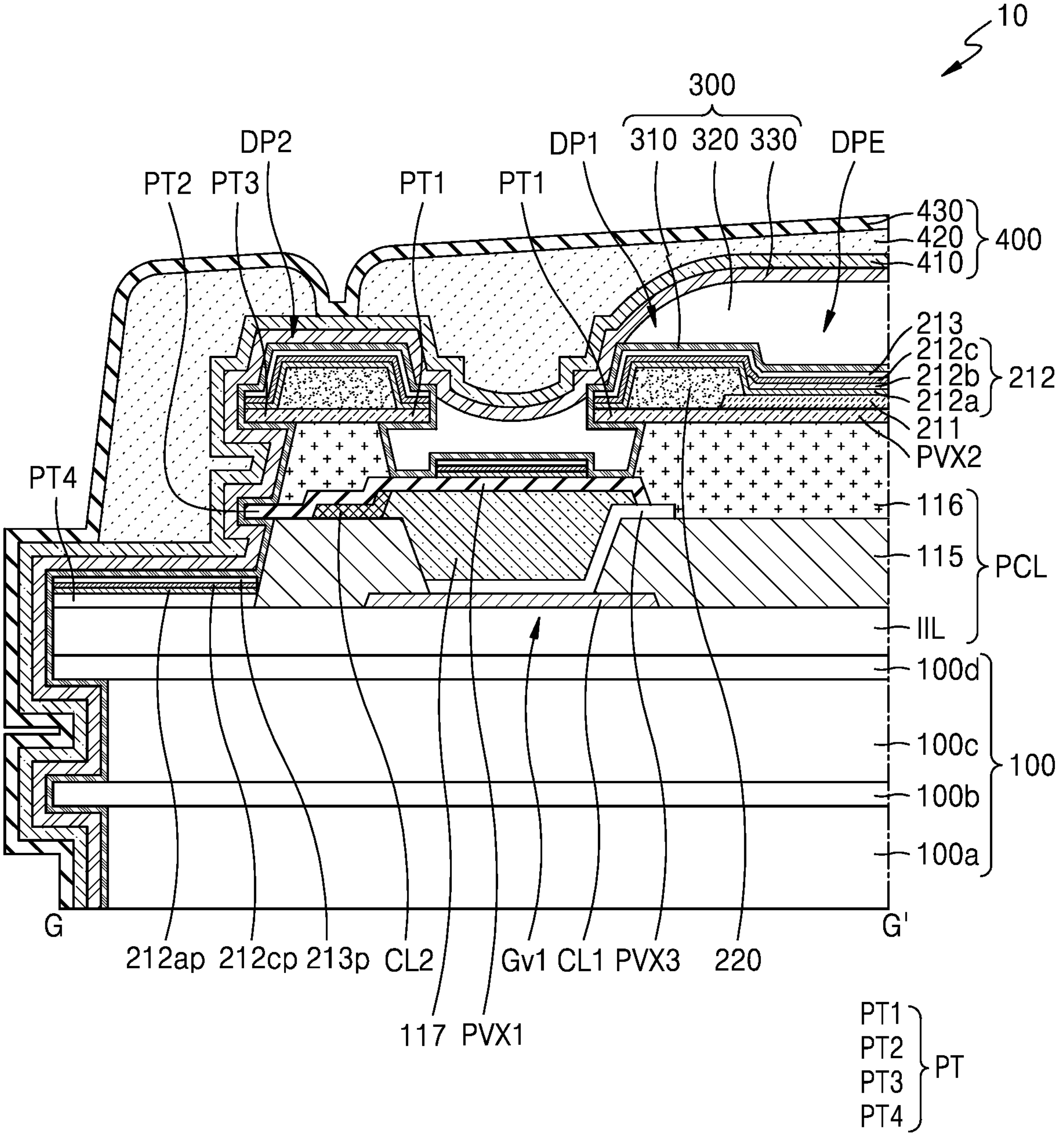
FIG. 11 is a schematic cross-sectional view of an embodiment of a display panel.

FIG. 11 is a schematic cross-sectional view of an embodiment of a display panel 10. FIG. 11 is a cross-sectional view of the display panel 10 taken along line G-G' in FIG. 8A. The embodiment of FIG. 11 is different from the embodiment of FIG. 9A in that a first connection line CL1 and a second connection line CL2 do not contact each other. In FIG. 11, the same reference numerals as those of FIG. 9A denote the same members as those in FIG. 9A, and repeated descriptions thereof are omitted.

Referring to FIG. 11, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

In an embodiment, the display panel 10 may include a first connection line CL1 and a second connection line CL2. Each of the first connection line CL1 and the second connection line CL2 may be a signal line for providing an electrical signal to a pixel PX (refer to FIG. 8A) disposed in a corner area CNA, or a power supply line for providing power to the pixel PX.

In an embodiment, the first connection line CL1 may be disposed on the inorganic insulating layer IL. The first connection line CL1 may include the same material as that of the first source electrode SE1 (refer to FIG. 5) and the first drain electrode DE1 (refer to FIG. 5) and be disposed in the same layer as the first source electrode SE1 (refer to FIG. 5) and the first drain electrode DE1 (refer to FIG. 5), described above with reference to FIG. 5.

In an embodiment, the first organic insulating layer 115 may be disposed on the first connection line CL1. The first organic insulating layer 115 may expose at least a portion of the first connection line CL1. Because a first groove Gv1 is defined by the first organic insulating layer 115, at least a portion of the first connection line CL1 may be exposed through the first groove Gv1.

In an embodiment, a third inorganic pattern layer PVX3 may be disposed on the first organic insulating layer 115. The third inorganic pattern layer PVX3 may be disposed in the first groove Gv1. In an alternative embodiment, it may be understood that the third inorganic pattern layer PVX3 overlaps the first groove Gv1. The third inorganic pattern layer PVX3 may be disposed on the first connection line CL1 of which at least a portion is exposed. In an embodiment, the third inorganic pattern layer PVX3 may cover the first connection line CL1, for example. The first groove Gv1 may be at least partially clad with the third inorganic pattern layer PVX3. In an embodiment, the third inorganic pattern layer PVX3 may at least partially cover the first groove Gv1, for example.

In an embodiment, the third organic insulating layer 117 may be disposed on the third inorganic pattern layer PVX3. The third organic insulating layer 117 may be disposed in the first groove Gv1. In an alternative embodiment, it may be understood that the third organic insulating layer 117 overlaps the first groove Gv1.

In an embodiment, the second connection line CL2 may be disposed on the first organic insulating layer 115. The second connection line CL2 may be disposed on the upper surface of the first organic insulating layer 115 and the upper surface (or the upper and side surfaces) of the third organic insulating layer 117. That is, the second connection line CL2 may overlap each of the first organic insulating layer 115 and the third organic insulating layer 117.

In an embodiment, the first connection line CL1 and the second connection line CL2 may not be electrically connected to each other. Different signals may be applied to the first connection line CL1 and the second connection line CL2, respectively. As the first organic insulating layer 115, the third inorganic pattern layer PVX3, and the third organic insulating layer 117 are disposed between the first connection line CL1 and the second connection line CL2, the first connection line CL1 and the second connection line CL2 may not be electrically connected to each other. In this case, the first connection line CL1 may be a power supply line for transmitting power to each pixel PX, and the second connection line CL2 may be a signal line for providing an electrical signal to each pixel PX. However, the disclosure is not limited thereto. In an embodiment, the reverse case is also possible, for example.

In an embodiment, the first inorganic pattern layer PVX1 may be disposed on the third organic insulating layer 117. The first inorganic pattern layer PVX1 may overlap the first groove Gv1. In an alternative embodiment, it may be understood that the first inorganic pattern layer PVX1 is disposed in the first groove Gv1. The first inorganic pattern layer PVX1 may cover the third organic insulating layer 117 and the second connection line CL2. The first inorganic pattern layer PVX1 may include a second protruding tip PT2 protruding toward an edge of the substrate 100. In other words, the first inorganic pattern layer PVX1 may include the second protruding tip PT2 protruding in a direction opposite to a center direction of the first groove Gv1.

In an embodiment, the second organic insulating layer 116 may be disposed on the first inorganic pattern layer PVX1. The second organic insulating layer 116 may expose at least a portion of the first inorganic insulating layer PVX1. A second inorganic pattern layer PVX2 may be disposed on the second organic insulating layer 116. The second inorganic pattern layer PVX2 may include a pair of first protruding tips PT1 protruding toward the center of the first groove Gv1. A first functional layer 212*a*, a second functional layer 212*c*, and an opposite electrode 213, disposed on the second inorganic pattern layer PVX2, may be disconnected by the first groove Gv1 and the pair of first protruding tips PT1. Therefore, the first functional layer pattern 212*ap*, the second functional layer pattern 212*cp*, and the opposite electrode pattern 213*p* may be disposed on the first inorganic pattern layer PVX1.

Figure 12:
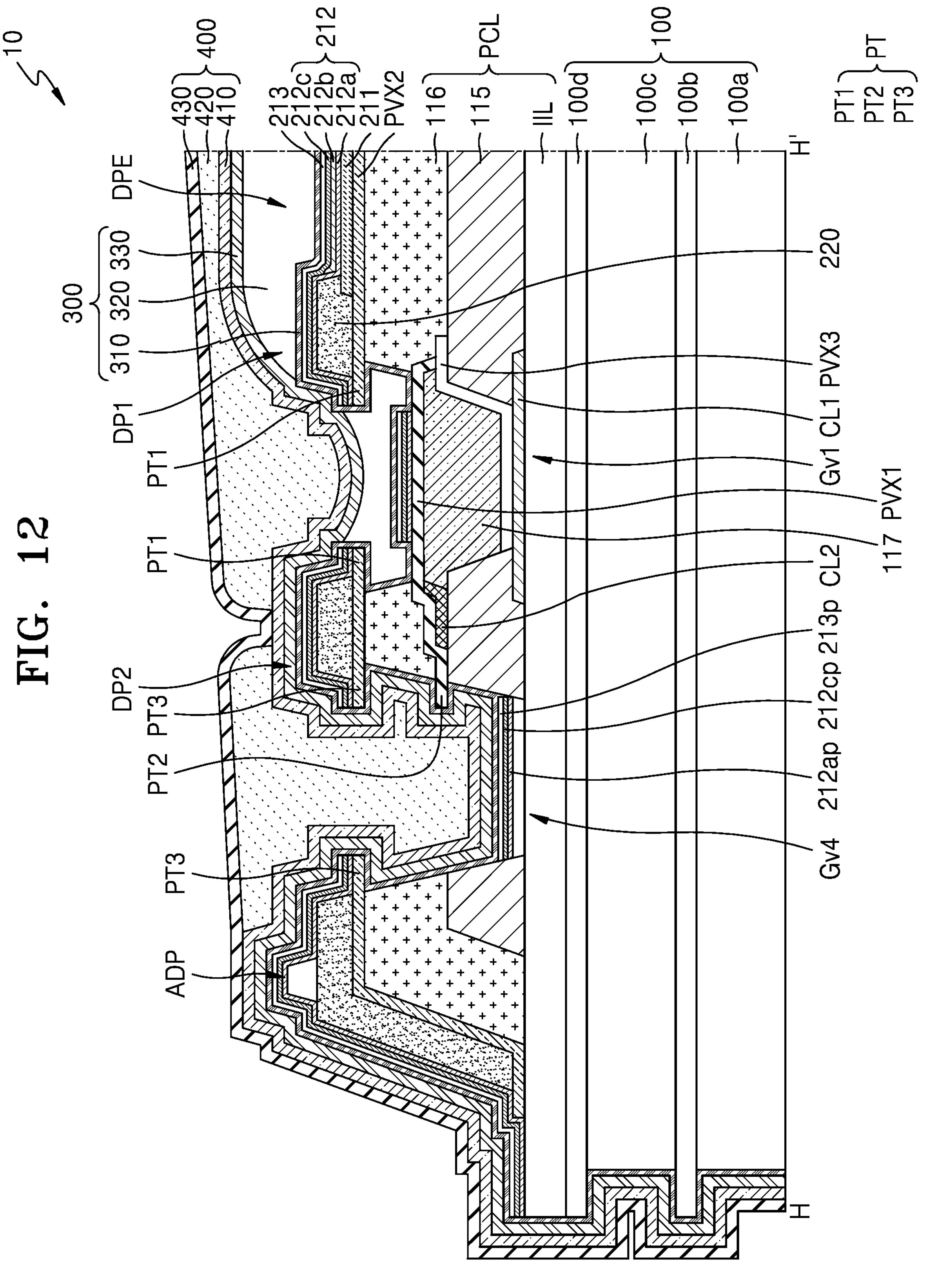
FIG. 12 is a schematic cross-sectional view of an embodiment of a display panel.

FIG. 12 is a schematic cross-sectional view of an embodiment of a display panel 10. FIG. 12 is a cross-sectional view of the display panel 10 taken along line H-H' in FIG. 8A. The embodiment of FIG. 12 is different from the embodiment of FIG. 11 in that a first connection line CL1 and a second connection line CL2 do not contact each other. In FIG. 12, the same reference numerals as those of FIG. 11 denote the same members as those in FIG. 11, and repeated descriptions thereof are omitted.

Referring to FIG. 12, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

The inorganic insulating layer IIL may be disposed on the substrate 100. The first organic insulating layer 115 and the second organic insulating layer 116 may be disposed on the inorganic insulating layer IIL. The pixel-defining layer 220 may be disposed on the second organic insulating layer 116. An intermediate layer 212 and an opposite electrode 213 may be disposed on the pixel-defining layer 220. Specifically, a first functional layer 212*a*, a second functional layer 212*c*, and the opposite electrode 213 may be disposed on the pixel-defining layer 220.

A pixel electrode 211 may be disposed on the second organic insulating layer 116. The pixel-defining layer 220 in which an opening exposing at least a portion of the pixel electrode 211 is defined may be disposed on the pixel electrode 211.

In an embodiment, a first groove Gv1 and a fourth groove Gv4, which are concave in a thickness direction of the substrate 100, may be defined in the display panel 10, on the substrate 100. In addition, the display panel 10 may further include a first dam portion DP1, a second dam portion DP2, and an auxiliary dam portion ADP, which protrude in the thickness direction of the substrate 100, on the substrate 100. The first groove Gv1 may be defined between the first dam portion DP1 and the second dam portion DP2. The fourth groove Gv4 may be defined between the second dam portion DP2 and the auxiliary dam portion ADP.

In an embodiment, the fourth groove Gv4 and the auxiliary dam portion ADP may be disposed on a corner area CNA (refer to FIG. 8A). Specifically, the fourth groove Gv4 and the auxiliary dam portion ADP may be disposed on an extension area EA (refer to FIG. 8A) of the corner area CNA (refer to FIG. 8A). The fourth groove Gv4 and the auxiliary dam portion ADP may be disposed in a vertical direction VDR (refer to FIG. 8A) crossing an extension direction EDR (refer to FIG. 8A) in which the extension area EA extends. The fourth groove Gv4 and the auxiliary dam portion ADP may be defined or disposed along an edge of the extension area EA, which extends in the vertical direction VDR, from among the edges of the extension area EA. However, the disclosure is not limited thereto. The fourth groove Gv4 and the auxiliary dam portion ADP may be defined or disposed along the edge of the extension area EA.

In an embodiment, the fourth groove Gv4 may be defined in the first organic insulating layer 115. In an embodiment, the fourth groove Gv4 may be a recess defined by separating the first organic insulating layer 115, for example. In an alternative embodiment, the fourth groove Gv4 may be a recess defined by removing a portion of the first organic insulating layer 115. That is, the fourth groove Gv4 may be defined by removing a portion of the first organic insulating layer 115. However, the disclosure is not limited thereto. The fourth groove Gv4 may be defined in the first organic insulating layer 115 and the second organic insulating layer 116. The fourth groove Gv4 may be defined in the first organic insulating layer 115, the second organic insulating layer 116, and the pixel-defining layer 220. A lower layer of the fourth groove Gv4 may include the first organic insulating layer 115, may include the first organic insulating layer 115 and the second organic insulating layer 116, or may include the first organic insulating layer 115, the second organic insulating layer 116, and the pixel-defining layer 220.

In an embodiment, the auxiliary dam portion ADP may include the first organic insulating layer 115, the second organic insulating layer 116, the pixel-defining layer 220, and a spacer 230. In other words, the auxiliary dam portion ADP may be defined (or formed) by the first organic insulating layer 115, the second organic insulating layer 116, the pixel-defining layer 220, and the spacer 230. However, the disclosure is not limited thereto. In an embodiment, the auxiliary dam portion ADP may be omitted, for example.

In an embodiment, the height of the auxiliary dam portion ADP may be greater than the height of the first dam portion DP1 and/or the second dam portion DP2. In this case, the height of the auxiliary dam portion ADP may denote a vertical distance from the lower surface of the first organic insulating layer 115 to the upper surface of the spacer 230 in the thickness direction of the substrate 100, and the height of the first dam portion DP1 and/or the second dam portion DP2 may denote a vertical distance from the lower surface of the first organic insulating layer 115 to the upper surface of the pixel-defining layer 220 in the thickness direction of the substrate 100.

When only the first dam portion DP1 and the second dam portion DP2 are disposed on the corner area CNA of the display panel 10, an imprint defect due to a mask may occur in an upper end of the first dam portion DP1 and/or an upper end of the second dam portion DP2, and as a result, the reliability of inorganic layers stacked on the second dam portion DP2 may be deteriorated.

In an embodiment, because the height of the auxiliary dam portion ADP is greater than the height of the first dam portion DP1 and/or the second dam portion DP2, damage to the first dam portion DP1 and/or the second dam portion DP2 due to the mask may be prevented or reduced, and deterioration of the reliability of an inorganic layer disposed on the first dam portion DP1 and/or the second dam portion DP2 may be prevented or reduced.

Figure 13:
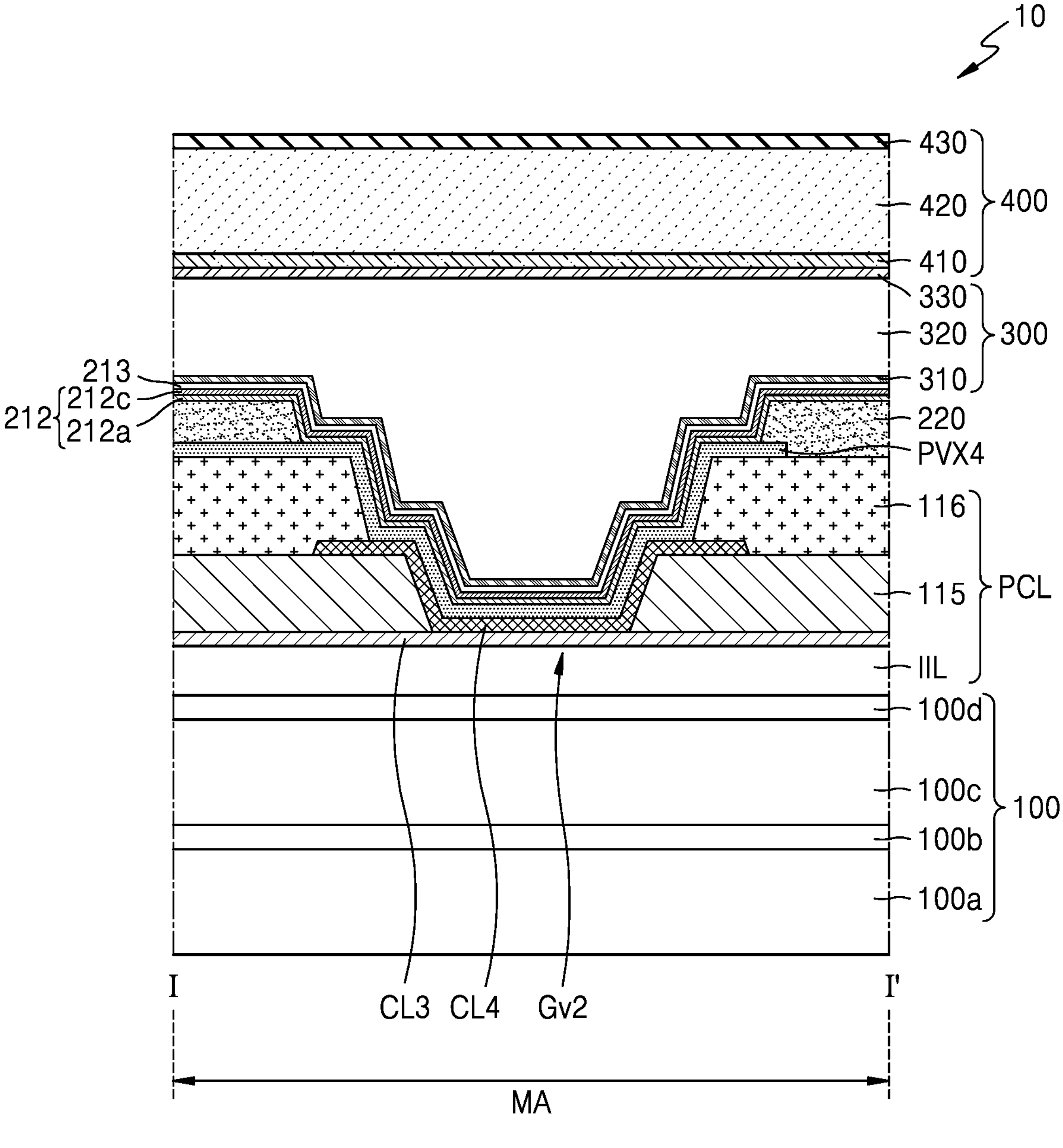
FIG. 13 is a schematic cross-sectional view of an embodiment of a display panel.

FIG. 13 is a schematic cross-sectional view of an embodiment of a display panel 10. FIG. 13 is a cross-sectional view of the display panel 10 taken along line I-I' in FIG. 8A. In FIG. 13, the same reference numerals as those of FIG. 5 denote the same members as those of FIG. 5, and repeated descriptions thereof are omitted.

Referring to FIG. 13, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

The inorganic insulating layer IIL may be disposed on the substrate 100. As described above with reference to FIG. 5, the inorganic insulating layer IIL may include a buffer layer 111 (refer to FIG. 5), a first gate insulating layer 112 (refer to FIG. 5), a second gate insulating layer 113 (refer to FIG. 5), and an inter-insulating layer 114 (refer to FIG. 5). However, the aforementioned layers included in the inorganic insulating layer IIL are omitted for convenience of description and illustration.

The first organic insulating layer 115 and the second organic insulating layer 116 may be disposed on the inorganic insulating layer IL. The pixel-defining layer 220 may be disposed on the second organic insulating layer 116. An intermediate layer 212 and an opposite electrode 213 may be disposed on the pixel-defining layer 220. Specifically, a first functional layer 212*a*, a second functional layer 212*c*, and the opposite electrode 213 may be disposed on the pixel-defining layer 220.

In an embodiment, the display panel 10 may include a second groove Gv2, which is concave in a thickness direction of the substrate 100, on the substrate 100. The second groove Gv2 may be defined in an intermediate area MA.

In an embodiment, the second groove Gv2 may be defined in the first organic insulating layer 115. In an embodiment, the second groove Gv2 may be a recess defined by separating the first organic insulating layer 115, for example. In an alternative embodiment, the second groove Gv2 may be a recess defined by removing a portion of the first organic insulating layer 115. That is, the second groove Gv2 may be defined by removing a portion of the first organic insulating layer 115. However, the disclosure is not limited thereto. The second groove Gv2 may be defined in the first organic insulating layer 115 and the second organic insulating layer 116. The second groove Gv2 may be defined in the first organic insulating layer 115, the second organic insulating layer 116, and the pixel-defining layer 220. A lower layer of the second groove Gv2 may include the first organic insulating layer 115, may include the first organic insulating layer 115 and the second organic insulating layer 116, or may include the first organic insulating layer 115, the second organic insulating layer 116, and the pixel-defining layer 220.

In an embodiment, the display panel 10 may include a third connection line CL3 and a fourth connection line CL4.

Each of the third connection line CL3 and the fourth connection line CL4 may be a signal line for providing an electrical signal to a pixel PX (refer to FIG. 8A) disposed in the corner area CNA, or a power supply line for providing power to the pixel PX. In an alternative embodiment, each of the third connection line CL3 and the fourth connection line CL4 may be a power line for providing power to pixels PX disposed on the display panel 10, or a signal line for providing an electrical signal to the pixels PX.

In an embodiment, the third connection line CL3 may be disposed on the inorganic insulating layer IL. The third connection line CL3 may include the same material as that of the first connection line CL1 (refer to FIG. 9A) and be disposed in the same layer as the first connection line CL1 (refer to FIG. 9A) described above with reference to FIG. 9A.

In an embodiment, the first organic insulating layer 115 may be disposed on the third connection line CL3. The first organic insulating layer 115 may expose at least a portion of the third connection line CL3. Because the second groove Gv2 is defined by the first organic insulating layer 115, at least a portion of the third connection line CL3 may be exposed through the second groove Gv2.

In an embodiment, the fourth connection line CL4 may be disposed on the third connection line CL3 and the first organic insulating layer 115. The fourth connection line CL4 may overlap the second groove Gv2. In an embodiment, the fourth connection line CL4 may be disposed in the second groove Gv2, for example. The fourth connection line CL4 may be disposed directly on the third connection line CL3. In this case, the same signal may be applied to the third connection line CL3 and the fourth connection line CL4. The fourth connection line CL4 may include the same material as that of the second connection line CL2 (refer to FIG. 9A) and be disposed in the same layer as the second connection line CL2 (refer to FIG. 9A) described above with reference to FIG. 9A.

In an embodiment, the second organic insulating layer 116 may be disposed on the fourth connection line CL4, and a fourth inorganic pattern layer PVX4 may be disposed on the second organic insulating layer 116 and the fourth connection line CL4. The fourth inorganic pattern layer PVX4 may cover the fourth connection line CL4. The fourth inorganic pattern layer PVX4 may include the same material as that of the second inorganic pattern layer PVX2 and be disposed in the same layer as the second inorganic pattern layer PVX2 described above with reference to FIG. 9A.

In an embodiment, the fourth inorganic pattern layer PVX4 may be disposed in the second groove Gv2. The second groove Gv2 may be at least partially clad with the fourth inorganic pattern layer PVX4. In an embodiment, the fourth inorganic pattern layer PVX4 may at least partially cover the second groove Gv2, for example.

In an embodiment, the pixel-defining layer 220 may be disposed on the fourth inorganic pattern layer PVX4, and the intermediate layer 212 and the opposite electrode 213 may be disposed on the pixel-defining layer 220. In an embodiment, the intermediate layer 212 may include a first functional layer 212*a* and a second functional layer 212*c*, for example. The first functional layer 212*a*, the second functional layer 212*c*, and the opposite electrode 213 may also be disposed on the fourth inorganic pattern layer PVX4.

In an embodiment, the encapsulation layer 300 and the protective layer 400 may be sequentially disposed on the opposite electrode 213. The encapsulation layer 300 may include a first inorganic encapsulation layer 310, an organic encapsulation layer 320, and a second inorganic encapsulation layer 330. The protective layer 400 may include a first inorganic protective layer 410, an organic protective layer 420, and a second inorganic protective layer 430.

Figure 14A:
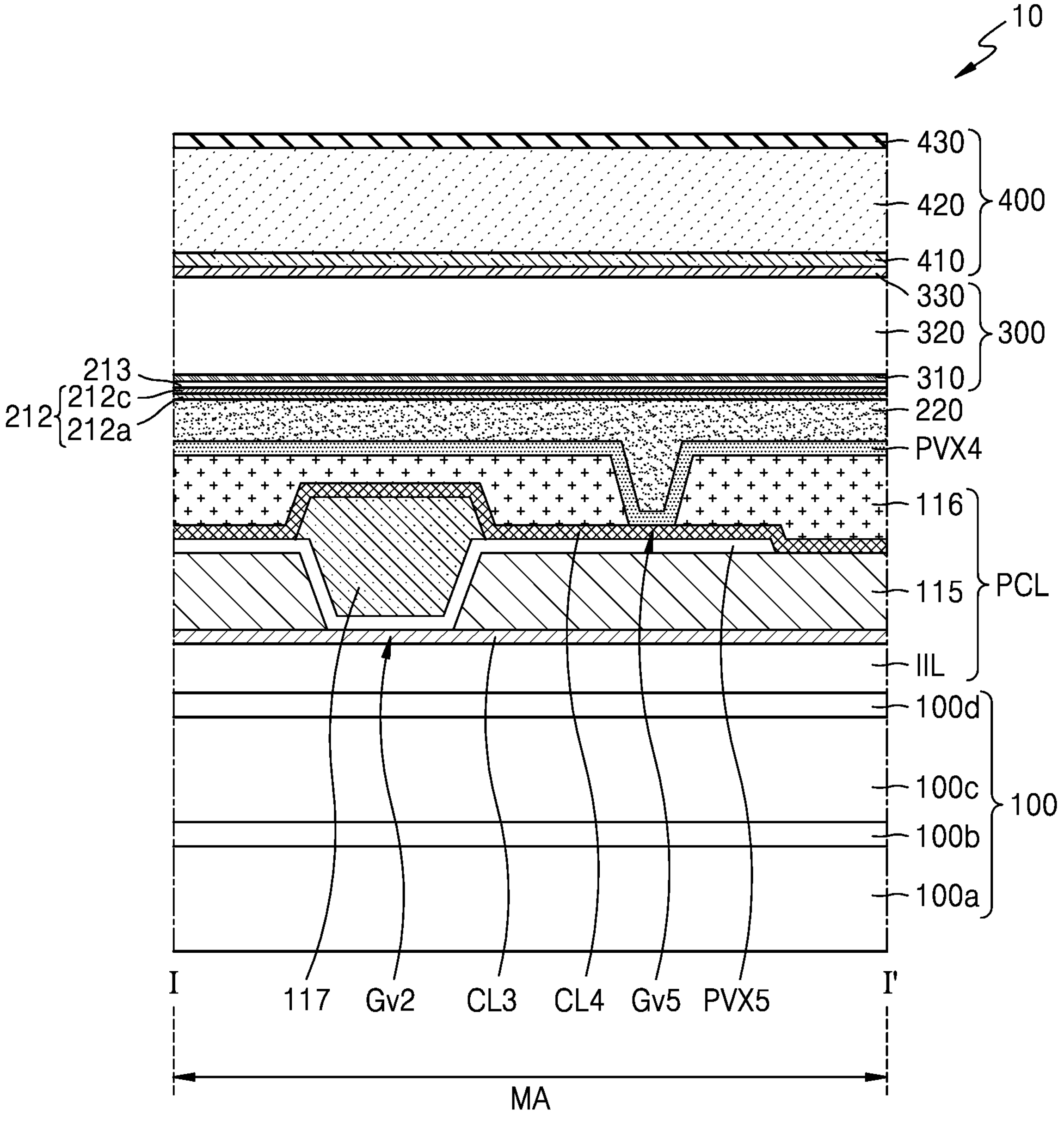
FIG. 14A is a schematic cross-sectional view of an embodiment of a display panel.

FIG. 14A is a schematic cross-sectional view of an embodiment of a display panel 10. FIG. 14A is a cross-sectional view of the display panel 10 taken along line I-I' in FIG. 8A. The embodiment of FIG. 14A is different from the embodiment of FIG. 13 in that a third connection line CL3 and a fourth connection line CL4 do not contact each other. In FIG. 14A, the same reference numerals as those of FIG. 13 denote the same members as those of FIG. 13, and repeated descriptions thereof are omitted.

Referring to FIG. 14A, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

In an embodiment, the display panel 10 may include a second groove Gv2 and a fifth groove Gv5, which are concave in a thickness direction of the substrate 100, on the substrate 100. The second groove Gv2 and the fifth groove Gv5 may be defined in an intermediate area MA.

In an embodiment, the fifth groove Gv5 may be defined in the second organic insulating layer 116. In an embodiment, the fifth groove Gv5 may be a recess defined by separating the second organic insulating layer 116, for example. In an alternative embodiment, the fifth groove Gv5 may be a recess defined by removing a portion of the second organic insulating layer 116. That is, the fifth groove Gv5 may be defined by removing a portion of the second organic insulating layer 116. However, the disclosure is not limited thereto. The fifth groove Gv5 may be defined in the second organic insulating layer 116 and the pixel-defining layer 220. A lower layer of the fifth groove Gv5 may include the second organic insulating layer 116, or may include the second organic insulating layer 116 and the pixel-defining layer 220.

In an embodiment, a third connection line CL3 may be disposed on the inorganic insulating layer IL. The third connection line CL3 may include the same material as that of the first connection line CL1 and be disposed in the same layer as the first connection line CL1 (refer to FIG. 11) described above with reference to FIG. 11.

In an embodiment, the first organic insulating layer 115 may be disposed on the third connection line CL3. The first organic insulating layer 115 may expose at least a portion of the third connection line CL3. Because the second groove Gv2 is defined by the first organic insulating layer 115, at least a portion of the third connection line CL3 may be exposed through the second groove Gv2.

In an embodiment, a fifth inorganic pattern layer PVX5 may be disposed on the first organic insulating layer 115 and the third connection line CL3. The fifth inorganic pattern layer PVX5 may be disposed in the second groove Gv2. In an alternative embodiment, it may be understood that the fifth inorganic pattern layer PVX5 overlaps the second groove Gv2. The fifth inorganic pattern layer PVX5 may cover the third connection line CL3.

In an embodiment, a third organic insulating layer 117 may be disposed on the fifth inorganic pattern layer PVX5. The third organic insulating layer 117 may be disposed in the second groove Gv2. In an alternative embodiment, it may be understood that the third organic insulating layer 117 overlaps the second groove Gv2. The second groove Gv2 may be at least partially clad with the fifth inorganic pattern layer PVX5. In an embodiment, the fifth inorganic pattern layer PVX5 may at least partially cover the second groove Gv2, for example.

In an embodiment, a fourth connection line CL4 may be disposed on the third organic insulating layer 117, the fifth inorganic pattern layer PVX5, and the first organic insulating layer 115. The fourth connection line CL4 may include the same material as that of the second connection line CL2 and be disposed in the same layer as the second connection line CL2 (refer to FIG. 11) described above with reference to FIG. 11.

In an embodiment, the third connection line CL3 and the fourth connection line CL4 may not be electrically connected to each other. Different signals may be applied to the third connection line CL3 and the fourth connection line CL4, respectively. As the first organic insulating layer 115, the fifth inorganic pattern layer PVX5, and the third organic insulating layer 117 are disposed between the third connection line CL3 and the fourth connection line CL4, the third connection line CL3 and the fourth connection line CL4 may not be electrically connected to each other. In this case, the third connection line CL3 may be a power supply line for transmitting power to each pixel PX, and the fourth connection line CL4 may be a signal line for providing an electrical signal to each pixel PX. However, the disclosure is not limited thereto. In an embodiment, the reverse case is also possible.

In an embodiment, the second organic insulating layer 116 may be disposed on the fourth connection line CL4, for example. The second organic insulating layer 116 may expose at least a portion of the fourth connection line CL4. Because the fifth groove Gv5 is defined by the second organic insulating layer 116, at least a portion of the fourth connection line CL4 may be exposed through the fifth groove Gv5.

In an embodiment, a fourth inorganic pattern layer PVX4 may be disposed on the fourth connection line CL4 and the second organic insulating layer 116. The fourth inorganic pattern layer PVX4 may be disposed in the fifth groove Gv5. In an alternative embodiment, it may be understood that the fourth inorganic pattern layer PVX4 overlaps the fifth groove Gv5. The fourth inorganic pattern layer PVX4 may be disposed on the fourth connection line CL4 of which at least a portion is exposed. In an embodiment, the fourth inorganic pattern layer PVX4 may cover the fourth connection line CL4. The fifth groove Gv5 may be covered with at least a portion of the fourth inorganic pattern layer PVX4. In an embodiment, the fourth inorganic pattern layer PVX4 may at least partially cover the fifth groove Gv5, for example.

In an embodiment, the pixel-defining layer 220 may be disposed on the fourth inorganic pattern layer PVX4, and an intermediate layer 212 and an opposite electrode 213 may be disposed on the pixel-defining layer 220. In an embodiment, the intermediate layer 212 may include a first functional layer 212*a* and a second functional layer 212*c*, for example.

In an embodiment, the encapsulation layer 300 and the protective layer 400 may be sequentially disposed on an opposite electrode 213. The encapsulation layer 300 may include a first inorganic encapsulation layer 310, an organic encapsulation layer 320, and a second inorganic encapsulation layer 330. The protective layer 400 may include a first inorganic protective layer 410, an organic protective layer 420, and a second inorganic protective layer 430.

Figure 14B:
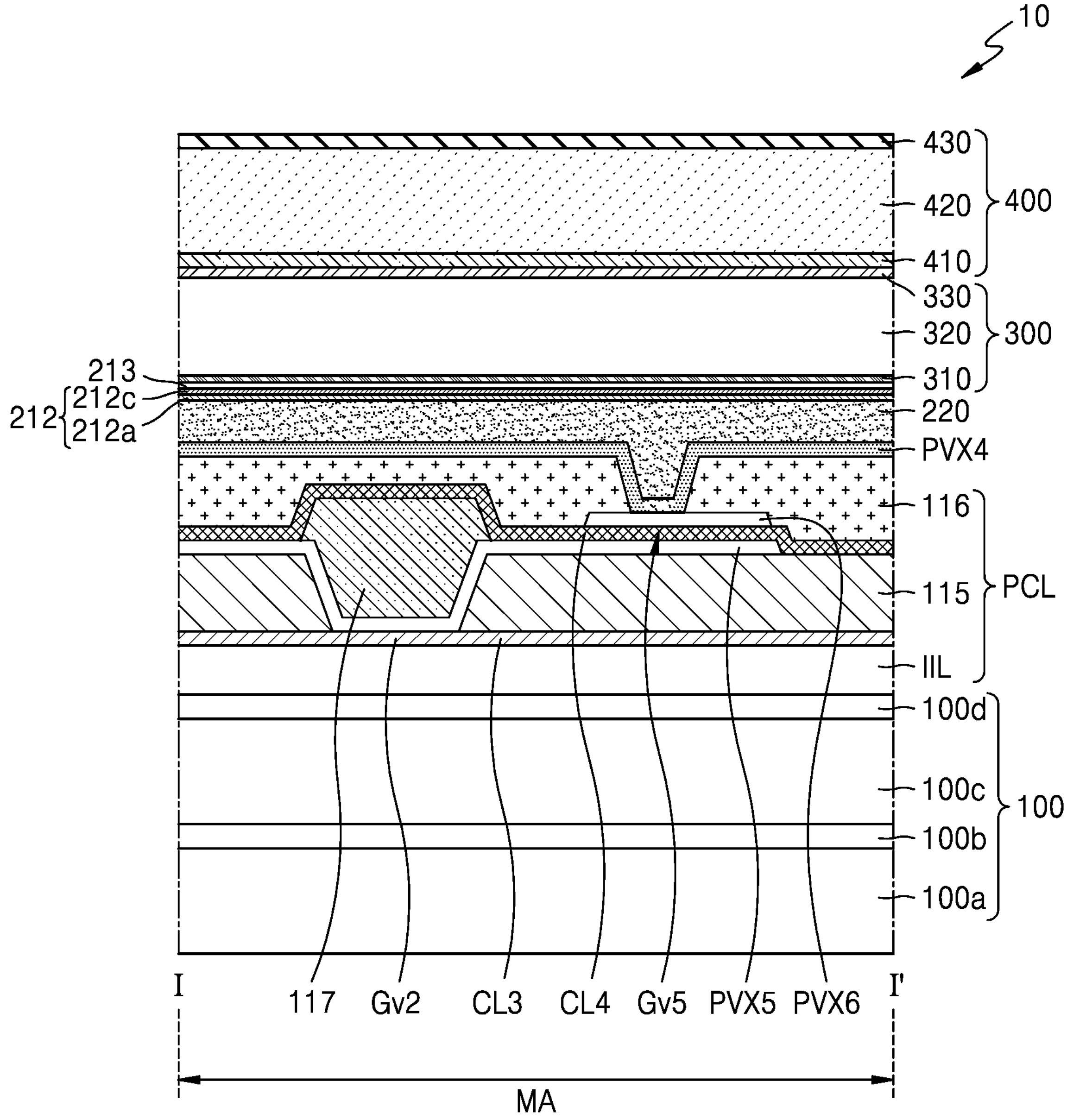
FIG. 14B is a schematic cross-sectional view of an embodiment of a display panel.

FIG. 14B is a schematic cross-sectional view of an embodiment of a display panel 10. FIG. 14B is a cross-sectional view of the display panel 10 taken along line I-I' in FIG. 8A. The embodiment of FIG. 14B is different from the embodiment of FIG. 14A in that a sixth inorganic pattern layer PVX6 is disposed between a fourth connection line CL4 and a fourth inorganic pattern layer PVX4. In FIG. 14B, the same reference numerals as those of FIG. 14A denote the same members as those of FIG. 14A, and repeated descriptions are omitted.

Referring to FIG. 14B, in an embodiment, the sixth inorganic pattern layer PVX6 may be disposed on the fourth connection line CL4. The sixth inorganic pattern layer PVX6 may partially cover the fourth connection line CL4. The sixth inorganic pattern layer PVX6 may include the same material as that of a first inorganic pattern layer PVX1 and be disposed in the same layer as the first inorganic pattern layer PVX1 described above with reference to FIG. 11.

In an embodiment, a second organic insulating layer 116 may be disposed on the fourth connection line CL4 and the sixth inorganic pattern layer PVX6. The second organic insulating layer 116 may expose at least a portion of the sixth inorganic pattern layer PVX6. Because a fifth groove Gv5 is defined by the second organic insulating layer 116, at least a portion of the sixth inorganic pattern layer PVX6 may be exposed through the fifth groove Gv5.

In an embodiment, a fourth inorganic pattern layer PVX4 may be disposed on the sixth inorganic pattern layer PVX6 and the second organic insulating layer 116. The fourth inorganic pattern layer PVX4 may be disposed in the fifth groove Gv5. In an alternative embodiment, it may be understood that the fourth inorganic pattern layer PVX4 overlaps the fifth groove Gv5, for example. The fourth inorganic pattern layer PVX4 may be disposed on the sixth inorganic pattern layer PVX6 of which at least a portion is exposed. In an embodiment, a portion of the fourth inorganic pattern layer PVX4 may be in direct contact with the sixth inorganic pattern layer PVX6, for example. The fifth groove Gv5 may be at least partially clad with the fourth inorganic pattern layer PVX4. In an embodiment, the fourth inorganic pattern layer PVX4 may at least partially cover the fifth groove Gv5, for example.

Although not shown in the drawings, in some regions, a fifth inorganic pattern layer PVX5 and the fourth inorganic pattern layer PVX4 may be in direct contact with each other. That is, the display panel 10 may include an inorganic contact region in which the fifth inorganic pattern layer PVX5 and the fourth inorganic pattern layer PVX4 contact each other. However, in the process of patterning the fourth connection line CL4, a portion of the fifth inorganic pattern layer PVX5 may be removed, and thus, there may be no inorganic contact region in which the fifth inorganic pattern layer PVX5 and the fourth inorganic pattern layer PVX4 contact each other.

In an embodiment, as the sixth inorganic pattern layer PVX6 is disposed on the fourth connection line CL4, even when a portion of the fifth inorganic pattern layer PVX5 is removed in the process of patterning the fourth connection wiring CL4, an inorganic contact region in which the sixth inorganic pattern layer PVX6 and the fourth inorganic pattern layer PVX4 contact each other may be formed.

Figure 15:
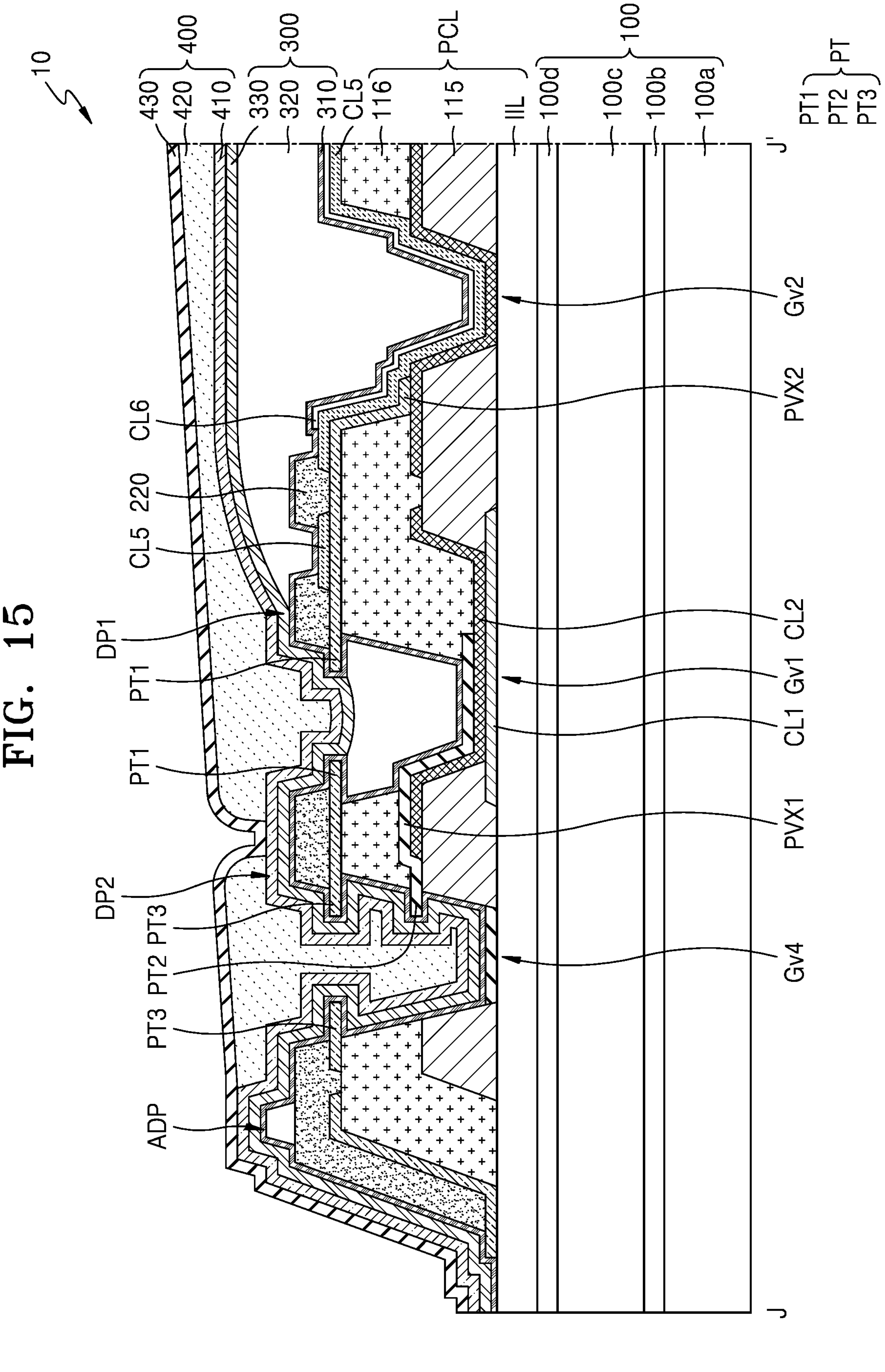
FIG. 15 is a schematic cross-sectional view of an embodiment of a display panel.

FIG. 15 is a schematic cross-sectional view of an embodiment of a display panel 10. FIG. 15 is a cross-sectional view of the display panel 10 taken along line J-J' in FIG. 6A. In FIG. 15, the same reference numerals as those of FIGS. 5, 6A, 9A, and 10 denote the same members as those of FIGS. 5, 6A, 9A, and 10, and repeated descriptions thereof are omitted.

Referring to FIG. 15, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

The inorganic insulating layer IIL may be disposed on the substrate 100. As described above with reference to FIG. 5, the inorganic insulating layer IIL may include a buffer layer 111 (refer to FIG. 5), a first gate insulating layer 112 (refer to FIG. 5), a second gate insulating layer 113 (refer to FIG. 5), and an inter-insulating layer 114 (refer to FIG. 5). However, the aforementioned layers included in the inorganic insulating layer IIL are omitted for convenience of description and illustration. Also, although not shown in the drawings, a driving circuit DC (FIG. 6A) may be disposed on the substrate 100. The first organic insulating layer 115 and the second organic insulating layer 116 may be disposed on the inorganic insulating layer IIL. The pixel-defining layer 220 may be disposed on the second organic insulating layer 116.

In an embodiment, a first groove Gv1, a second groove Gv2, and a fourth groove Gv4, which are concave in a thickness direction of the substrate 100 may be defined in the display panel 10, on the substrate 100. Also, the display panel 10 may include a first dam portion DP1, a second dam portion DP2, and an auxiliary dam portion ADP, which protrude in the thickness direction of the substrate 100, on the substrate 100. The first groove Gv1 may be defined between the first dam portion DP1 and the second dam portion DP2, and the fourth groove Gv4 may be defined between the second dam portion DP2 and the auxiliary dam portion ADP. The first groove Gv1, the second groove Gv2, the fourth groove Gv4, the first dam portion DP1, the second dam portion DP2, and the auxiliary dam portion ADP may be defined or disposed on a peripheral area PA (refer to FIG. 6A).

The first groove Gv1 of FIG. 15 may be unitary with the first groove Gv1 described above with reference to FIG. 8A. The second groove Gv2 of FIG. 15 may be unitary with the second groove Gv2 described above with reference to FIG. 8A. The fourth groove Gv4 of FIG. 15 may be unitary with the fourth groove Gv4 described above with reference to FIG. 10. However, the disclosure is not limited thereto. The fourth groove Gv4 of FIG. 15 may be provided independently of the fourth groove Gv4 described above with reference to FIG. 10.

Also, the first dam portion DP1 of FIG. 15 may be unitary with the first dam portion DP1 described above with reference to FIG. 8A. The second dam portion DP2 of FIG. 15 may be unitary with the second dam portion DP2 described above with reference to FIG. 8A. The auxiliary dam portion ADP of FIG. 15 may be unitary with the auxiliary dam portion ADP described above with reference to FIG. 10. However, the disclosure is not limited thereto. The auxiliary dam portion ADP of FIG. 15 may be provided independently of the auxiliary dam portion ADP described above with reference to FIG. 10.

In an embodiment, each of the first groove Gv1, the second groove Gv2, and the fourth groove Gv4 may be defined in the first organic insulating layer 115. In an embodiment, each of the first groove Gv1, the second groove Gv2, and the fourth groove Gv4 may be a recess defined by separating the first organic insulating layer 115, for example. In an alternative embodiment, each of the first groove Gv1, the second groove Gv2, and the fourth groove Gv4 may be a recess defined by removing a portion of the first organic insulating layer 115. That is, each of the first groove Gv1, the second groove Gv2, and the fourth groove Gv4 may be defined by removing a portion of the first organic insulating layer 115. However, the disclosure is not limited thereto. Each of the first groove Gv1, the second groove Gv2, and the fourth groove Gv4 may be defined in the first organic insulating layer 115 and the second organic insulating layer 116. Each of the first groove Gv1, the second groove Gv2, and the fourth groove Gv4 may be defined in the first organic insulating layer 115, the second organic insulating layer 116, and the pixel-defining layer 220. A lower layer of each of the first groove Gv1, the second groove Gv2, and the fourth groove Gv4 may include the first organic insulating layer 115, may include the first organic insulating layer 115 and the second organic insulating layer 116, or may include the first organic insulating layer 115, the second organic insulating layer 116, and the pixel-defining layer 220.

In an embodiment, each of the first dam portion DP1 and the second dam portion DP2 may include the first organic insulating layer 115, the second organic insulating layer 116, and the pixel-defining layer 220. In other words, each of the first dam portion DP1 and the second dam portion DP2 may be defined (or formed) by the first organic insulating layer 115, the second organic insulating layer 116, and the pixel-defining layer 220.

In an embodiment, the auxiliary dam portion ADP may include the first organic insulating layer 115, the second organic insulating layer 116, the pixel-defining layer 220, and a spacer 230. In other words, the auxiliary dam portion ADP may be defined (or formed) by the first organic insulating layer 115, the second organic insulating layer 116, the pixel-defining layer 220, and the spacer 230. However, the disclosure is not limited thereto. In an embodiment, the auxiliary dam portion ADP may be omitted, for example.

In an embodiment, the display panel 10 may include a first connection line CL1, a second connection line CL2, a fifth connection line CL5, and a sixth connection line CL6. Each of the first connection line CL1, the second connection line CL2, the fifth connection line CL5, and the sixth connection line CL6 may be a signal line for providing an electrical signal to a pixel PX (refer to FIG. 6A) disposed in each of a first area A1, a second area A2, a corner area CNA, an intermediate area MA, and a central area CA, or a power supply line for providing power to the pixel PX.

In an embodiment, the first connection line CL1 may be disposed on the inorganic insulating layer IL. The first connection line CL1 may include the same material as that of the first source electrode SE1 (refer to FIG. 5) and the first drain electrode DE1 (refer to FIG. 5) and be disposed in the same layer as the first source electrode SE1 (refer to FIG. 5) and the first drain electrode DE1 (refer to FIG. 5), described above with reference to FIG. 5. However, the disclosure is not limited thereto, and in another embodiment, the drain electrodes and the source electrodes of the transistors may be source electrodes and drain electrodes, respectively, based on types of the transistors.

In an embodiment, the first organic insulating layer 115 may be disposed on the first connection line CL1 and the inorganic insulating layer IIL. The first groove Gv1, the second groove Gv2, and the fourth groove Gv4 may be defined in the first organic insulating layer 115. The first organic insulating layer 115 may expose at least a portion of the first connection line CL1.

In an embodiment, the second connection line CL2 may be disposed on the first organic insulating layer 115, the first connection line CL1, and the inorganic insulating layer IL.

The second connection line CL2 may be disposed in the first groove Gv1 and/or the second groove Gv2. The second connection line CL2 may be disposed directly on the first connection line CL1. However, the disclosure is not limited thereto.

In an embodiment, a first inorganic pattern layer PVX1 may be disposed on the second connection line CL2, the first organic insulating layer 115, and the inorganic insulating layer IIL. The first inorganic pattern layer PVX1 may cover at least a portion of the second connection line CL2. The first inorganic pattern layer PVX1 may be disposed in the first groove Gv1 and/or the fourth groove Gv4. In an alternative embodiment, it may be understood that the first inorganic pattern layer PVX1 overlaps the first groove Gv1 and/or the fourth groove Gv4. The first groove Gv1 and/or the fourth groove Gv4 may be at least partially clad with the first inorganic pattern layer PVX1. In an embodiment, the first inorganic pattern layer PVX1 may at least partially cover the first groove Gv1 and/or the fourth groove Gv4, for example.

In an embodiment, the second organic insulating layer 116 may be disposed on the second connection line CL2, the first inorganic pattern layer PVX1, and the first organic insulating layer 115. At least a portion of the second organic insulating layer 116 may be disposed in the first groove Gv1.

In an embodiment, a second inorganic pattern layer PVX2 may be disposed on the second organic insulating layer 116. At least a portion of the second inorganic pattern layer PVX2 may be disposed on the second connection line CL2. The second inorganic pattern layer PVX2 may include a pair of first protruding tips PT1 protruding toward the center of the first groove Gv1. In addition, the second inorganic pattern layer PVX2 may include a pair of third protruding tips PT3 protruding toward the center of the fourth groove Gv4.

In an embodiment, the first inorganic pattern layer PVX1 may include a second protruding tip PT2 protruding toward an edge of the substrate 100. In other words, the first inorganic pattern layer PVX1 may include the second protruding tip PT2 protruding in a direction opposite to a center direction of the first groove Gv1. A first functional layer 212*a*, a second functional layer 212*c*, and an opposite electrode 213 may be disconnected (or separated) by the second protruding tip PT2.

In an embodiment, the second protruding tip PT2 provided in the first inorganic pattern layer PVX1 and the third protruding tip PT3 defined in the second inorganic pattern layer PVX2 may at least partially overlap each other in a thickness direction of the substrate 100. That is, in a direction perpendicular to a direction in which the second protruding tip PT2 and/or the third protruding tip PT3 protrude, the second protruding tip PT2 and the third protruding tip PT3 may at least partially overlap each other.

In an embodiment, a fifth connection line CL5 may be disposed on the second inorganic pattern layer PVX2 and the second connection line CL2. The fifth connection line CL5 may be disposed in the second groove Gv2. In an embodiment, the second connection line CL2 and the fifth connection line CL5 may be electrically connected to each other in the second groove Gv2, for example. The fifth connection line CL5 may include the same material as that of the pixel electrode 211 (refer to FIG. 5) and be disposed in the same layer as the pixel electrode 211 (refer to FIG. 5) described above with reference to FIG. 5.

In an embodiment, the pixel-defining layer 220 may be disposed on the fifth connection line CL5 and the second inorganic pattern layer PVX2. In addition, the sixth connection line CL6 may be disposed on the fifth connection line CL5. At least a portion of the sixth connection line CL6 may be disposed in the second groove Gv2. The fifth connection line CL5 and the sixth connection line CL6 may be electrically connected to each other in the second groove Gv2. Accordingly, the second connection line CL2, the fifth connection line CL5, and the sixth connection line CL6 may be electrically connected to each other in the second groove Gv2. The sixth connection line CL6 may include the same material as that of the opposite electrode 213 (refer to FIG. 5) and be disposed in the same layer as the opposite electrode 213 (refer to FIG. 5) described above with reference to FIG. 5.

The encapsulation layer 300 may be disposed on the sixth connection line CL6. The encapsulation layer 300 may cover an entirety of components disposed on the substrate 100. The encapsulation layer 300 may include a first inorganic encapsulation layer 310, an organic encapsulation layer 320, and a second inorganic encapsulation layer 330.

In addition, the protective layer 400 may be disposed on the encapsulation layer 300. The protective layer 400 may include a first inorganic protective layer 410, an organic protective layer 420, and a second inorganic protective layer 430.

Figure 16:
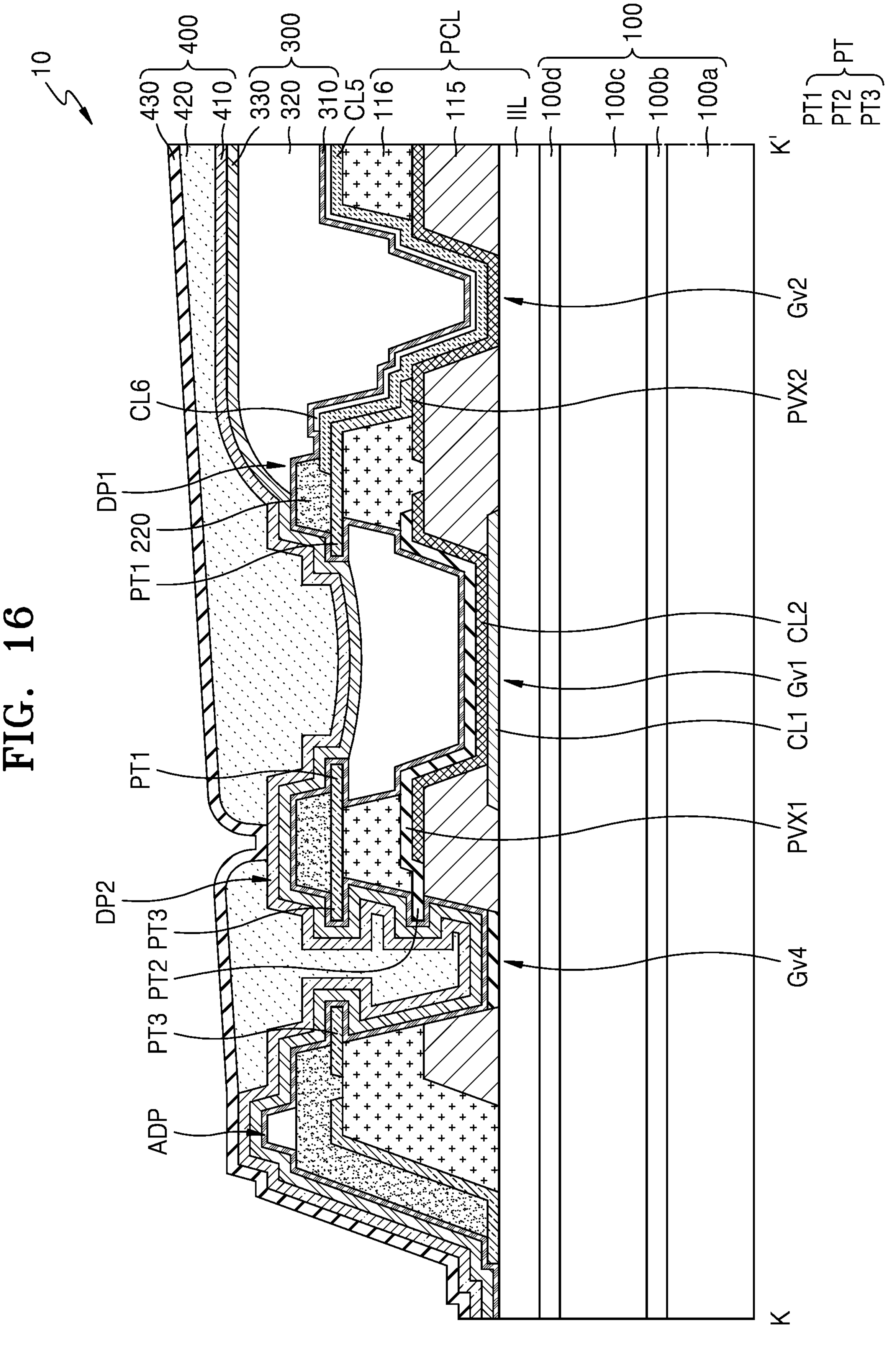
FIG. 16 is a schematic cross-sectional view of an embodiment of a display panel.

FIG. 16 is a schematic cross-sectional view of an embodiment of a display panel 10. FIG. 16 is a cross-sectional view of the display panel 10 taken along line K-K' in FIG. 6A. In FIG. 16, the same reference numerals as those of FIG. 15 denote the same members as those of FIG. 15, and repeated descriptions thereof are omitted.

Referring to FIG. 16, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

The inorganic insulating layer IIL may be disposed on the substrate 100. As described above with reference to FIG. 5, the inorganic insulating layer IIL may include a buffer layer 111 (refer to FIG. 5), a first gate insulating layer 112 (refer to FIG. 5), a second gate insulating layer 113 (refer to FIG. 5), and an inter-insulating layer 114 (refer to FIG. 5). However, the aforementioned layers included in the inorganic insulating layer IIL are omitted for convenience of description and illustration. Also, although not shown in the drawings, a driving circuit DC (FIG. 6A) may be disposed on the substrate 100. The first organic insulating layer 115 and the second organic insulating layer 116 may be disposed on the inorganic insulating layer IIL. The pixel-defining layer 220 may be disposed on the second organic insulating layer 116.

In an embodiment, a first groove Gv1, a second groove Gv2, and a fourth groove Gv4, which are concave in a thickness direction of the substrate 100, may be defined in the display panel 10, on the substrate 100. Also, the display panel 10 may include a first dam portion DP1, a second dam portion DP2, and an auxiliary dam portion ADP, which protrude in the thickness direction of the substrate 100, on the substrate 100. The first groove Gv1 may be defined between the first dam portion DP1 and the second dam portion DP2, and the fourth groove Gv4 may be defined between the second dam portion DP2 and the auxiliary dam portion ADP. The first groove Gv1, the second groove Gv2, the fourth groove Gv4, the first dam portion DP1, the second dam portion DP2, and the auxiliary dam portion ADP may be defined or disposed on a peripheral area PA (refer to FIG. 6A).

The first groove Gv1 of FIG. 16 may be unitary with the first groove Gv1 described above with reference to FIG. 8A. The second groove Gv2 of FIG. 16 may be unitary with the second groove Gv2 described above with reference to FIG. 8A. The fourth groove Gv4 of FIG. 16 may be unitary with the fourth groove Gv4 described above with reference to FIG. 10. However, the disclosure is not limited thereto. The fourth groove Gv4 of FIG. 16 may be provided independently of the fourth groove Gv4 described above with reference to FIG. 10.

Also, the first dam portion DP1 of FIG. 16 may be unitary with the first dam portion DP1 described above with reference to FIG. 8A. The second dam portion DP2 of FIG. 16 may be unitary with the second dam portion DP2 described above with reference to FIG. 8A. The auxiliary dam portion ADP of FIG. 16 may be unitary with the auxiliary dam portion ADP described above with reference to FIG. 10. However, the disclosure is not limited thereto. The auxiliary dam portion ADP of FIG. 16 may be provided independently of the auxiliary dam portion ADP described above with reference to FIG. 10.

In an embodiment, each of the first groove Gv1, the second groove Gv2, and the fourth groove Gv4 may be defined in the first organic insulating layer 115. In an embodiment, each of the first dam portion DP1 and the second dam portion DP2 may include the first organic insulating layer 115, the second organic insulating layer 116, and the pixel-defining layer 220. In other words, each of the first dam portion DP1 and the second dam portion DP2 may be defined (or formed) by the first organic insulating layer 115, the second organic insulating layer 116, and the pixel-defining layer 220. In an embodiment, the auxiliary dam portion ADP may include the first organic insulating layer 115, the second organic insulating layer 116, the pixel-defining layer 220, and a spacer 230. In other words, the auxiliary dam portion ADP may be defined (or formed) by the first organic insulating layer 115, the second organic insulating layer 116, the pixel-defining layer 220, and the spacer 230. However, the disclosure is not limited thereto. In an embodiment, the auxiliary dam portion ADP may be omitted, for example.

In an embodiment, a first connection line CL1 may be disposed on the inorganic insulating layer IIL. In an embodiment, the first organic insulating layer 115 may be disposed on the first connection line CL1 and the inorganic insulating layer K. The first groove Gv1, the second groove Gv2, and the fourth groove Gv4 may be defined in the first organic insulating layer 115. The first organic insulating layer 115 may expose at least a portion of the first connection line CL1.

In an embodiment, a second connection line CL2 may be disposed on the first organic insulating layer 115, the first connection line CL1, and the inorganic insulating layer IL. The second connection line CL2 may be disposed in the first groove Gv1 and/or the second groove Gv2. The second connection line CL2 may be disposed directly on the first connection line CL1. However, the disclosure is not limited thereto. In an embodiment, a first inorganic pattern layer PVX1 may be disposed on the second connection line CL2, the first organic insulating layer 115, and the inorganic insulating layer IL. The first inorganic pattern layer PVX1 may cover the second connection line CL2.

In an embodiment, the second organic insulating layer 116 may be disposed on the second connection line CL2, the first inorganic pattern layer PVX1, and the first organic insulating layer 115. In an embodiment, a second inorganic pattern layer PVX2 may be disposed on the second organic insulating layer 116. At least a portion of the second inorganic pattern layer PVX2 may be disposed on the second connection line CL2. The second inorganic pattern layer PVX2 may include a pair of first protruding tips PT1 protruding toward the center of the first groove Gv1. In addition, the second inorganic pattern layer PVX2 may include a pair of third protruding tips PT3 protruding toward the center of the fourth groove Gv4.

In an embodiment, the first inorganic pattern layer PVX1 may include a second protruding tip PT2 protruding toward an edge of the substrate 100. In other words, the first inorganic pattern layer PVX1 may include the second protruding tip PT2 protruding in a direction opposite to a center direction of the first groove Gv1. A first functional layer 212*a*, a second functional layer 212*c*, and an opposite electrode 213 may be disconnected (or separated) by the second protruding tip PT2.

In an embodiment, the second protruding tip PT2 provided in the first inorganic pattern layer PVX1 and the third protruding tip PT3 defined in the second inorganic pattern layer PVX2 may at least partially overlap each other in a thickness direction of the substrate 100. That is, in a direction perpendicular to a direction in which the second protruding tip PT2 and/or the third protruding tip PT3 protrude, the second protruding tip PT2 and the third protruding tip PT3 may at least partially overlap each other.

In an embodiment, a fifth connection line CL5 may be disposed on the second inorganic pattern layer PVX2 and the second connection line CL2. The fifth connection line CL5 may be disposed in the second groove Gv2. In an embodiment, the second connection line CL2 and the fifth connection line CL5 may be electrically connected to each other in the second groove Gv2, for example. In an embodiment, the pixel-defining layer 220 may be disposed on the fifth connection line CL5 and the second inorganic pattern layer PVX2. In addition, the sixth connection line CL6 may be disposed on the fifth connection line CL5. At least a portion of the sixth connection line CL6 may be disposed in the second groove Gv2. The fifth connection line CL5 and the sixth connection line CL6 may be electrically connected to each other in the second groove Gv2. Accordingly, the second connection line CL2, the fifth connection line CL5, and the sixth connection line CL6 may be electrically connected to each other in the second groove Gv2.

The encapsulation layer 300 may be disposed on the sixth connection line CL6. The encapsulation layer 300 may cover an entirety of components disposed on the substrate 100. The encapsulation layer 300 may include a first inorganic encapsulation layer 310, an organic encapsulation layer 320, and a second inorganic encapsulation layer 330.

In addition, the protective layer 400 may be disposed on the encapsulation layer 300. The protective layer 400 may include a first inorganic protective layer 410, an organic protective layer 420, and a second inorganic protective layer 430.

Figure 17:
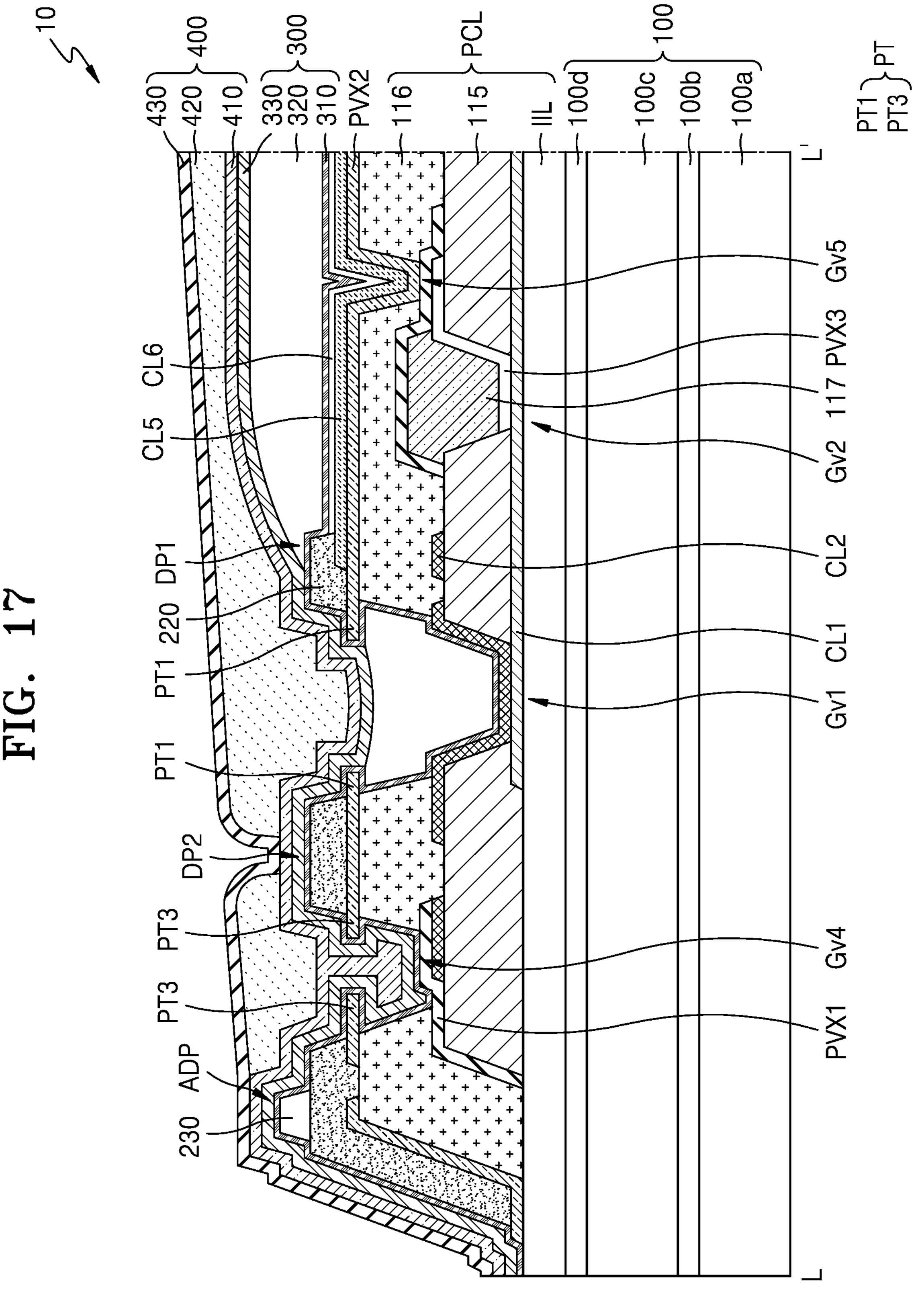
FIG. 17 is a schematic cross-sectional view of an embodiment of a display panel.

FIG. 17 is a schematic cross-sectional view of an embodiment of a display panel 10. FIG. 17 is a cross-sectional view of the display panel 10 taken along line L-L' in FIG. 6A. In FIG. 17, the same reference numerals as those of FIG. 15 denote the same members as those of FIG. 15, and repeated descriptions thereof are omitted.

Referring to FIG. 17, the display panel 10 may include a substrate 100, an inorganic insulating layer IIL, a first organic insulating layer 115, a second organic insulating layer 116, a pixel-defining layer 220, an encapsulation layer 300, and a protective layer 400, which are sequentially stacked.

The inorganic insulating layer IIL may be disposed on the substrate 100. As described above with reference to FIG. 5, the inorganic insulating layer IIL may include a buffer layer 111 (refer to FIG. 5), a first gate insulating layer 112 (refer to FIG. 5), a second gate insulating layer 113 (refer to FIG. 5), and an inter-insulating layer 114 (refer to FIG. 5). However, the aforementioned layers included in the inorganic insulating layer IIL are omitted for convenience of description and illustration. Also, although not shown in the drawings, a driving circuit DC (FIG. 6A) may be disposed on the substrate 100. The first organic insulating layer 115 and the second organic insulating layer 116 may be disposed on the inorganic insulating layer IIL. The pixel-defining layer 220 may be disposed on the second organic insulating layer 116.

In an embodiment, a first groove Gv1, a second groove Gv2, a fourth groove Gv4, and a fifth groove Gv5, which are concave in a thickness direction of the substrate 100 may be defined in the display panel 10, on the substrate 100. Also, the display panel 10 may include a first dam portion DP1, a second dam portion DP2, and an auxiliary dam portion ADP, which protrude in the thickness direction of the substrate 100, on the substrate 100. The first groove Gv1 may be defined between the first dam portion DP1 and the second dam portion DP2, and the fourth groove Gv4 may be defined between the second dam portion DP2 and the auxiliary dam portion ADP. The first groove Gv1, the second groove Gv2, the fourth groove Gv4, the fifth groove Gv5, the first dam portion DP1, the second dam portion DP2, and the auxiliary dam portion ADP may be defined or disposed on a peripheral area PA (refer to FIG. 6A).

The first groove Gv1 of FIG. 17 may be unitary with the first groove Gv1 described above with reference to FIG. 8A. The second groove Gv2 of FIG. 17 may be unitary with the second groove Gv2 described above with reference to FIG. 14A. The fourth groove Gv4 of FIG. 17 may be unitary with the fourth groove Gv4 described above with reference to FIG. 10. However, the disclosure is not limited thereto. The fourth groove Gv4 of FIG. 17 may be provided independently of the fourth groove Gv4 described above with reference to FIG. 10. In addition, the fifth groove Gv5 of FIG. 17 may be unitary with the fifth groove Gv5 described above with reference to FIG. 14A.

Also, the first dam portion DP1 of FIG. 17 may be unitary with the first dam portion DP1 described above with reference to FIG. 8A. The second dam portion DP2 of FIG. 17 may be unitary with the second dam portion DP2 described above with reference to FIG. 8A. The auxiliary dam portion ADP of FIG. 17 may be unitary with the auxiliary dam portion ADP described above with reference to FIG. 10. However, the disclosure is not limited thereto. The auxiliary dam portion ADP of FIG. 17 may be provided independently of the auxiliary dam portion ADP described above with reference to FIG. 10.

In an embodiment, the first groove Gv1 and the second groove Gv2 may be defined in the first organic insulating layer 115. In an embodiment, the fourth groove Gv4 and the fifth groove Gv5 may be defined in the second organic insulating layer 116.

In an embodiment, each of the first dam portion DP1 and the second dam portion DP2 may include the first organic insulating layer 115, the second organic insulating layer 116, and the pixel-defining layer 220. In other words, each of the first dam portion DP1 and the second dam portion DP2 may be defined (or formed) by the first organic insulating layer 115, the second organic insulating layer 116, and the pixel-defining layer 220. In an embodiment, the auxiliary dam portion ADP may include the first organic insulating layer 115, the second organic insulating layer 116, the pixel-defining layer 220, and a spacer 230. In other words, the auxiliary dam portion ADP may be defined (or formed) by the first organic insulating layer 115, the second organic insulating layer 116, the pixel-defining layer 220, and the spacer 230. However, the disclosure is not limited thereto. In an embodiment, the auxiliary dam portion ADP may be omitted, for example.

In an embodiment, a first connection line CL1 may be disposed on the inorganic insulating layer IIL. In an embodiment, the first organic insulating layer 115 may be disposed on the first connection line CL1 and the inorganic insulating layer K. The first groove Gv1 and the second groove Gv2 may be defined in the first organic insulating layer 115. The first organic insulating layer 115 may expose at least a portion of the first connection line CL1.

In an embodiment, a third inorganic pattern layer PVX3 may be disposed on the first organic insulating layer 115 and the first connection line CL1. The third inorganic pattern layer PVX3 may be disposed in the second groove Gv2. In an alternative embodiment, it may be understood that the third inorganic pattern layer PVX3 overlaps the second groove Gv2. The third inorganic pattern layer PVX3 may be disposed on the first connection line CL1 of which at least a portion is exposed. In an embodiment, the third inorganic pattern layer PVX3 may cover the first connection line CL1, for example.

In an embodiment, the second organic insulating layer 116 may be disposed on the third inorganic pattern layer PVX3 and the first organic insulating layer 115. A third organic insulating layer 117 may be disposed in the second groove Gv2. In an alternative embodiment, it may be understood that the third organic insulating layer 117 overlaps the second groove Gv2.

In an embodiment, a second connection line CL2 may be disposed on the first organic insulating layer 115 and the first connection line CL1. The second connection line CL2 may be disposed in the first groove Gv1. The second connection line CL2 may be disposed directly on the first connection line CL1. However, the disclosure is not limited thereto.

In an embodiment, a first inorganic pattern layer PVX1 may be disposed on the first organic insulating layer 115, the second connection line CL2, the third organic insulating layer 117, and the third inorganic pattern layer PVX3. The first inorganic pattern layer PVX1 may cover at least one of the second connection line CL2, the third organic insulating layer 117, and the third inorganic pattern layer PVX3.

In an embodiment, the second organic insulating layer 116 may be disposed on the first organic insulating layer 115, the first inorganic pattern layer PVX1, and the second connection line CL2. The fourth groove Gv4 and the fifth groove Gv5 may be defined in the second organic insulating layer 116. The second organic insulating layer 116 may expose at least a portion of the first inorganic pattern layer PVX1.

In an embodiment, a second inorganic pattern layer PVX2 may be disposed on the second organic insulating layer 116. The second inorganic pattern layer PVX2 may be disposed in the fifth groove Gv5. The second inorganic pattern layer PVX2 may contact the first inorganic pattern layer PVX1.

In an embodiment, a fifth connection line CL5 may be disposed on the second inorganic pattern layer PVX2. At least a portion of the fifth connection line CL5 may be disposed in the fifth groove Gv5. In an alternative embodiment, it may be understood that at least a portion of the fifth connection line CL5 overlaps the fifth groove Gv5. Although not shown in the drawings, the second connection line CL2 and the fifth connection line CL5 may be electrically connected to each other in the fifth groove Gv5.

In an embodiment, the pixel-defining layer 220 and a sixth connection line CL6 may be disposed on the fifth connection line CL5. At least a portion of the sixth connection line CL6 may be disposed in the fifth groove Gv5. In an alternative embodiment, it may be understood that at least a portion of the sixth connection line CL6 overlaps the fifth groove Gv5. The fifth connection line CL5 and the sixth connection line CL6 may be electrically connected to each other in the fifth groove Gv5. Accordingly, the second connection line CL2, the fifth connection line CL5, and the sixth connection line CL6 may be electrically connected to each other in the fifth groove Gv5.

The encapsulation layer 300 may be disposed on the sixth connection line CL6. The encapsulation layer 300 may cover an entirety of components disposed on the substrate 100. The encapsulation layer 300 may include a first inorganic encapsulation layer 310, an organic encapsulation layer 320, and a second inorganic encapsulation layer 330.

In addition, the protective layer 400 may be disposed on the encapsulation layer 300. The protective layer 400 may include a first inorganic protective layer 410, an organic protective layer 420, and a second inorganic protective layer 430.

In an embodiment, because the first groove Gv1 and the second groove Gv2 are defined in the first organic insulating layer 115, transmission of external air introduced into a peripheral area PA and/or a corner area CNA to a central area CA may be prevented or reduced. In this case, because each of the first groove Gv1 and the second groove Gv2 has a closed curve shape along the circumference of the central area CA, transmission of external air introduced into the peripheral area PA and/or the corner area CNA to the central area CA may be more effectively prevented or reduced.

In addition, by protecting the first and second grooves Gv1 and Gv2 with an inorganic pattern layer, transmission of external air from an organic insulating layer to another organic insulating layer may be more effectively prevented or reduced.

In an embodiment, by separating the organic protective layer 420 from the upper surface of the second dam portion DP2, even when a portion of the organic protective layer 420 is contaminated, contamination of the entire organic protective layer 420 may be prevented or reduced.

In an embodiment, when different signals or power are applied to connection lines, the connection lines may be prevented from electrically connecting to each other through the third organic insulating layer 117 and the third inorganic pattern layer PVX3.

By embodiments of the disclosure made as described above, a display panel includes a first groove defined along the circumference of a central area and a second groove defined along the circumference of an extension area and each of the first groove and the second groove has a closed curve shape, and thus, transmission of external air introduced into a peripheral area and/or a corner area to the central area may be prevented or reduced.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display panel comprising:

a substrate including a central area, a corner area including an extension area extending in a direction away from the central area, and an intermediate area disposed between the central area and the corner area, wherein a first groove is defined in the corner area, surrounds an entirety of a circumference of the central area of the substrate, and has a closed curve shape in an unfolded shape of the substrate in a plan view, and a second groove is defined in the intermediate area along the circumference of the central area, and has a closed curve shape in the unfolded shape of the substrate in the plan view.

2. The display panel of claim 1, wherein the first groove is defined along a circumference of the extension area.

3. The display panel of claim 1, further comprising:

a first organic insulating layer disposed on the substrate; and a second organic insulating layer disposed on the first organic insulating layer.

4. The display panel of claim 3, wherein the first groove is defined in the first organic insulating layer.

5. The display panel of claim 4, further comprising:

a first connection line disposed between the substrate and the first organic insulating layer; and a second connection line disposed between the first organic insulating layer and the second organic insulating layer.

6. The display panel of claim 5, wherein the first connection line and the second connection line are electrically connected to each other in the first groove.

7. The display panel of claim 6, further comprising:

a first inorganic pattern layer disposed in the first groove and covering the second connection line; and a second inorganic pattern layer disposed on the second organic insulating layer.

8. The display panel of claim 7, wherein the second inorganic pattern layer includes a first protruding tip protruding toward a center of the first groove.

9. The display panel of claim 7, wherein the first inorganic pattern layer includes a second protruding tip protruding in a direction opposite to a central direction of the first groove, the second inorganic pattern layer includes a third protruding tip protruding in the direction opposite to the central direction of the first groove, and the second protruding tip and the third protruding tip at least partially overlap each other in a thickness direction of the substrate.

10. The display panel of claim 5, further comprising:

a third inorganic pattern layer disposed on the first connection line; and a third organic insulating layer disposed on the third inorganic pattern layer.

11. The display panel of claim 10, wherein the first connection line and the second connection line are not electrically connected to each other.

12. The display panel of claim 1, further comprising a pixel disposed in the intermediate area.

13. The display panel of claim 12, wherein the second groove is defined between the pixel and the corner area.

14. The display panel of claim 12, wherein the second groove is defined between the pixel and the central area.

15. The display panel of claim 1, further comprising a first dam portion and a second dam portion disposed in the corner area, wherein the first groove is defined between the first dam portion and the second dam portion.

16. The display panel of claim 15, wherein at least a portion of the first dam portion is disposed along a circumference of the central area of the substrate, and the first dam portion has a closed curve shape.

17. The display panel of claim 15, wherein at least a portion of the second dam portion is disposed along a circumference of the central area, and the second dam portion has a closed curve shape.

18. The display panel of claim 15, further comprising an auxiliary dam portion disposed in the corner area, wherein a height of the auxiliary dam portion is greater than a height of the first dam portion or the second dam portion.

19. The display panel of claim 15, further comprising an encapsulation layer and a protective layer disposed in the corner area, the intermediate area, and the central area, wherein the encapsulation layer includes a first inorganic encapsulation layer, an organic encapsulation layer, and a second inorganic encapsulation layer, and the protective layer includes a first inorganic protective layer, an organic protective layer, and a second inorganic protective layer.

20. The display panel of claim 19, wherein the organic protective layer is separated from an upper surface of the second dam portion.

21. A display device comprising:

a display panel comprising:

a substrate including a central area, a corner area including an extension area extending in a direction away from the central area, and an intermediate area disposed between the central area and the corner area; and a cover window disposed on the display panel, wherein a first groove is defined in the corner area, surrounds an entirety of a circumference of the central area, and has a closed curve shape in an unfolded shape of the substrate in a plan view, a second groove is defined in the intermediate area along the circumference of the central area, and has a closed curve shape in the unfolded shape of the substrate in a plan view, and the display panel is bendable in the corner area.

* * * * *